United States Patent
Hirano et al.

(10) Patent No.: US 7,271,454 B2
(45) Date of Patent: Sep. 18, 2007

(54) SEMICONDUCTOR MEMORY DEVICE AND METHOD OF MANUFACTURING THE SAME

(75) Inventors: Yuuichi Hirano, Tokyo (JP); Takashi Ipposhi, Tokyo (JP); Shigeto Maegawa, Tokyo (JP); Koji Nii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/927,638

(22) Filed: Aug. 27, 2004

(65) Prior Publication Data

US 2005/0078546 A1    Apr. 14, 2005

(30) Foreign Application Priority Data

Aug. 28, 2003  (JP)  ............... 2003-304444
Jun. 30, 2004  (JP)  ............... 2004-193462

(51) Int. Cl.
  *H01L 29/76*  (2006.01)
  *H01L 29/94*  (2006.01)
  *H01L 31/00*  (2006.01)
(52) U.S. Cl. ............ 257/379; 257/380; 257/903; 257/904; 257/E27.016; 257/E27.046
(58) Field of Classification Search ............... 257/903, 257/904, 379, 380, E27.016, E27.046
  See application file for complete search history.

(56) References Cited

U.S. PATENT DOCUMENTS 6,724,065 B2    4/2004  Sato
2002/0015335 A1*  2/2002  Porter et al. ............... 365/200
2002/0112137 A1*  8/2002  Houston ............... 711/200
2004/0159905 A1   8/2004  Sharp

FOREIGN PATENT DOCUMENTS

JP  2001-077368    3/2001
KR  2000-028817 A  5/2000
KR  2003-036519 A  5/2003

OTHER PUBLICATIONS

S. Maeda et al.; Impact of 0.18 μm SOI CMOS Technology Using Hybrid Trench Isolation with High Resistivity Substrate on Embedded RF/Analog Applications; *2000 Symposium on VLSI Technology Digest of Technical Papers*; c. 2000; pp. 154-155; Hyogo, Japan.
Mukesh Khare et al.; "A High Performance 90nm SOI Technology with 0.992 μm$^2$ 6T-SRAM Cell"; c. 2002; pp. 407-410.
Yuuichi Hirano et al.; "Impact of Actively Body-bias Controlled (ABS) SOI SRAM by Using Direct Body Contact Technology for Low-Voltage Application"; pp. 2.4.1-2.4.4.

* cited by examiner

*Primary Examiner*—Ngân V. Ngô
(74) *Attorney, Agent, or Firm*—McDermott Will & Emery LLP

(57) ABSTRACT

A contact connected to a word line is formed on a gate electrode of an access transistor of an SRAM cell. The contact passes through an element isolation insulating film to reach an SOI layer. A body region of a driver transistor and that of the access transistor are electrically connected with each other through the SOI layer located under the element isolation insulating film. Therefore, the access transistor is in a DTMOS structure having the gate electrode connected with the body region through the contact, which in turn is also electrically connected to the body region of the driver transistor. Thus, operations can be stabilized while suppressing increase of an area for forming the SRAM cell.

24 Claims, 54 Drawing Sheets

F I G . 2 8
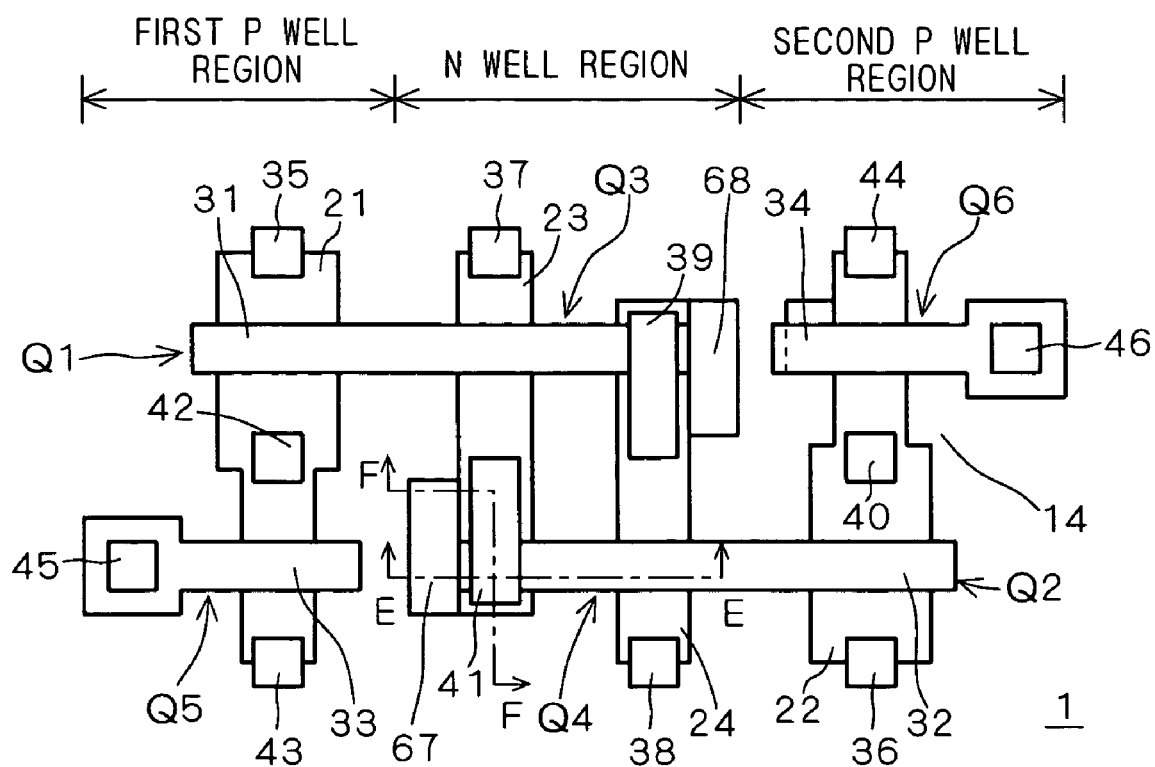

F I G. 3 0
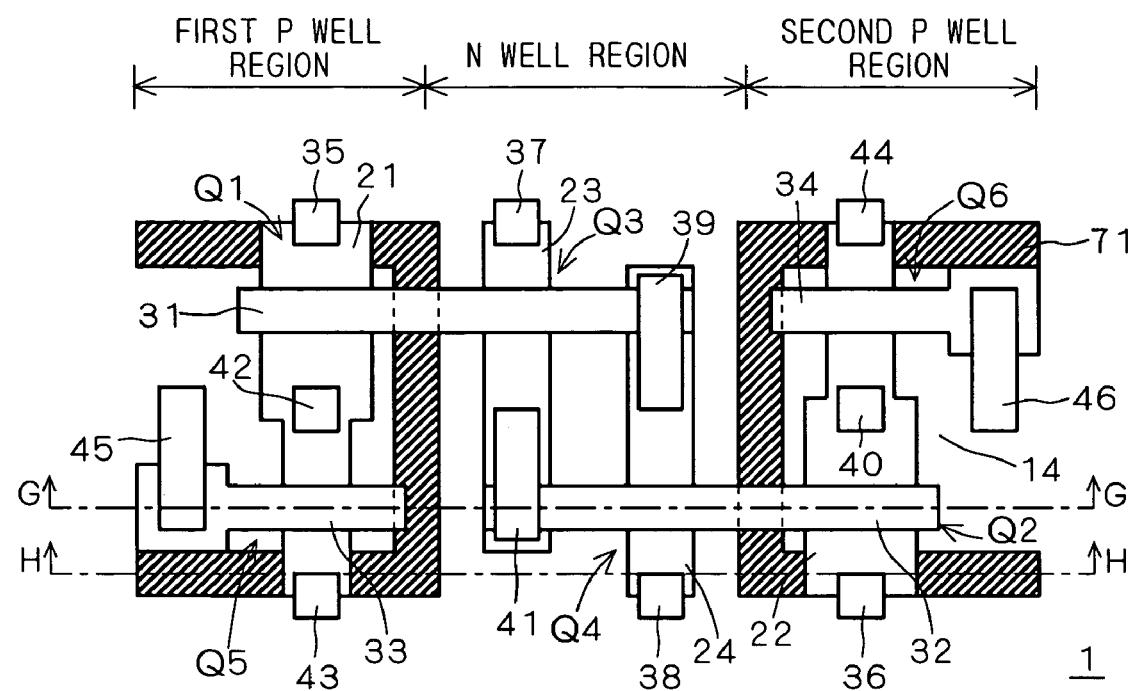

F I G. 3 6
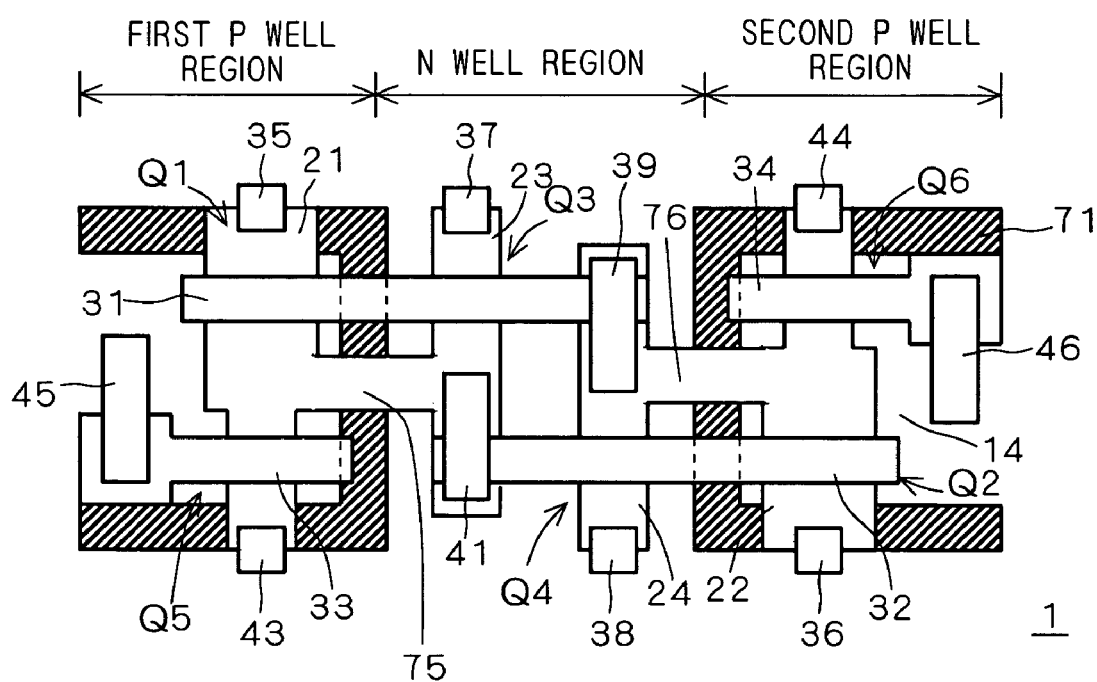

F I G. 7 5
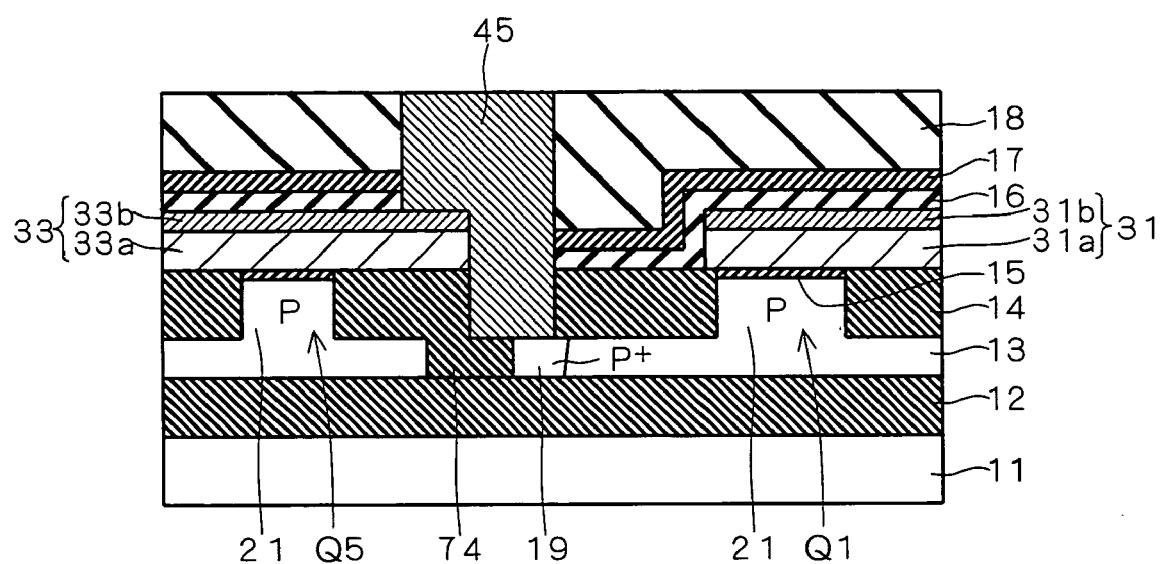

SEMICONDUCTOR MEMORY DEVICE AND METHOD OF MANUFACTURING THE SAME

BACKGROUND OF THE INVENTION

1. Field of the Invention

The present invention relates to a semiconductor memory device, and more particularly, it relates to an SRAM (static random access memory).

2. Description of the Background Art

In relation to a MOSFET (metal oxide silicon field-effect transistor) employing an SOI (silicon on insulator) substrate, a DTMOSFET (dynamic threshold voltage MOSFET, hereinafter abbreviated as "DTMOS") is proposed as means for increasing the operating speed and improving the current driving capability (refer to Japanese Patent Application Laying-Open Gazette No. 2001-77368, pp. 4 to 6, FIG. 3, for example).

The SOI substrate has a multilayer structure obtained by stacking a silicon substrate, a buried oxide film (BOX) layer and a silicon layer (SOI layer) in this order. In the DTMOS, a gate electrode having a gate oxide film on the lower surface thereof is selectively formed on the SOI layer. Further, source/drain regions paired through a body region located under the gate electrode are formed in the SOI layer. The feature of the DTMOS resides in that the gate electrode and the body region are electrically connected with each other.

When the gate electrode goes high to turn on the transistor in the DTMOS, a body potential also goes high. Then, the operating threshold voltage of the transistor is reduced so that a larger quantity of current can be fed as compared with a general MOSFET employing an SOI substrate (in other words, the current driving capability is improved).

In general, a gate electrode of a transistor has an electrode part provided on an active region and a pad part provided on an element isolation insulating film connected thereto. As disclosed in Japanese Patent Application Laying-Open Gazette No. 2001-77368, a contact reaching the SOI layer provided under the element isolation insulating film is formed in the pad part of the gate electrode of the DTMOS. The SOI layer provided under the element isolation insulating film is joined to the body region provided under the gate electrode and has the same conductivity type as the body region. In other words, the gate electrode and the body region of the DTMOS are electrically connected with each other through the aforementioned contact and the SOI layer provided under the element isolation insulating film.

However, the DTMOS has a larger element forming area as compared with a general MOSFET due to the contact formed in the pad part of the gate electrode for connecting the gate electrode and the body region with each other. Therefore, it is difficult to apply the DTMOS to a device required to form a large number of transistors in a small area on a semiconductor substrate.

An SRAM can be listed an example of such devices. If the DTMOS is applied to each of transistors (memory transistors) constituting memory cells of the SRAM, the operating threshold voltage of each SRAM cell is so reduced that the operating speed performance can be improved. In general, each SRAM cell has four transistors and two loads. Following recent reduction of driving voltages for semiconductor devices, however, SRAM cells each constituted of six transistors including two access transistors, two driver transistors and two load transistors in total have been increasingly mainstreamed. Therefore, it is further difficult to apply the DTMOS to the SRAM.

In the DTMOS, as a gate electrode is connected to a body region, the P-N junction between the body region and a source and a drain may be forward biased during increase of the potential of the gate electrode, thereby causing flow of a leakage current therethrough. Thus, application of the DTMOS to an SRAM cell may increase the power consumption of an SRAM.

SUMMARY OF THE INVENTION

An object of the present invention is to improve reliability of operation while suppressing increase of an area for forming an SRAM cell. It is another object of the present invention to reduce increase of power consumption caused by application of a DTMOS.

A semiconductor memory device according to a first aspect of the present invention includes an SRAM cell including an access MOS transistor, a driver MOS transistor, and a contact connecting a word line and a gate electrode of the access MOS transistor with each other. The contact is electrically connected at least either to a body region of the access MOS transistor or to a body region of the driver MOS transistor.

When the SRAM cell is driven and the potential of the word line is increased, the body potential of the driver MOS transistor or in the access MOS transistor, or the body potentials of both are also increased. Thus, the operating threshold voltages of the driver MOS transistor and the access MOS transistor are reduced to improve current driving capability. In other words, effects similar to those of a DTMOS are obtained either in the driver MOS transistor or the access MOS transistor, or in both. Therefore, the SRAM cell is reduced in operating threshold voltage and improved in operating speed performance. When the SRAM cell is in a standby state and the potential of the word line reaches 0 V, further, it follows that the body potential of the driver MOS transistor or the access MOS transistor, or the body potentials of both are also fixed to 0 V, whereby the SRAM is improved in soft error tolerance to attain high reliability.

A semiconductor memory device according to a second aspect of the present invention includes an SRAM cell including first and second load MOS transistors, and a contact connecting a gate electrode of the first load MOS transistor and a drain region of the second load MOS transistor with each other. The contact is electrically connected to a body region of the first load MOS transistor.

The current driving capability of the load MOS transistors is so improved as to attain an effect of improving a static noise margin of an SRAM. As compared with a conventional SRAM cell, no specific contact may be separately formed for electrically connecting the gate electrodes and the body regions of the load MOS transistors with each other. Therefore, a DTMOS can be applied to each load transistor while suppressing increase of a formation area.

A semiconductor memory device according to a third aspect of the present invention includes an SRAM cell including a load MOS transistor, and a first contact connecting a power supply wire and a source region of the load MOS transistor with each other. The first contact is electrically connected to a body region of the load MOS transistor.

The body potential of the load MOS transistor is so fixed to a power supply potential as to improve stability in operation of the SRAM cell. Further, the contact provided on each SRAM cell functions as a body contact for the load MOS transistor, whereby no power supply contact for a well potential fixing cell is necessary for contributing to reduction of an area for forming an SRAM.

A semiconductor memory device according to a fourth aspect of the present invention includes an SRAM cell including an access MOS transistor, a driver MOS transistor, and a first contact connecting a grounded wire and a source region of the driver MOS transistor with each other. The first contact is electrically connected to body regions of both of the access MOS transistor and the driver MOS transistor.

Body potentials of the driver MOS transistor and the access MOS transistor are fixed to a ground potential, thereby improving stability in operation of the SRAM cell. Further, the contact provided on each SRAM cell functions as a body contact for the driver MOS transistor and the access MOS transistor, whereby no ground contact for a well potential fixing cell is necessary for contributing to reduction of an area for forming an SRAM.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 28, 29A and 29B illustrate the structure of an SRAM cell according to a third preferred embodiment of the present invention;

FIGS. 30, 31A and 31B illustrate the structure of an SRAM cell according to a fourth preferred embodiment of the present invention;

FIG. 36 illustrates the structure of an SRAM cell according to a seventh preferred embodiment of the present invention;

FIGS. 72 through 75 illustrate the structure of an SRAM cell according to a seventeenth preferred embodiment of the present invention.

DESCRIPTION OF THE PREFERRED EMBODIMENTS

First Preferred Embodiment

Figure 1:
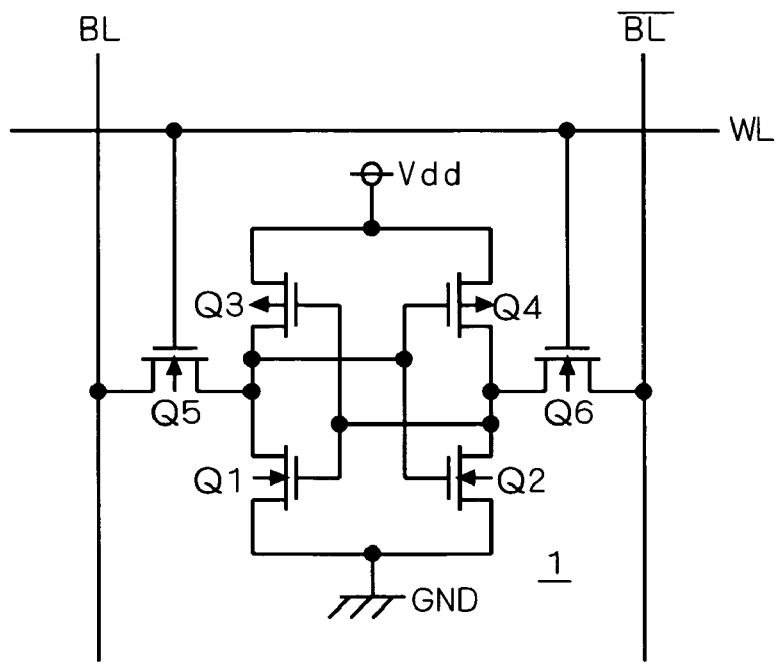
FIG. 1 is a circuit diagram of a general SRAM cell.

FIG. 1 is a circuit diagram of each memory cell (SRAM cell) 1 of a general SRAM. As shown in FIG. 1, first and second driver transistors Q1 and Q2 which are driving NMOS transistors (driver MOS transistors) and first and second load transistors Q3 and Q4 which are load PMOS transistors (load MOS transistors) constitute a pair of inverters. These inverters are interconnected with each other to constitute a flip-flop circuit. This flip-flop circuit and first and second access transistors Q5 and Q6 which are data transfer NMOS transistors (access MOS transistors) constitute the SRAM cell 1. The gates of the access transistors Q5 and Q6 are connected to a word line WL, while the sources/ drains of the access transistors Q5 and Q6 are connected to bit lines BL and /BL respectively.

Figure 2:
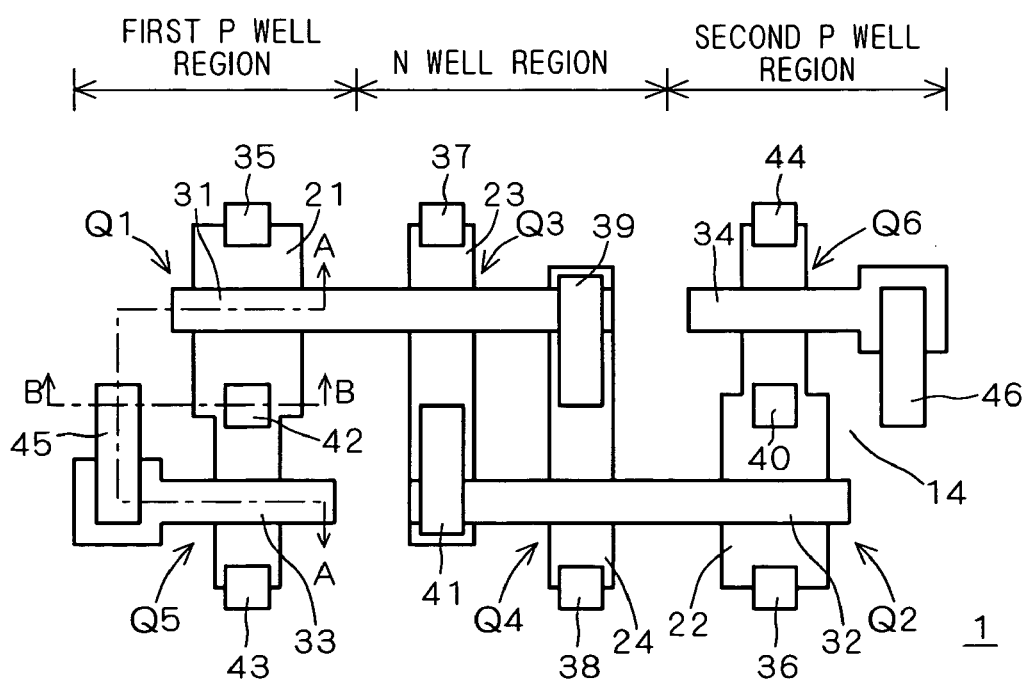
FIGS. 2 and 3 illustrate the structure of an SRAM cell according to a first preferred embodiment of the present invention.

FIG. 2 is a top plan view of each memory cell 1 of an SRAM forming a semiconductor memory device according to a first preferred embodiment of the present invention. As shown in FIG. 2, the SRAM cell 1 comprises a first P well region, an N well region and a second P well region transversely arranged on a semiconductor layer along the extensional direction of a word line (not shown). These P and N well regions are formed with first to fourth active regions 21 to 24 defined by an element isolation insulating film 14 formed in the upper surface parts thereof. A first driver transistor Q1 and a first access transistor Q5 are formed on the first active region 21 of the first P well region. A second driver transistor Q2 and a second access transistor Q6 are formed on the second active region 22 of the second P well region. First and second load transistors Q3 and Q4 are formed on the third and fourth active regions 23 and 24 of the N well region respectively.

Transversely extending first to fourth gate electrodes 31 to 34 are formed on the active regions 21 to 24 respectively. The first gate electrode 31 functions as the gates of the first driver transistor Q1 and the first load transistor Q3, while the second gate electrode 32 functions as the gates of the second driver transistor Q2 and the second load transistor Q4. The third and fourth gate electrodes 33 and 34 function as the gates of the first and second access transistors Q5 and Q6 respectively. According to this layout, the active regions 21 to 24 and the gate electrodes 31 to 34 are simply shaped suitably for reduction of the area for forming the SRAM cell 1.

Source regions of the driver transistors Q1 and Q2 are connected to ground (GND) wires through contacts 35 and 36 respectively. Source regions of the load transistors Q3 and Q4 are connected to power supply (Vdd) wires through contacts 37 and 38 respectively.

A contact 39 provided on the first gate electrode 31, also reaching the drain region of the second load transistor Q4, is connected to a contact 40 provided on the drain region of the second driver transistor Q2 through an upper wire (not shown). Similarly, a contact 41 provided on the second gate electrode 32, also reaching the drain region of the first load transistor Q3, is connected to a contact 42 provided on the drain region of the first driver transistor Q1 through another upper wire (not shown).

One of the source/drain regions of the first access transistor Q5 is joined to the drain region of the first driver transistor Q1 while the other source/drain region is connected to a bit line through a contact 43. Similarly, one of the source/drain regions of the second access transistor Q6 is joined to the drain region of the second driver transistor Q2, while the other source/drain region is connected to another bit line through a contact 44.

The third and fourth gate electrodes 33 and 34 are connected to the word line through contacts 45 and 46 respectively. The circuit structure of the SRAM cell 1 shown in FIG. 1 is obtained due to the aforementioned structure.

Figure 55:
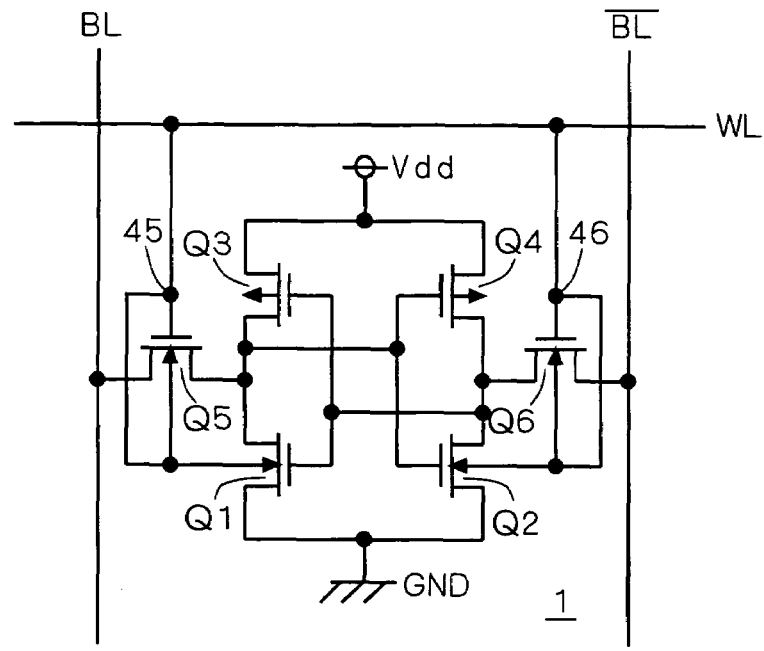
FIG. 55 illustrates an equivalent circuit of the SRAM cells according to the first, second and sixth preferred embodiments.

However, the SRAM cell 1 according to the first preferred embodiment is different from a conventional SRAM cell in the point that the contact 45 is also electrically connected to body regions of the first driver transistor Q1 and the first access transistor Q5 and the contact 46 is also electrically connected to body regions of the second driver transistor Q2 and the second access transistor Q6. FIG. 55 shows an equivalent circuit of the SRAM cell 1 according to the first preferred embodiment.

In the SRAM cell 1 according to the first preferred embodiment, the group of the first driver transistor Q1, the first load transistor Q3 and the first access transistor Q5 and the group of the second driver transistor Q2, the second load transistor Q4 and the second access transistor Q6 are symmetrically laid out as shown in FIG. 2 in similar structures.

Figure 3:
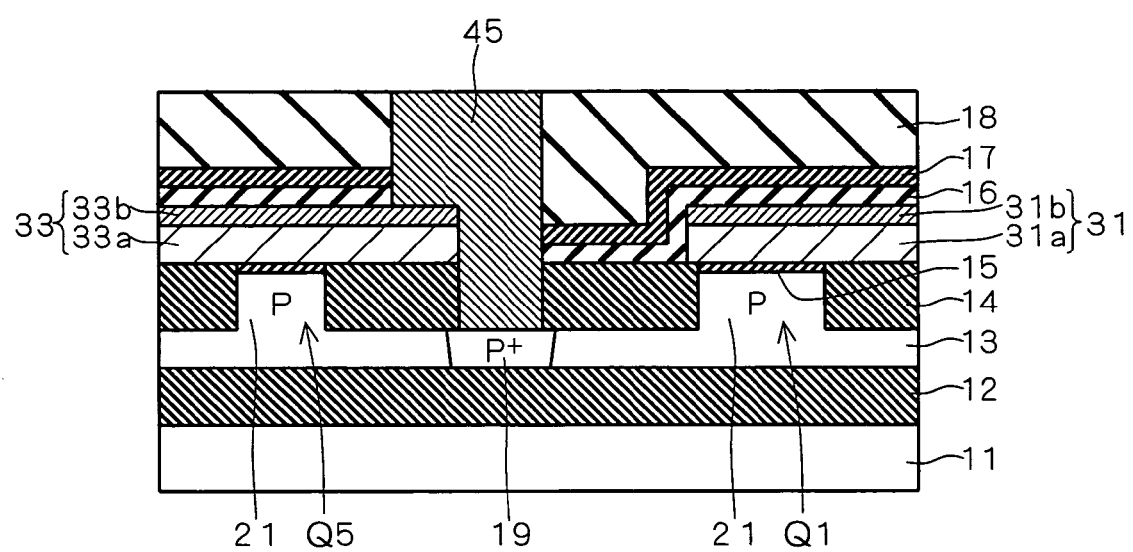

FIG. 3 is a sectional view taken along the line A-A in FIG. 2 for illustrating the structure of the SRAM cell 1 according to the first preferred embodiment. In other words, FIG. 3 is a sectional view of the first driver transistor Q1 and the first access transistor Q5. While the second driver transistor Q2 and the second access transistor Q6 are similar in structure thereto, redundant description is omitted for the purpose of simplification.

The SRAM cell 1 is formed on an SOI substrate consisting of a silicon substrate 11, a buried oxide (BOX) layer 12 and an SOI layer 13. The element isolation insulating film 14 is selectively formed on the upper surface of the SOI layer 13, thereby defining the first active region 21. A gate oxide film 15 is formed on the upper surface of the first active region 21 so that the first and third gate electrodes 31 and 33 are formed thereon. The first gate electrode 31 has a two-layer structure formed by a polysilicon layer 31a and a silicide layer 31b, while the third gate electrode 33 also has a two-layer structure formed by a polysilicon layer 33a and a silicide layer 33b.

An interlayer insulating film consisting of a silicon oxide film 16, a silicon nitride film 17 and another silicon oxide film 18 is formed on the first and third gate electrodes 31 and 33. The contact 45 formed in this interlayer insulating film and connected to an upper word line (not shown) is connected to the third gate electrode 33 while passing through the element isolation insulating film 14 to be connected also to the SOI layer 13 located under the same.

In the first active region 21, a P-type region located under the first gate electrode 31 is the body region of the first driver transistor Q1, and another P-type region located under the third gate electrode 33 is the body region of the first access transistor Q5. As shown in FIG. 3, the bottom of the element isolation insulating film 14 does not reach the BOX layer 12. Therefore, the body regions of the first driver transistor Q1 and the first access transistor Q5 are electrically connected with each other through the SOI layer 13 (P well region) located under the element isolation insulating film 14.

Thus, it follows that the contact 45 is connected to the third gate electrode 33 and also electrically connected to both of the body regions of the first access transistor Q5 and the first driver transistor Q1. In other words, the first access transistor Q5 has the so-called DTMOS structure having the gate electrode and the body region connected with each other through the contact 45, which in turn is further connected to the body region of the first driver transistor Q1.

According to the first preferred embodiment, a P+ region 19 having a higher impurity concentration than the remaining portions of the first P well region is formed on the portion where the contact 45 and the SOI layer 13 are connected with each other, as shown in FIG. 3. Thus, ohmic contact is implemented between the contact 45 and the SOI layer 13.

According to this structure, body potentials of the first driver transistor Q1 and the first access transistor Q5 are also increased when the SRAM cell 1 is driven and the potential of the word line is increased. Thus, the first driver transistor Q1 and the first access transistor Q5 are reduced in operating threshold voltage and improved in current driving capability. In other words, both of the first driver transistor Q1 and the first access transistor Q5 attain effects similar to those of a DTMOS. Therefore, the SRAM cell 1 is reduced in operating threshold voltage and improved in operating speed performance. When the SRAM cell 1 is in a standby state and the potential of the word line is set to 0 V, the body potentials of the first driver transistor Q1 and the first access transistor Q5 are also fixed to 0 V, whereby soft error tolerance of the SRAM cell 1 is improved to attain high reliability. Only the contact 45 is formed for the body regions in order to attain these effects. Therefore, increase of a forming area is suppressed as compared with a case of applying DTMOS structures to the first driver transistor Q1 and the first access transistor Q5 respectively.

Further, the $P^+$ region 19 having a relatively high impurity concentration is formed on the portion where the contact 45 and the SOI layer 13 are connected with each other for enabling ohmic contact between the contact 45 and the SOI layer 13, whereby a voltage drop resulting from connection resistance between the contact 45 and the SOI layer 13 is suppressed. The effect of improving the current driving capability is efficiently attained in the first driver transistor Q1 and the first access transistor Q5.

The second driver transistor Q2 and the second access transistor Q6 are also structured similarly to the above, although illustration thereof is omitted. In other words, the contact 46 shown in FIG. 2 connects the word line and the fourth gate electrode 34 with each other and is electrically connected to both of the body regions of the second access transistor Q6 and the second driver transistor Q2. Therefore, the aforementioned advantages of the first preferred embodiment can be attained also in the second driver transistor Q2 and the second access transistor Q6.

When the DTMOS is applied to the driver transistors Q1 and Q2 and the access transistors Q5 and Q6 of the SRAM cell 1, such a problem tends to arise that a forward bias is applied to P-N junctions between the body regions and the sources/drains of the transistors Q1, Q2, Q5 and Q6 when the word line potential is increased to feed a current to these portions and increase power consumption since the word line is connected to the body regions. According to the structure of the SRAM cell 1 of the first preferred embodiment, this problem is relieved. This effect is now described.

Figure 56:
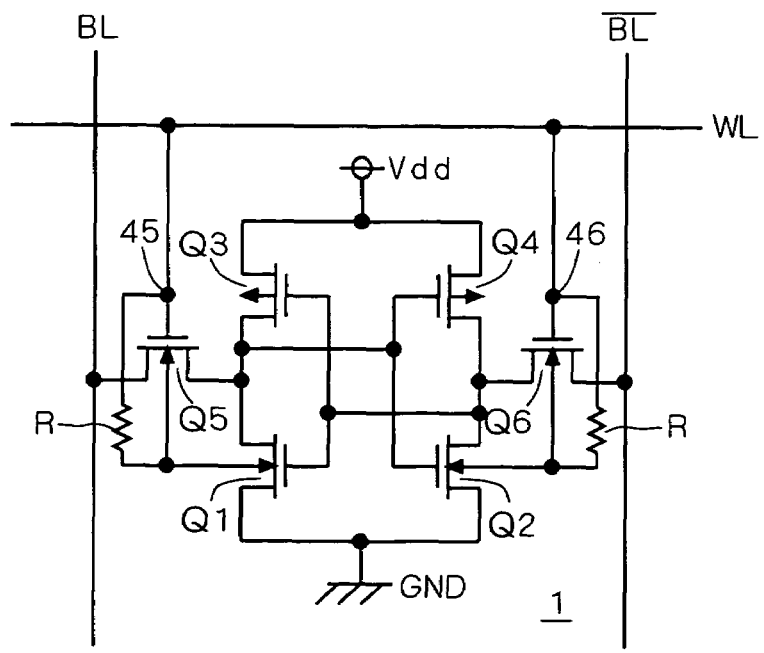
FIG. 56 is a diagram for illustrating effects of the first preferred embodiment.

According to the first preferred embodiment, it follows that the SOI layer 13 has finite resistances on portions located under the element isolation insulating film 14 due to small thicknesses. FIG. 56 shows a more correct equivalent circuit of the SRAM cell 1. As shown in FIG. 56, the portions of the SOI layer 13 located under the element isolation insulating film 14 are inserted between the body regions of the contact 45 and the body regions of the first driver transistor Q1 and the first access transistor Q5 and between the contact 46 and the body regions of the second driver transistor Q2 and the second access transistors Q6 as resistors R respectively. These resistors R reach values of several 10 k$\Omega$ to several M$\Omega$ (depending on the manufacturing process). On the other hand, the P-N junctions between the body regions and the sources/drains of the transistors Q1, Q2, Q5 and Q6 are in high-impedance states of several 10 M$\Omega$ to several G$\Omega$ until the same are rendered sufficiently conductive (until forward biases of these P-N junctions exceed 0.5 to 0.6 V), whereby voltage drops on the resistors R are ignorable. In other words, most of the word potential is held on these P-N junctions until the same reaches about 0.6 V, whereby the body potentials are efficiently increased approximately to 0.6 V. When the word line potential exceeds 0.6 V, these P-N junctions are rendered sufficiently conductive while voltage drops of the resistors R become remarkable to suppress voltages applied to the P-N junctions. Consequently, the problem of increasing power consumption due to a current flowing to the P-N junctions between the body regions and the sources/drains of the transistors Q1, Q2, Q5 and Q6 is relieved.

Figure 4A:
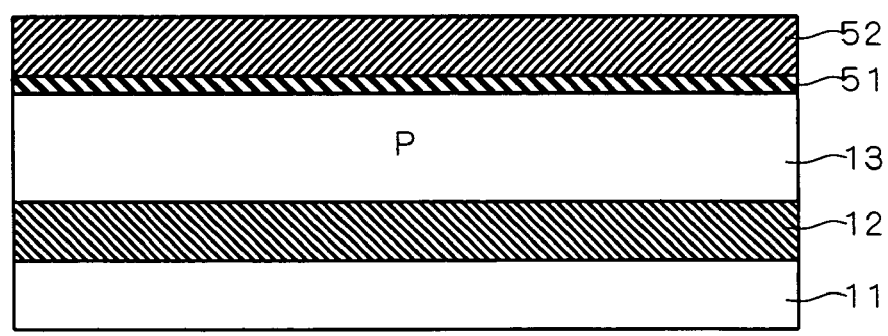
FIGS. 4A through 16B illustrate steps of manufacturing the SRAM cell according to the first preferred embodiment.

FIGS. 4A trough 16B illustrate steps of manufacturing the SRAM cell 1 according to the first preferred embodiment. FIGS. 4A, 5A, 6A, 7A, 8A, 9A, 10A, 11A, 12A, 13A, 14A, 15A and 16A are sectional views taken along the line A-A in FIG. 2, and FIGS. 4B, 5B, 6B, 7B, 8B, 9B, 10B, 11B, 12B, 13B, 14B, 15B and 16B are sectional view taken along the line B-B in FIG. 2 respectively. The steps of manufacturing the SRAM cell 1 according to the first preferred embodiment are now described with reference to FIGS. 4A through 16B.

Figure 4B:
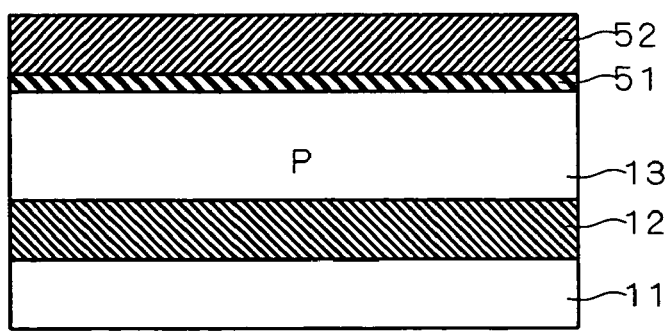

First, the SOI substrate is prepared by stacking the BOX layer 12 of about 100 to 500 nm in thickness and the SOI layer 13 of about 50 to 500 nm in thickness on the silicon substrate 11. Impurities are implanted into the SOI layer 13 for forming the first and second P well regions and the N well region, and a silicon oxide film 51 of several 10 nm is formed thereon followed by formation of a silicon nitride film 52 of about several 100 nm in thickness (FIGS. 4A and 4B).

Figure 5A:
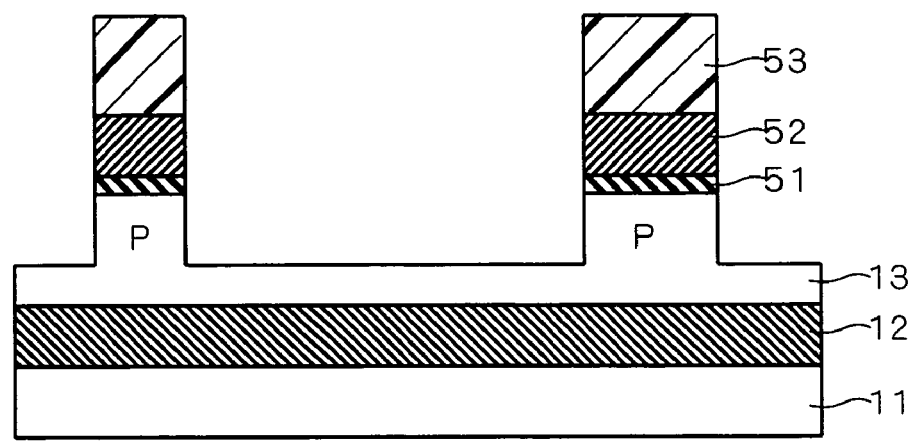
Figure 5B:
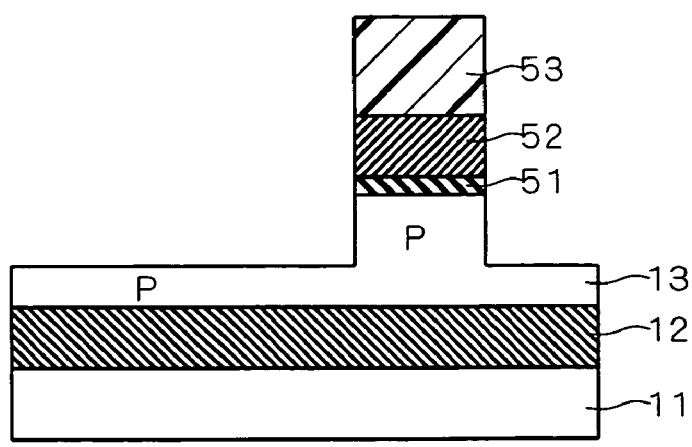

A resist film 53 having openings above regions for forming the active regions 21 to 24 is formed on the SOI substrate (in other words, the resist film 53 is formed above a region for forming the element isolation insulating film 14). This resist film 53 is employed as a mask for patterning the silicon nitride film 52, the silicon oxide film 51 and the SOI layer 13 by etching. This etching is stopped while leaving the bottom of the SOI layer 13. In other words, the SOI layer 13 is not completely removed from the region for forming the element isolation insulating film 14 (FIGS. 5A and 5B).

Figure 6A:
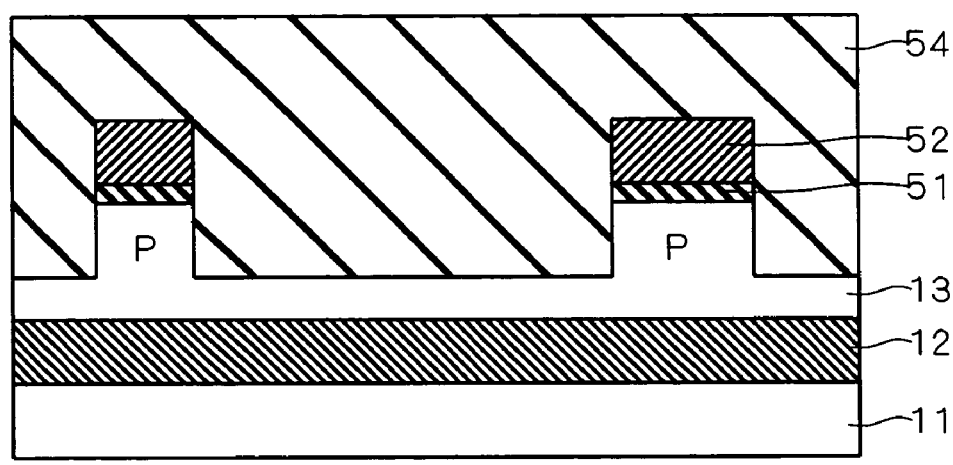
Figure 6B:
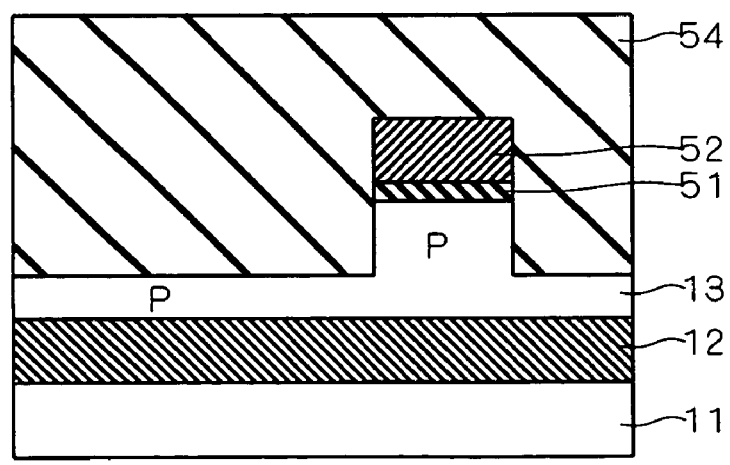
Figure 7A:
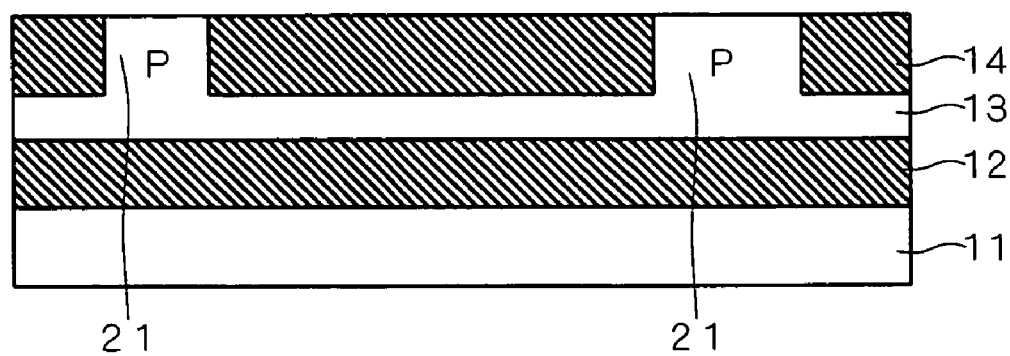
Figure 7B:
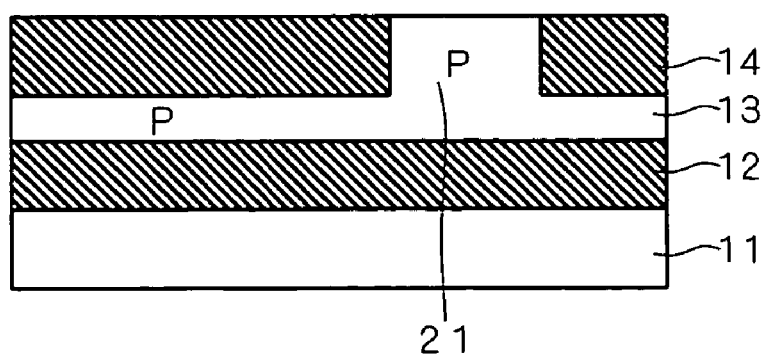

The resist film 53 is removed and a silicon oxide film 54 is formed on the overall surface (FIGS. 6A and 6B). The upper surface of the silicon oxide film 54 is flattened by CMP, and the silicon nitride film 52 and the silicon oxide film 51 are removed. Consequently, the silicon oxide film 54 remaining on recess portions of the SOI layer 13 forms the element isolation insulating film 14, while regions therebetween (projecting portions of the SOI layer 13) form the active regions 21 to 24 (FIGS. 7A and 7B).

Figure 8A:
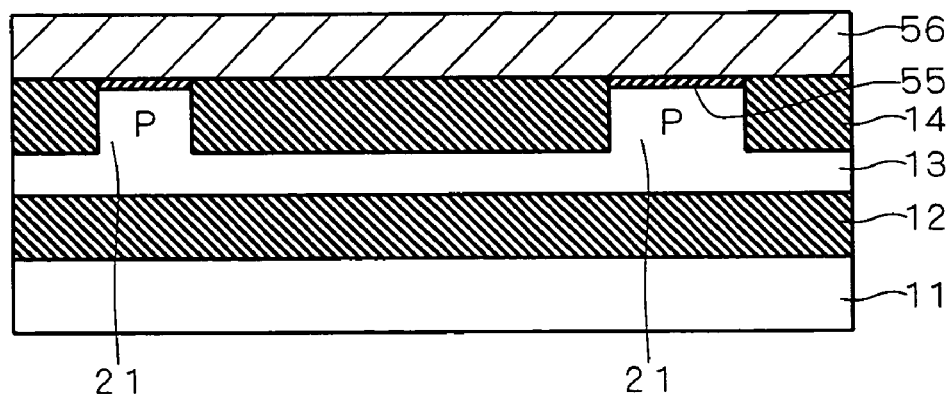
Figure 8B:
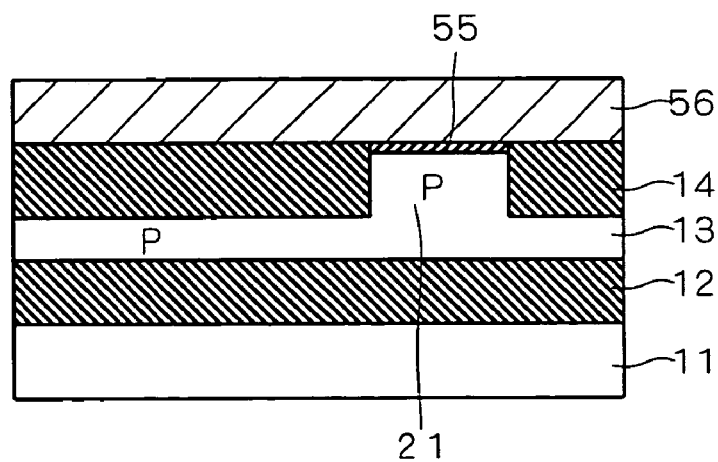

Ions for forming channel regions of the transistors Q1 to Q6 are implanted into the active regions 21 to 24. For example, boron (B) is implanted into the active regions 21 and 22 for forming the NMOS transistors (the driver transistors Q1 and Q2 and the access transistors Q5 and Q6) under conditions of implantation energy of several 10 keV and a dose of about $10^{13}/cm^2$. Further, phosphorus (P), for example, is implanted into the active regions 23 and 24 for forming the PMOS transistors (the load transistors Q3 and Q4) under conditions of implantation energy of several 10 keV and a dose of about $10^{13}/cm^2$. Then, a thermal oxide film 55 is formed on the upper surfaces of the active regions 21 to 24 by thermal oxidation, followed by formation of a polysilicon film 56 on the overall surface (FIGS. 8A and 8B).

Figure 9A:
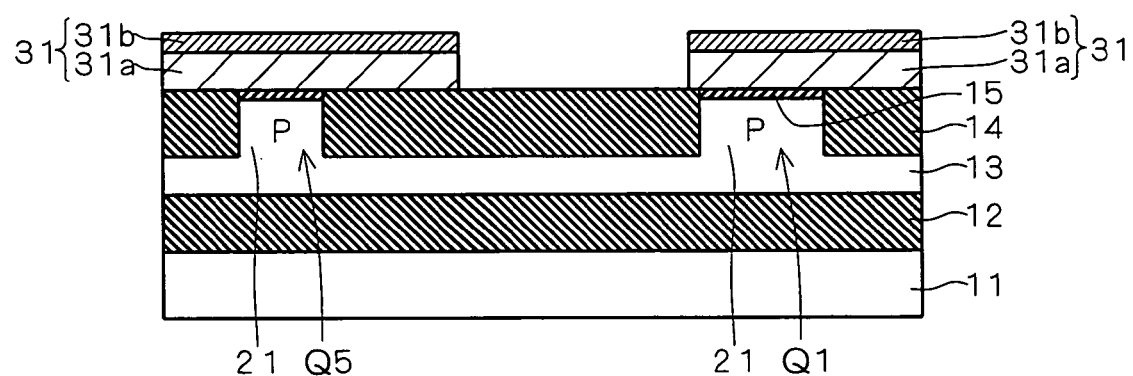
Figure 9B:
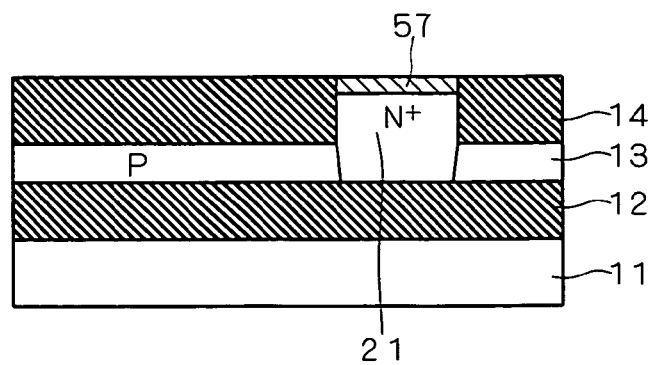

The thermal oxide film 55 and the polysilicon film 56 are patterned for forming the gate oxide film 15 and the gate electrodes 31 to 34. Thereafter ions are implanted for forming the source/drain regions of the transistors Q1 to Q6. For example, arsenic (As) is implanted under conditions of implantation energy of several 10 keV and a dose of about $10^{15}/cm^2$ for the NMOS transistors (the driver transistors Q1 and Q2 and the access transistors Q5 and Q6). Further, boron is implanted under conditions of implantation energy of several keV and a dose of about $10^{15}/cm^2$ for the PMOS transistors (the load transistors Q3 and Q4). In addition, upper portions of the source/drain regions of the transistors Q1 to Q4 and those of the gate electrodes 31 to 34 are silicified. Thus, silicide layers 57 are formed on the source/ drain regions of the active regions 21 to 24 while the gate electrodes 31 to 34 have the two-layer structures of the polysilicon layers and the silicide layers (FIGS. 9A and 9B).

The gate electrodes 31 to 34 serve as masks in the ion implantation for forming the source/drain regions. Therefore, no source/drain regions are formed in regions of the SOI layer 13 located under the gate electrodes 31 to 34 but these regions form the body regions.

Figure 10A:
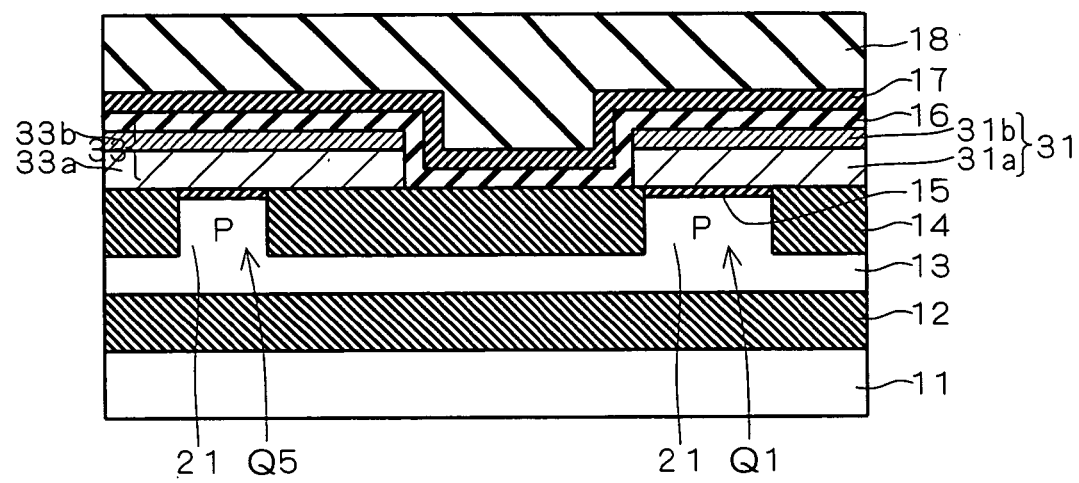
Figure 10B:
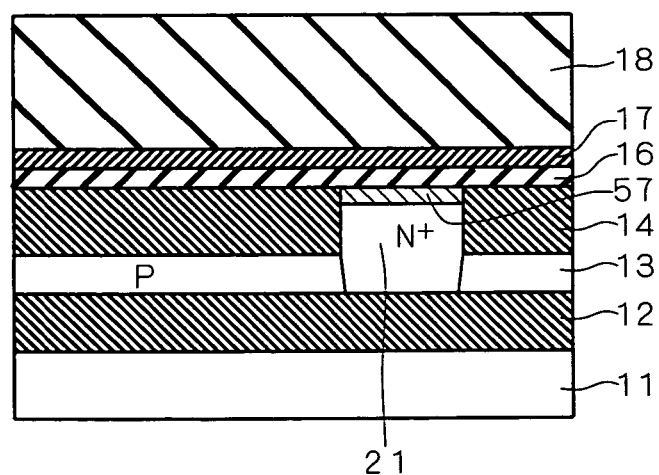

The silicon oxide film 16 of several 10 nm in thickness and the silicon nitride film 17 of several 10 nm in thickness are formed on the overall surface, follows by formation of the silicon oxide film 18 of about several nm in thickness thereon (FIGS. 10A and 10B). A resist film 58 having openings above regions for forming the contacts 35 to 46 is formed on the silicon oxide film 18 and employed as a mask for etching the silicon oxide film 18 through the silicon nitride film 17 serving as an etching stopper. Exposed portions of the silicon nitride film 17 and the silicon oxide film 16 are successively etched for forming contact holes 42a and 45a reaching the active regions 21 to 24 and the gate electrodes 31 to 34 (FIGS. 11A and 11B).

Figure 11A:
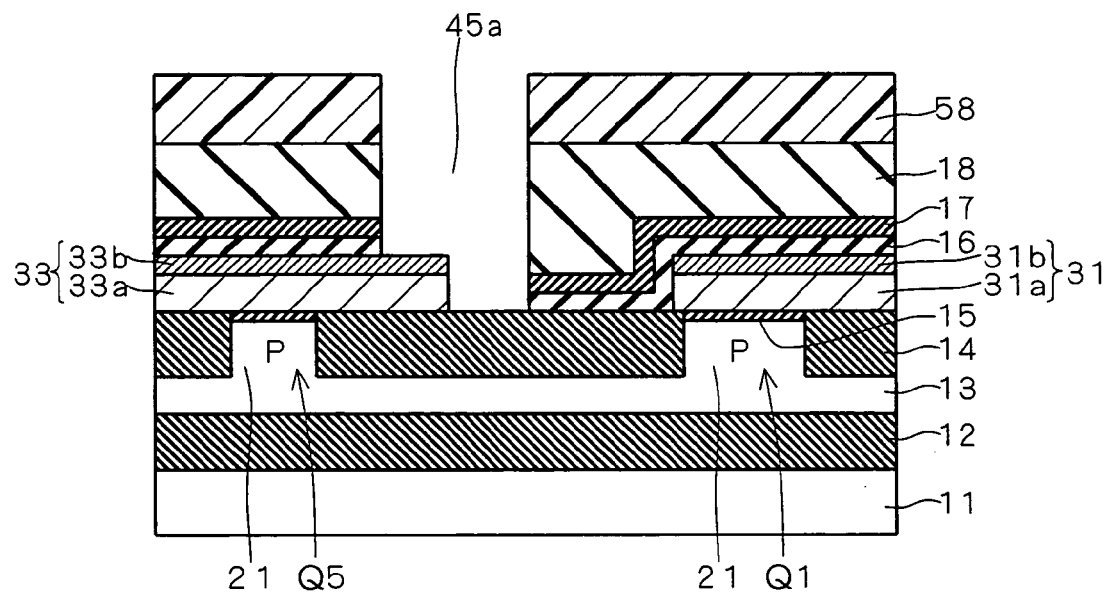
Figure 11B:
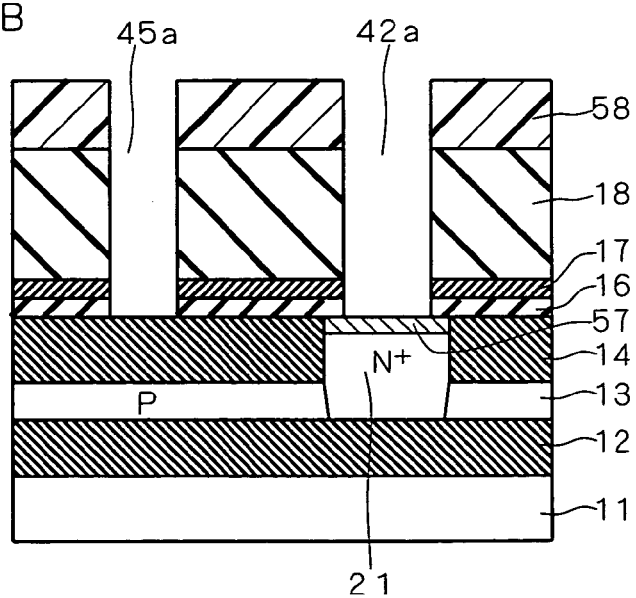
Figure 12A:
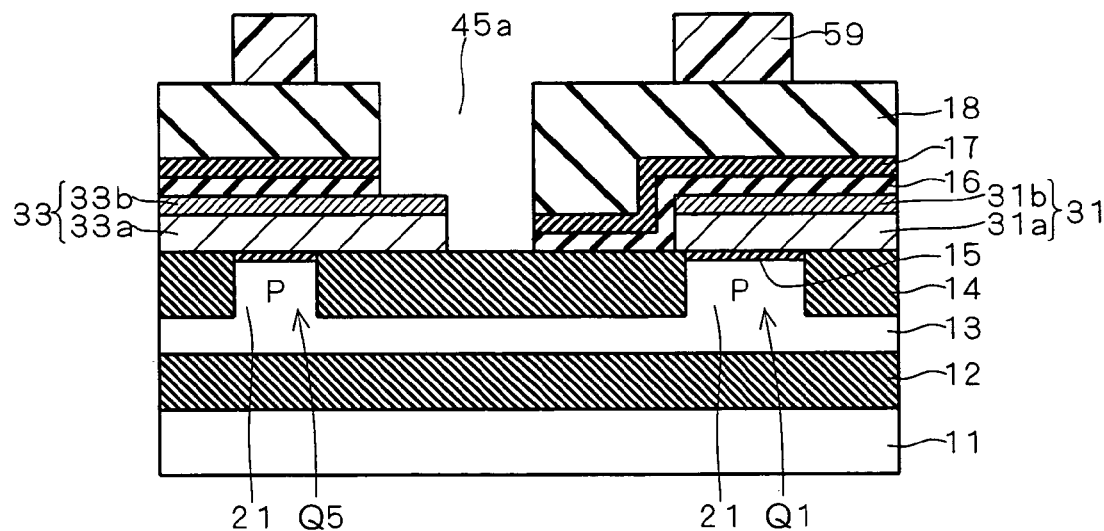
Figure 12B:
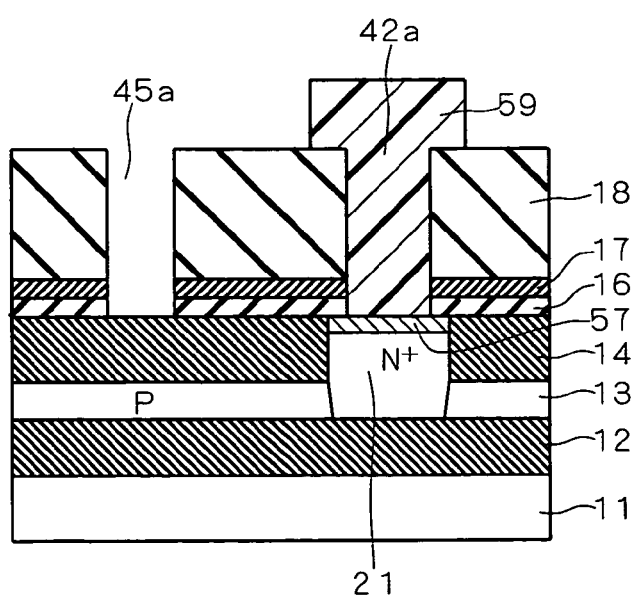

A resist film 59 is formed to fill up that (the contact hole 42a shown in FIG. 11B, for example) other than that (the contact hole 45a shown in FIGS. 11A and 11B, for example) for the contacts 45 and 46 among the contact holes 42a and 45a formed in the step shown in FIGS. 11A and 11B (FIGS. 12A and 12B). The pattern of the resist film 59 in this step may be identical to that of the resist film 53 for forming the active regions 21 to 24 shown in FIGS. 5A and 5B. In this case, no specific photomask may be prepared for this step. The resist film 53 shown in FIGS. 5A and 5B is also used for manufacturing a conventional SRAM cell, whereby it follows that the same photomask as that for manufacturing the conventional SRAM cell may be prepared. In this case, the resist film 59 is formed entirely above the active regions 21 to 24 regardless of the positions of the contact holes 42a and 45a, as a matter of course (see FIG. 12A).

Figure 13A:
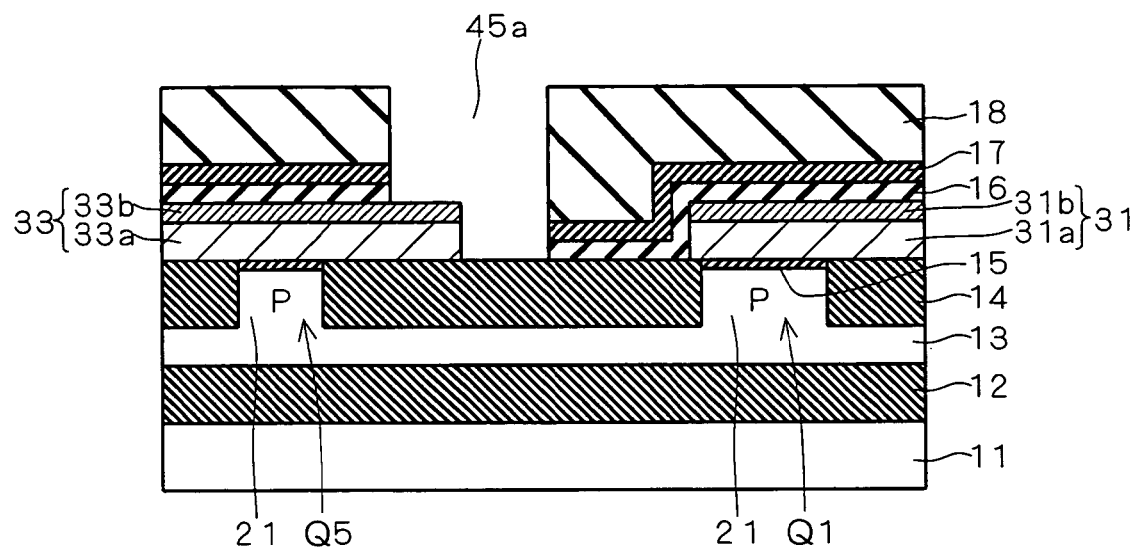
Figure 13B:
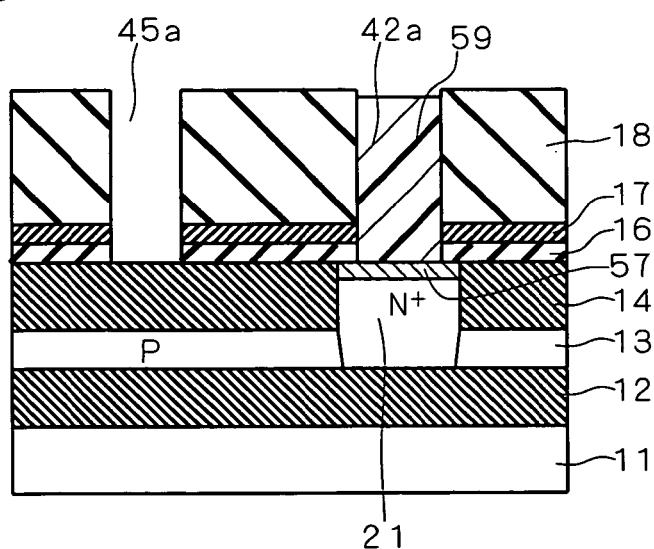
Figure 14A:
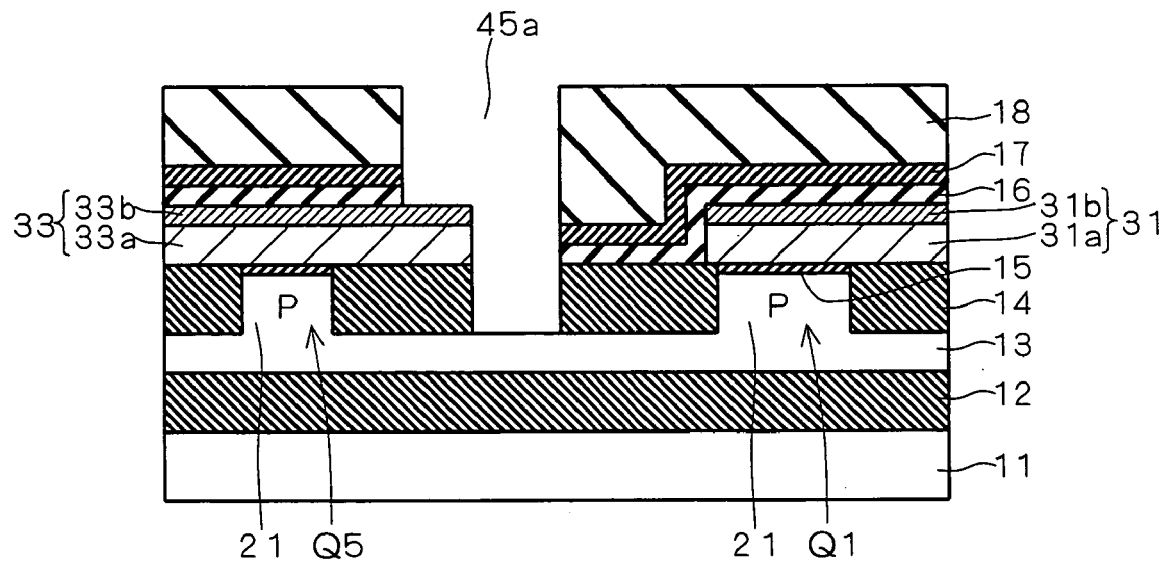
Figure 14B:
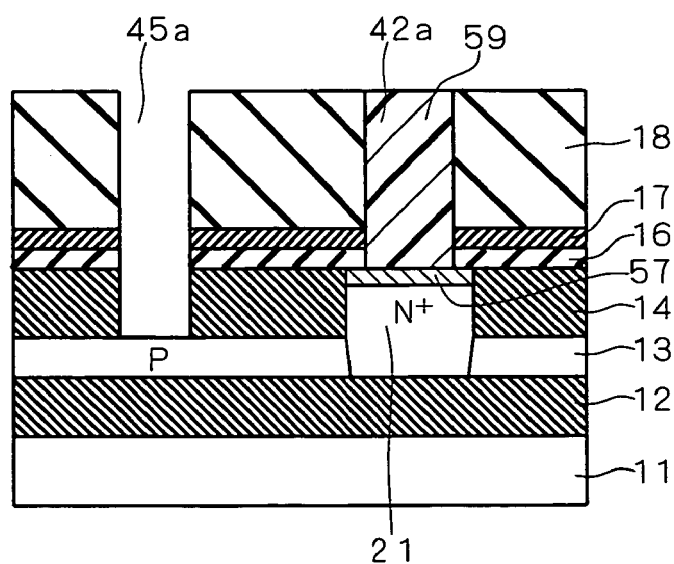

An etch-back process is performed for removing excess portions of the resist film 59 from the upper surface of the silicon oxide film 13 (FIGS. 13A and 13B). Thereafter the silicon oxide film 18 and the resist film 59 are employed as masks for etching the element isolation insulating film 14 in the contact hole 45a for the contacts 45 and 46, for exposing the SOI layer 13 in the contact hole 45a (FIGS. 14A and 14B).

Figure 15A:
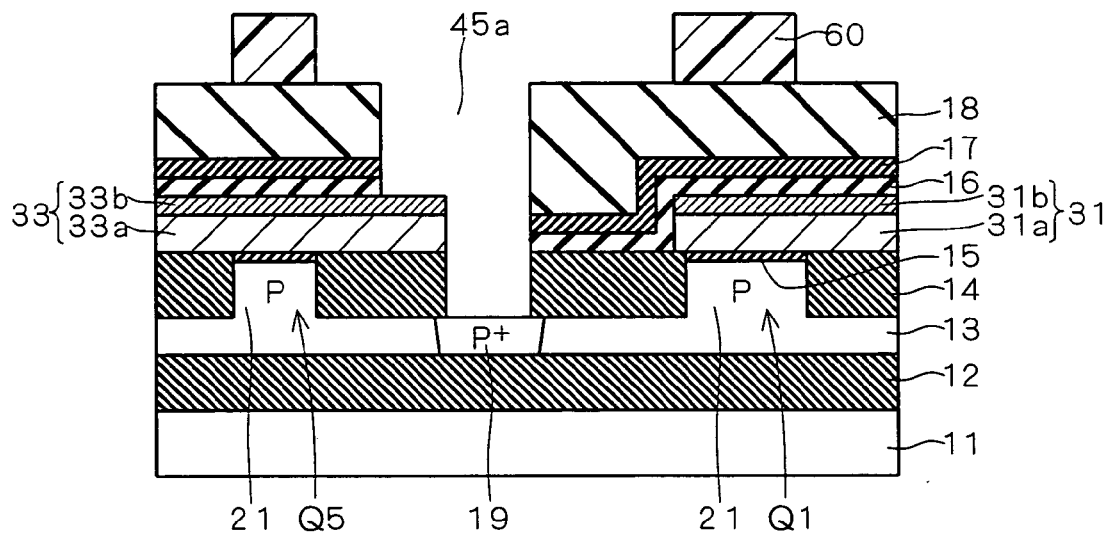
Figure 15B:
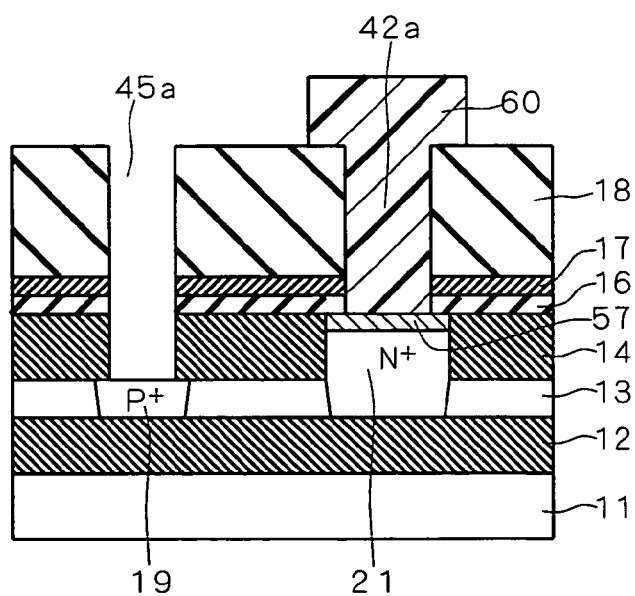

The resist film 59 is removed and another resist film 60 is formed to fill up the contact hole 42a other than the contact hole 45a for the contacts 45 and 46. The silicon oxide film 18 and the resist film 60 are employed as masks for implanting ions into the contact hole 45a for the contacts 45 and 46 thereby forming the P$^+$ region 19 in the SOI layer 13 exposed therein (FIGS. 15A and 15B). For example, boron is implanted under conditions of implantation energy of several keV and a dose of about $10^{14 \; to \; 15}$/cm$^2$. When the resist film 60 used in this step also has the same pattern as that of the resist film 53 shown in FIGS. 5A and 5B, no specific photomask may be prepared for this step.

Figure 16A:
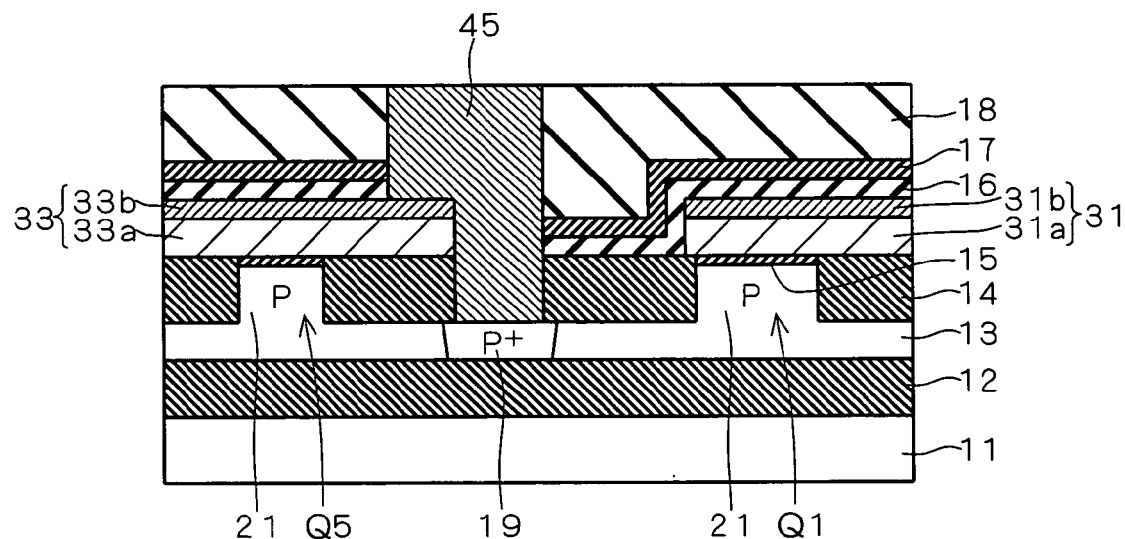
Figure 16B:
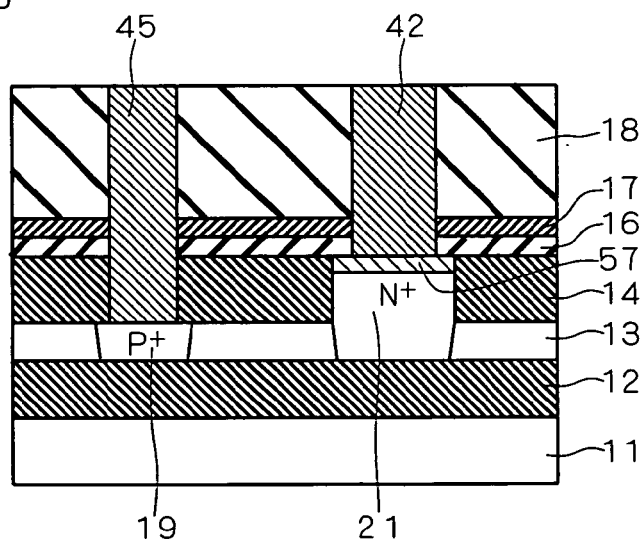

The resist film 60 is removed and a metal such as tungsten is embedded in the contact holes 42a and 45a, thereby forming the contacts 35 to 46 (FIGS. 16A and 16B). Necessary wires such as the bit lines and the word line connected to the contacts 35 to 46 and an interlayer insulating film covering the same are formed on the silicon oxide film 18, whereby the SRAM cell 1 according to the first preferred embodiment can be formed.

The resist film 59 serving as an etching mask for exposing the SOI layer 13 in the contact hole 45a for the contacts 45 and 46 and the resist film 60 serving as an ion implantation mask for forming the P$^+$ region 19 are separately formed in the first preferred embodiment. However, the resist film 59 may not be removed after exposing the SOI layer 13 in the contact hole 45a but may be used as the ion implantation mask for forming the P$^+$ region 19 as such. Thus, the step of forming the resist film 60 can be so omitted as to simplify the manufacturing steps.

Second Preferred Embodiment

Figure 17:
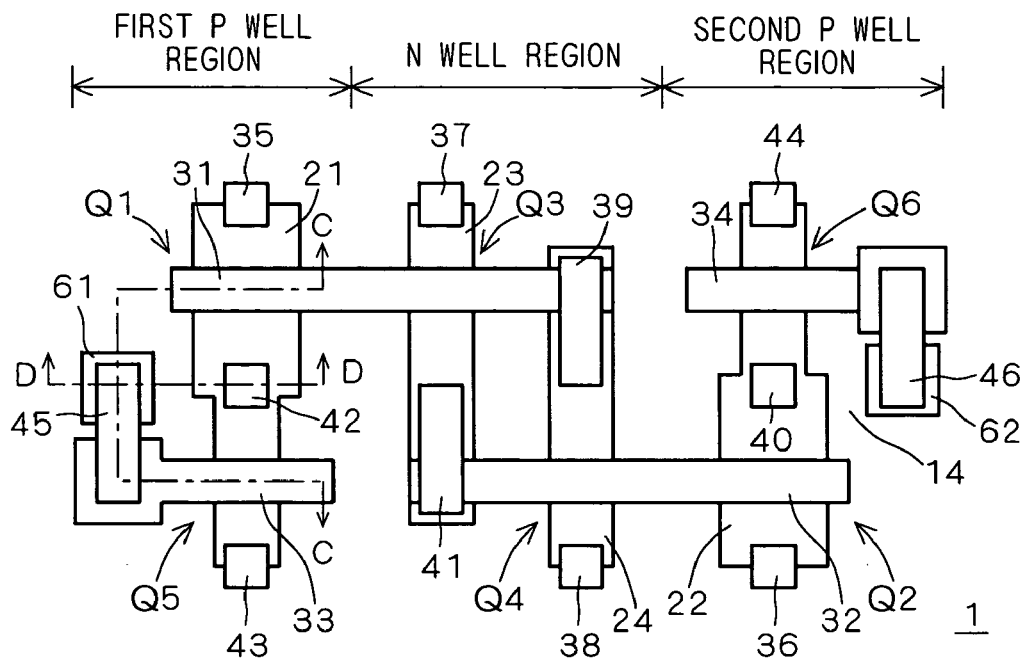
FIGS. 17 and 18 illustrate the structure of an SRAM cell according to a second preferred embodiment of the present invention.

FIG. 17 is a top plan view of an SRAM cell 1 according to a second preferred embodiment of the present invention. Referring to FIG. 17, elements having functions similar to those of the elements shown in FIG. 2 are denoted by the same reference numerals, to omit redundant description. Also in the second preferred embodiment, a group of a first driver transistor Q1, a first load transistor Q3 and a first access transistor Q5 and a group of a second driver transistor Q2, a second load transistor Q4 and a second access transistor Q6 are similar in structure to each other.

Similarly to the first preferred embodiment, a contact 45 is electrically connected to body regions of the first access transistor Q5 and the first driver transistor Q1 and a contact 46 is electrically connected to body regions of the second driver transistor Q2 and the second access transistor Q6 also in the SRAM cell 1 according to the first preferred embodiment. In other words, FIG. 55 also corresponds to an equivalent circuit of the SRAM cell 1 according to the second preferred embodiment.

However, the SRAM cell 1 according to the second preferred embodiment has a P-type fifth active region 61 joined to the body regions of the first access transistor Q5 and the first driver transistor Q1 and a P-type sixth active region 62 joined to the body regions of the second driver transistor Q2 and the second access transistor Q6. The contact 45 is connected to the fifth active region 61, and the contact 46 is connected to the sixth active region 62.

Figure 18:
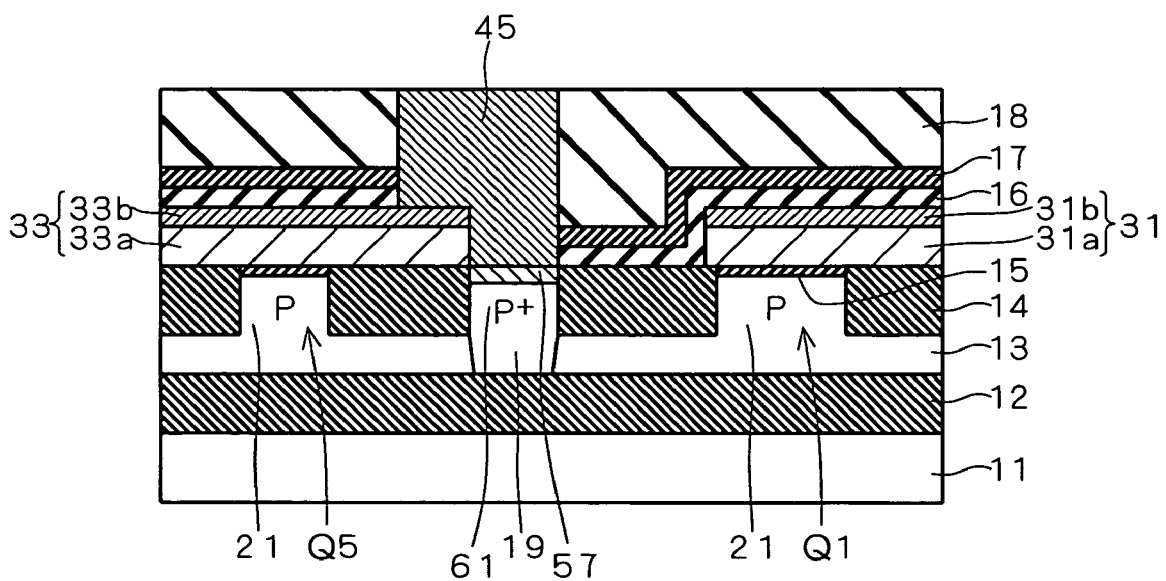

FIG. 18 is a sectional view taken along the line C-C in FIG. 17 showing the first driver transistor Q1 and the first access transistor Q5. The second driver transistor Q2 and the second access transistor Q6 are similar in structure to the first driver transistor Q1 and the first access transistor Q5 respectively, and hence redundant description is omitted. As shown in FIG. 18, the bottom of an element isolation insulating film 14 does not reach a BOX layer 12. Therefore, the body regions of the first driver transistor Q1 and the first access transistor Q5 and the fifth active region 61 are electrically connected with each other through portions of an SOI layer (P well region) 13 located under the element isolation insulating film 14.

The contact 45 is connected to a third gate electrode 33 as well as to the fifth active region 61. That is, the contact 45 is also electrically connected to both of the body regions of the first access transistor Q5 and the first driver transistor Q1. In other words, the first access transistor Q5 is in a DTMOS structure having a gate electrode and the body region connected with each other through the contact 45 and the fifth active region 61, while the contact 45 is also electrically connected to the body region of the first driver transistor Q1. A P$^+$ region 19 having a relatively high impurity concentration is formed on the fifth active region 61, in order to implement ohmic contact therebetween.

According to this structure, both of the first driver transistor Q1 and the first access transistor Q5 attain effects similar to those of a DTMOS similarly to the first preferred embodiment, for improving operating speed performance of the SRAM cell 1 as well as soft error tolerance in a standby state. Only the contact 45 is formed for attaining these effects. Therefore, increase of a forming area is suppressed as compared with a case of applying DTMOS structures to the respective ones of the first driver transistor Q1 and the first access transistor Q5.

Further, the $P^+$ region 19 having a relatively high impurity concentration is so formed on the fifth active region 61 as to enable ohmic contact between the contact 45 and the fifth active region 61, thereby suppressing a voltage drop resulting from connection resistance between the contact 45 and the fifth active region 61. Therefore, the first driver transistor Q1 and the first access transistor Q5 efficiently attain effects of improving current driving capability. Comparing FIGS. 2 and 18 with each other, it is understood that the contact 45 is connected to the relatively thick SOI layer 13 (the $P^+$ region 19) while a silicide layer 57 is provided therebetween according to the second preferred embodiment, whereby dispersion of connection resistance is reduced to be capable of contributing to stabilization of operations of the SRAM cell 1.

The second driver transistor Q2 and the second access transistor Q6 are also similar in structure (not shown) to the above. In other words, the contact 46 shown in FIG. 17 connects a word line and a fourth gate electrode 34 with each other and is electrically connected to both of the body regions of the second access transistor Q6 and the second driver transistor Q2 through the sixth active region 62. Therefore, the second driver transistor Q2 and the second access transistor Q6 also attain the aforementioned effects of the second preferred embodiment.

FIGS. 19A through 27B illustrate steps of manufacturing the SRAM cell 1 according to the second preferred embodiment. FIGS. 19A, 20A, 21A, 22A, 23A, 24A, 25A, 26A and 27A are sectional views taken along the line C-C in FIG. 17, and FIGS. 19B, 20B, 21B, 22B, 23B, 24B, 25B, 26B and 27B are sectional view taken along the line D-D in FIG. 17 respectively. Also referring to FIGS. 19A through 27B, elements having functions similar to those of the elements shown in FIGS. 4A through 16B are denoted by the same reference numerals. The steps of manufacturing the SRAM cell 1 according to the second preferred embodiment are now described with reference to FIGS. 19A through 27B.

Similarly to the step described with reference to FIGS. 4A and 4B in relation to the first preferred embodiment, an SOI substrate is prepared by stacking the BOX layer 12 and the SOI layer 13 on a silicon substrate 11 for implanting impurities for forming first and second P well regions and an N well region into the SOI layer 13 and thereafter successively forming a silicon oxide film 51 and a silicon nitride film 52 thereon.

Figure 19A:
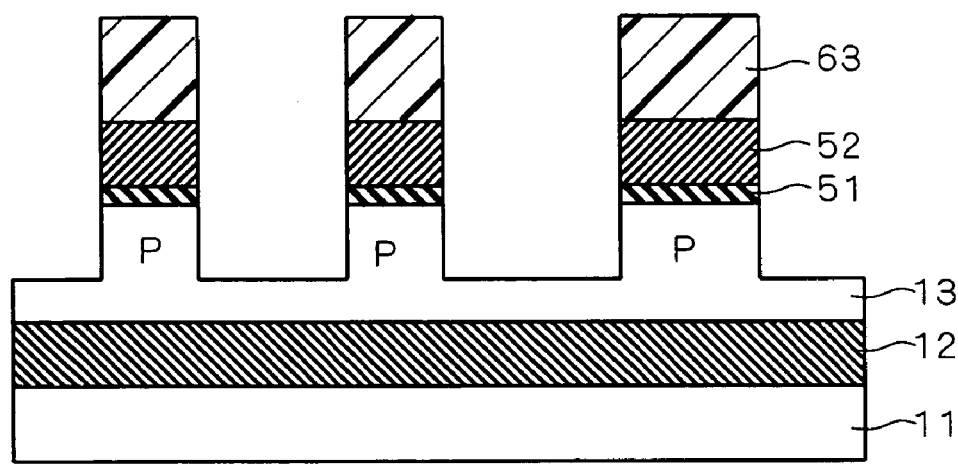
FIGS. 19A through 27B illustrate steps of manufacturing the SRAM cells according to the second preferred embodiment.
Figure 19B:
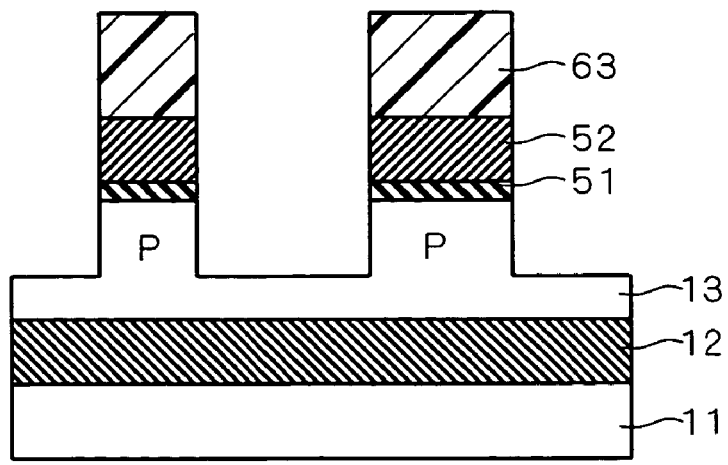

Thereafter a resist film 63 having openings above regions for forming active regions 21 to 24 and the active regions 61 and 62 is formed on the SOI substrate. The resist film 63 is employed as a mask for etching the silicon nitride film 52, the silicon oxide film 51 and the SOI layer 13 thereby patterning the same. This etching is stopped while leaving the bottom of the SOI layer 13 (FIGS. 19A and 19B).

Figure 20A:
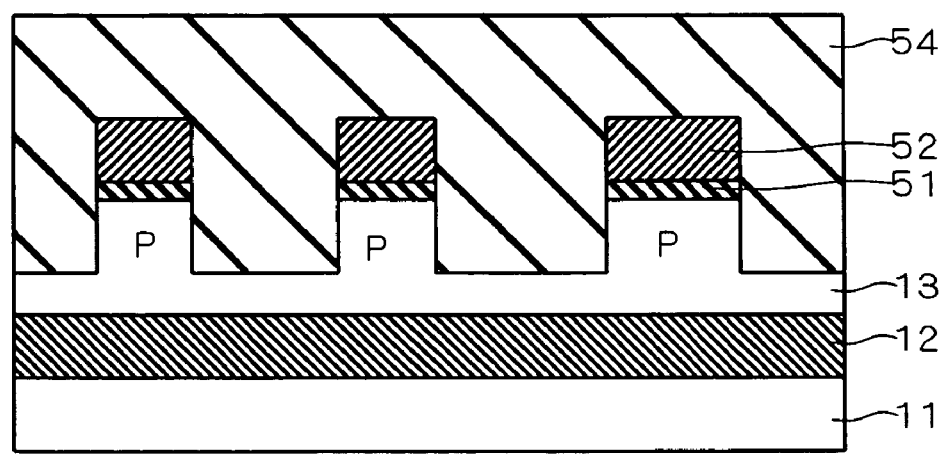
Figure 20B:
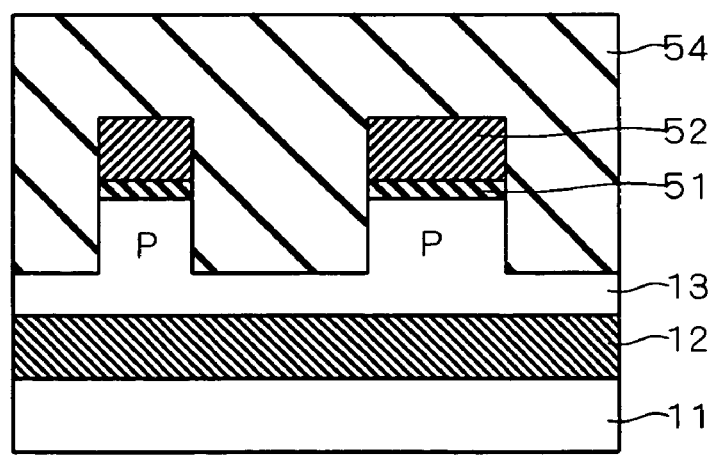
Figure 21A:
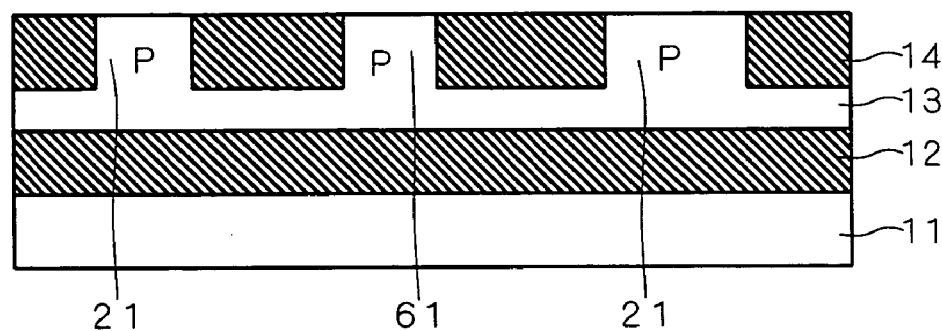
Figure 21B:
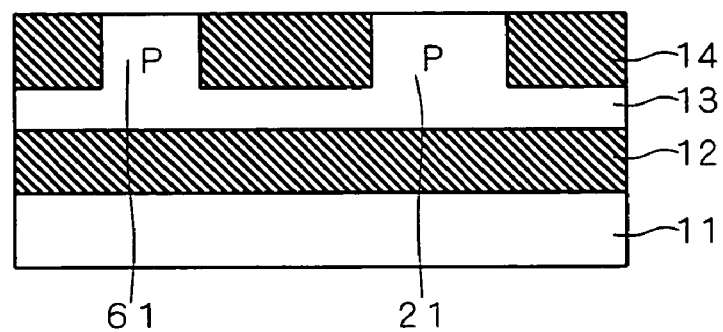

The resist film 63 is removed and another silicon oxide film 54 is formed on the overall surface (FIGS. 20A and 20B). The upper surface of the silicon oxide film 52 is flattened by CMP, followed by removal of the silicon nitride film 52 and the silicon oxide film 51. Consequently, the silicon oxide film 54 remaining in recess portions of the SOI layer 13 form the element isolation insulating film 14, while regions (projecting portions of the SOI layer 13) therebetween form the active regions 21 to 24, 61 and 62 (FIGS. 21A and 21B).

Figure 22A:
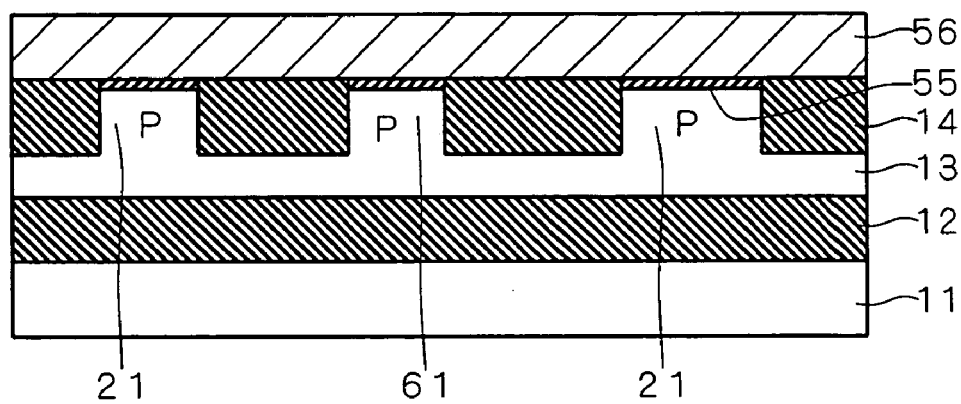
Figure 22B:
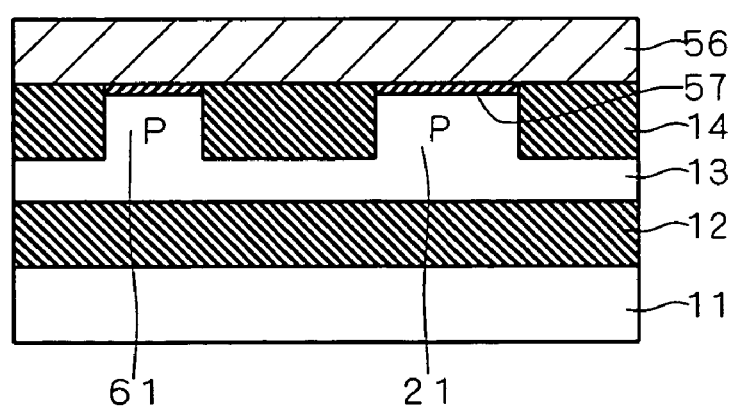

Ions are implanted into the active regions 21 to 24 for forming channel regions. Conditions for this ion implantation may be similar to those in the step of forming the channel regions in the first preferred embodiment. Then, thermal oxide films 55 are formed on the upper surfaces of the active regions 21 to 24, 61 and 62 by thermal oxidation, followed by formation of a polysilicon film 56 on the overall surface (FIGS. 22A and 22B).

Figure 23A:
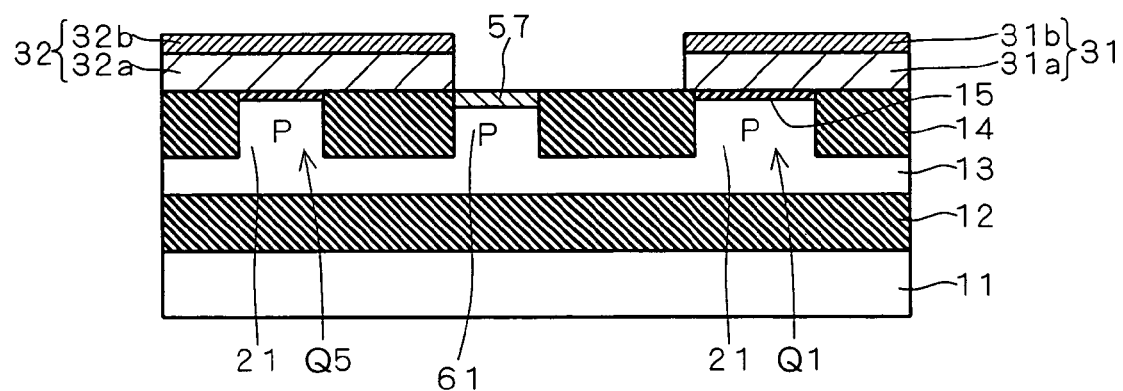
Figure 23B:
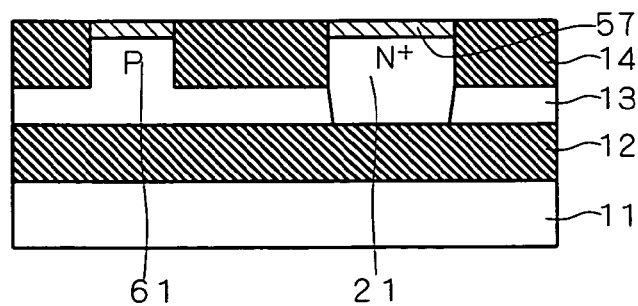

The thermal oxide films 55 and the polysilicon film 56 are patterned for forming a gate oxide film 15 and gate electrodes 31 to 34. Thereafter ions are implanted for forming source/drain regions of the transistors Q1 to Q6. Conditions for this ion implantation may be similar to those in the step of forming the source/drain regions in the first preferred embodiment. Further, upper portions of the source/drain regions of the transistors Q1 to Q4 and the fifth and sixth active regions 61 and 62 are silicified. Thus, silicide layers 57 are formed on the upper portions of the source/drain regions of the active regions 21 to 24 and the fifth and sixth active regions 61 and 62, and the respective gate electrodes 31 to 34 have two-layer structures of polysilicon layers and silicide layers (FIGS. 23A and 23B).

The gate electrodes 31 to 34 serve as masks in the ion implantation for forming the source/drain regions. Therefore, no source/drains are formed on the regions of the SOI layer 13 located under the gate electrodes 31 to 34 but these regions form the body regions.

Figure 24A:
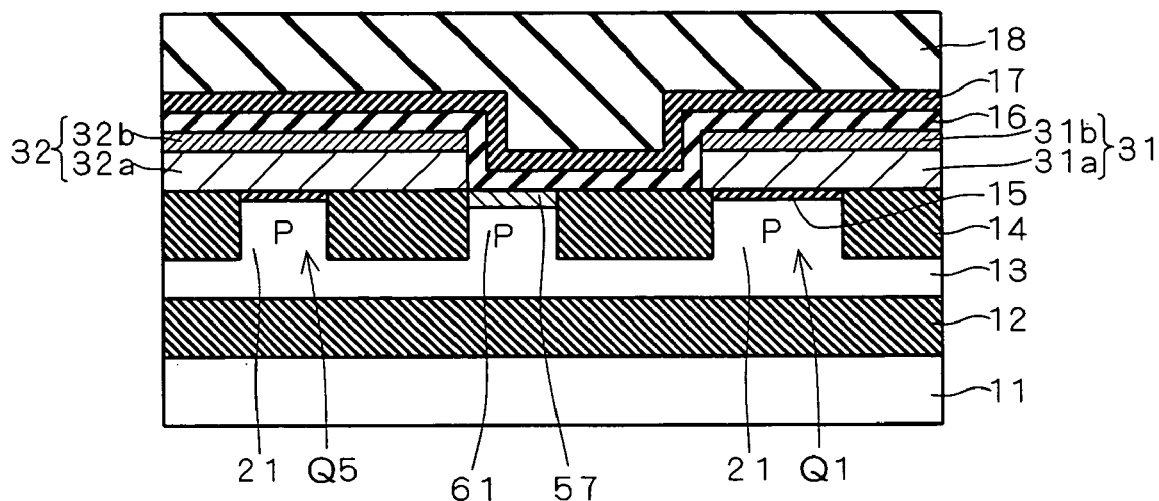
Figure 24B:
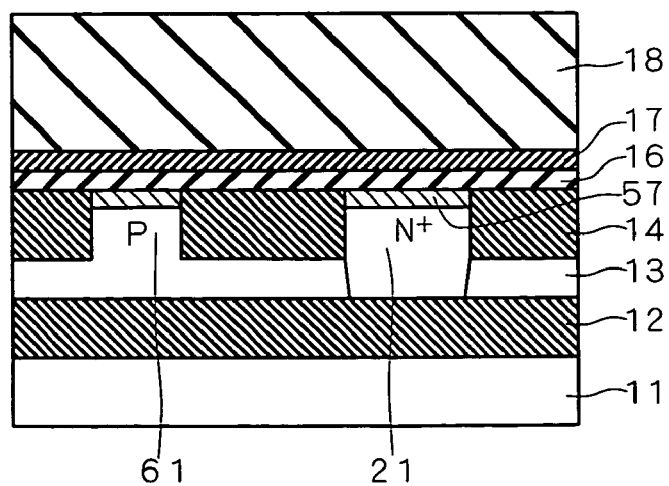

Thereafter the silicon oxide film 16, the silicon nitride film 17 and the silicon oxide film 18 are formed on the overall surface (FIGS. 24A and 24B). A resist film 64 having openings above regions for forming contacts 35 to 46 is formed on the silicon oxide film 18 and employed as a mask for etching the silicon oxide film 18 through the silicon nitride film 17 serving as an etching stopper. Exposed portions of the silicon oxide films 18 and 16 are successively etched for forming contact holes 42a and 45a reaching the active regions 21 to 24, 61 and 62 and the gate electrodes 31 to 34 (FIGS. 25A and 25B).

Figure 25A:
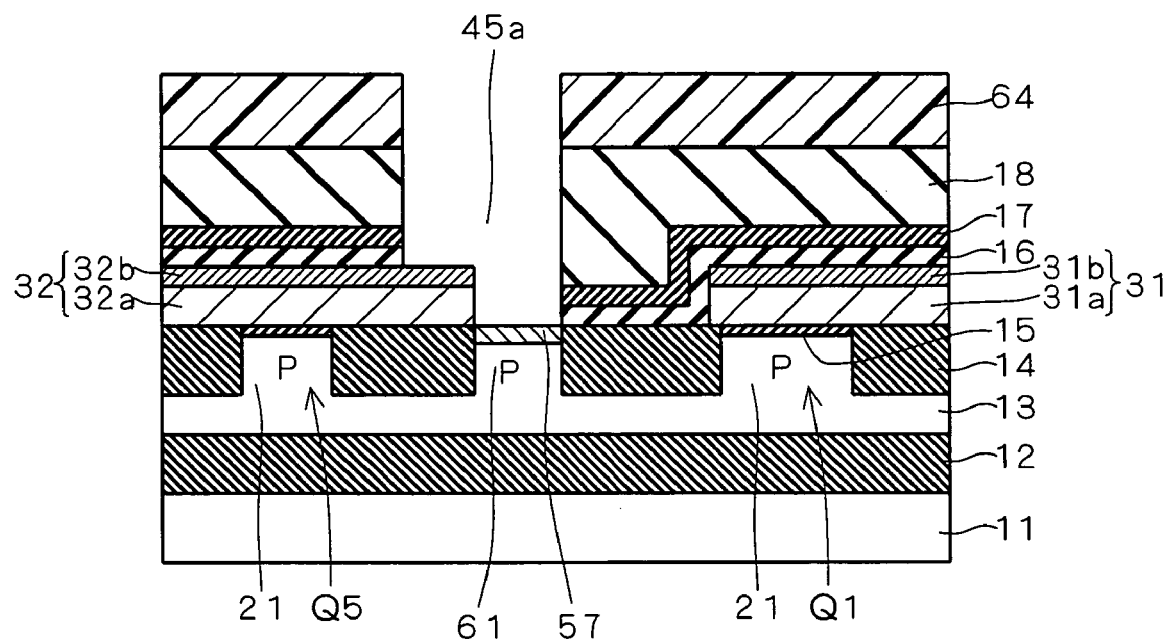
Figure 25B:
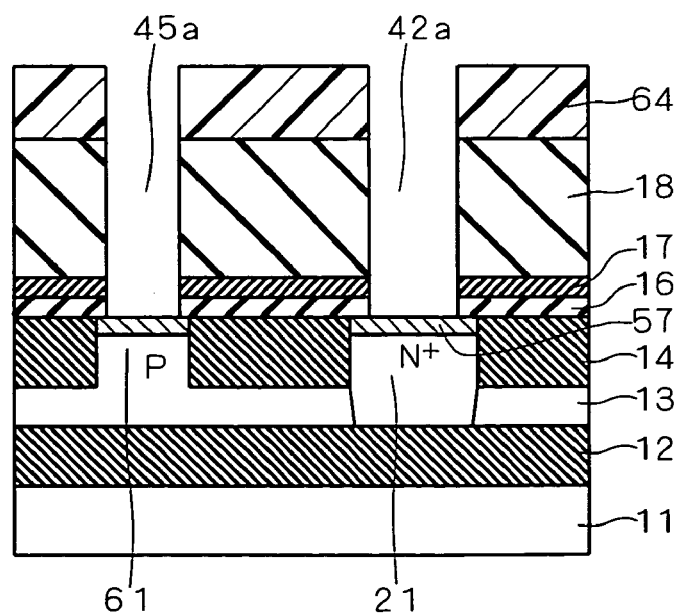
Figure 26A:
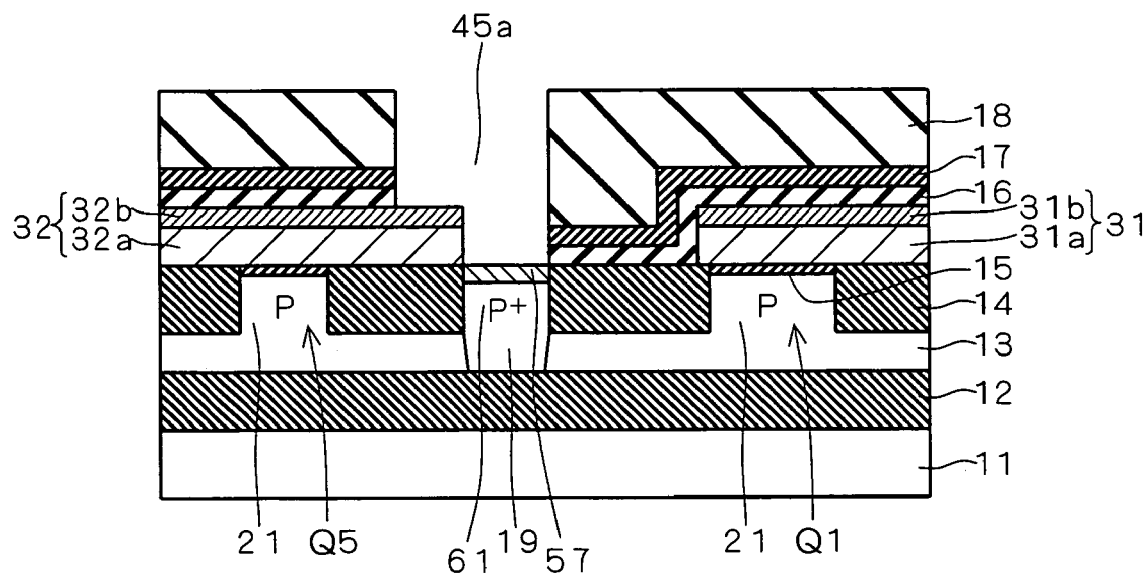
Figure 26B:
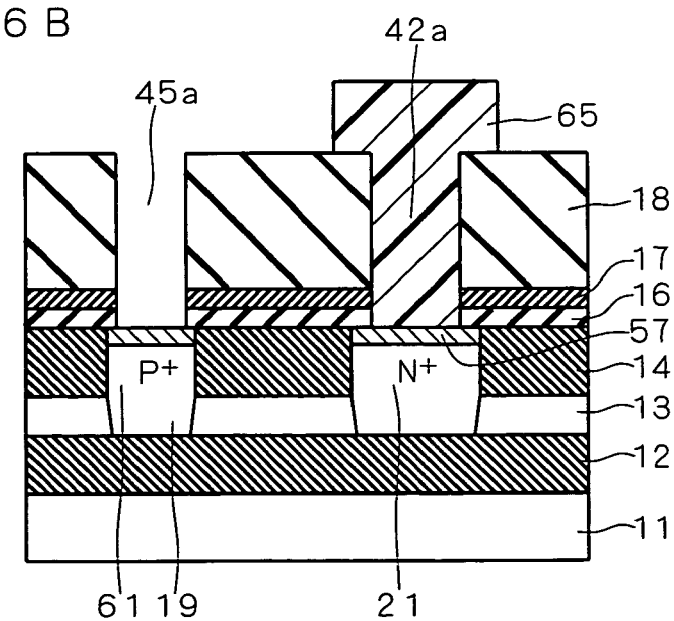

Then, a resist film 65 is formed to fill up that (the contact hole 42a shown in FIG. 25B, for example) other than that (the contact hole 45a shown in FIGS. 25A and 25B, for example) for the contacts 45 and 46 among the contact holes 42a and 45a formed in the step shown in FIGS. 25A and 25B. The silicon oxide film 18 and the resist film 65 are employed as masks for forming the $P^+$ region 19 in the portions of the SOI layer 13 exposed in the contact hole 45a for the contacts 45 and 46 (FIGS. 26A and 26B).

Figure 27A:
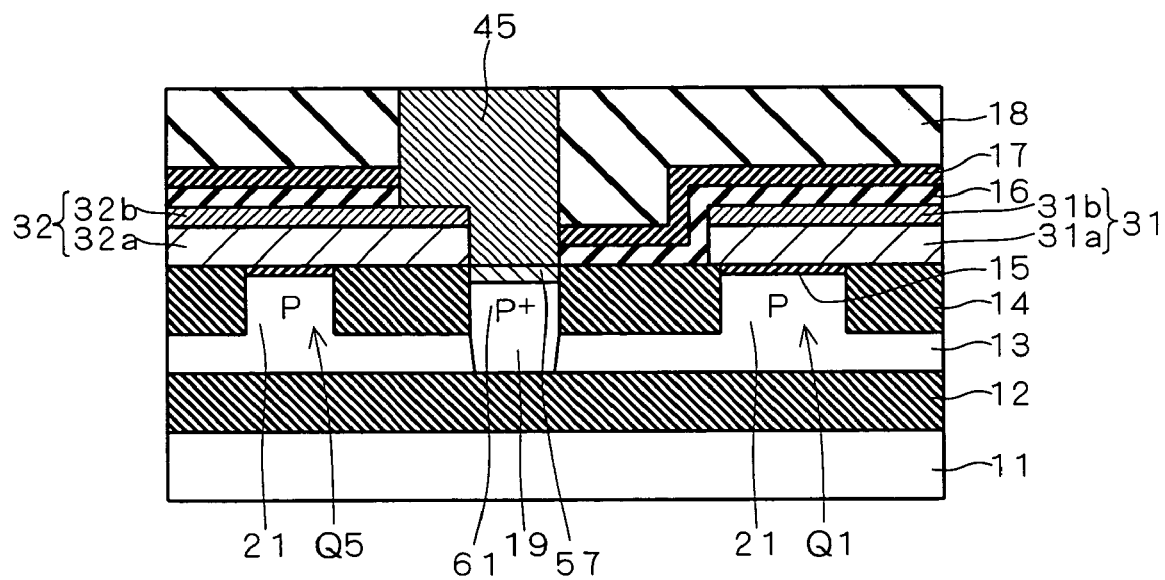
Figure 27B:
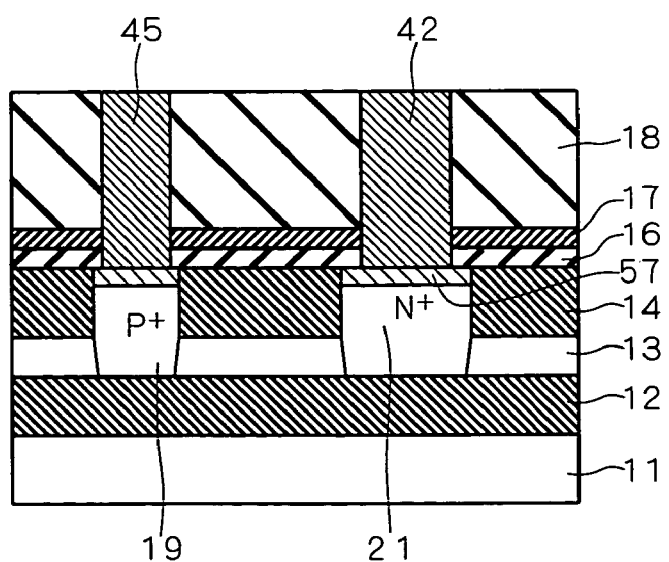

The resist film 65 is removed and a metal such as tungsten is embedded in the contact holes 42a and 45a thereby forming the contacts 35 to 46 (FIGS. 27A and 27B). Necessary wires such as bit lines and a word line connected to the contacts 35 to 46, an interlayer isolation film covering the same and the like are formed on the silicon oxide film 18, whereby the SRAM cell 1 according to the second preferred embodiment can be formed.

Comparing the steps of manufacturing the SRAM cells 1 according to the first and second preferred embodiments with each other, it is understood that the second preferred embodiment includes no steps corresponding to the steps described with reference to FIGS. 12A to 14B in relation to the first preferred embodiment (the steps of etching the element isolation insulating film 14 for making the contact hole 45a reach the SOI layer 13). In other words, the SRAM cell 1 according to the second preferred embodiment can be formed through a smaller number of steps than the first preferred embodiment.

While the specific ion implantation step is carried out in the second preferred embodiment for forming the P$^+$ region 19 in the fifth and sixth active regions 61 and 62 as described with reference to FIGS. 26A and 26B, the P$^+$ region 19 may alternatively be formed through the ion implantation for forming the source/drain regions of the load transistors Q3 and Q4. In other words, the P$^+$ region 19 can be formed simultaneously with the source/drain regions of the load transistors Q3 and Q4 through a mask pattern having openings not only above the third and fourth active regions 23 and 24 but also above the fifth and sixth active regions 61 and 62 in the ion implantation for forming the source/drain regions of the load transistors Q3 and Q4. Thus, the ion implantation step shown in FIGS. 26A and 26B can be so omitted as to further simplify the process.

Third Preferred Embodiment

In an SRAM cell 1 according to a third preferred embodiment of the present invention, the DTMOS technique is applied to load transistors Q3 and Q4. FIG. 28 is a top plan view of the SRAM cell 1 according to the third preferred embodiment. Also referring to FIG. 28, elements having functions similar to those of the elements shown in FIG. 2 are denoted by the same reference numerals. The SRAM cell 1 according to the third preferred embodiment has an N-type seventh active region 67 joined to a third active region 23 and an N-type eighth active region 68 joined to a fourth active region 24. The seventh and eighth active regions 67 and 68 are N$^+$ regions having higher impurity concentrations than the remaining portions of the remaining N well regions.

Figure 29A:
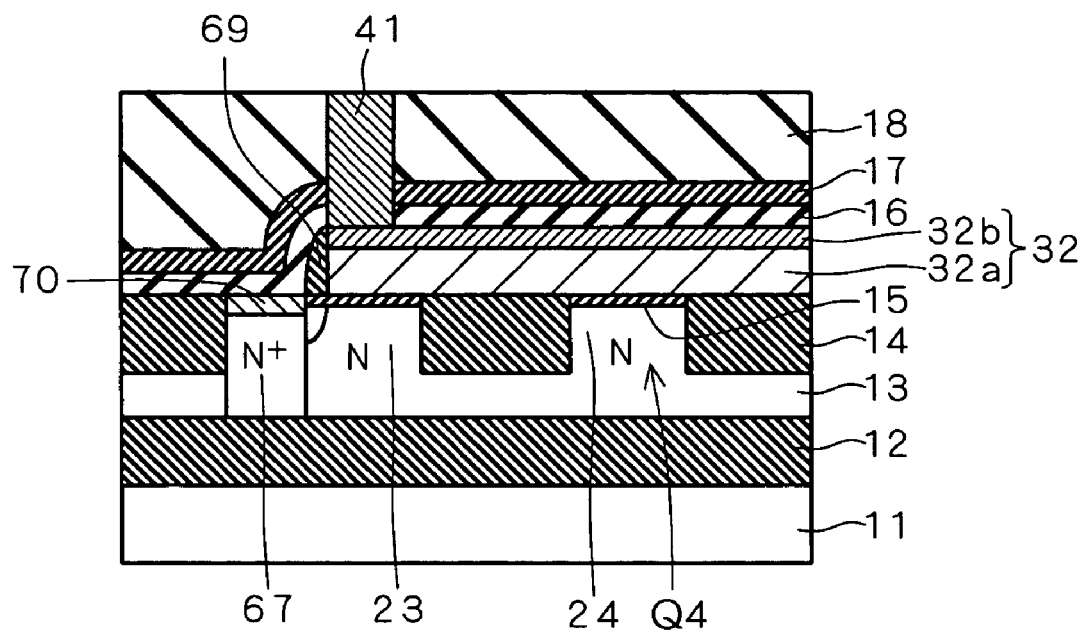
Figure 29B:
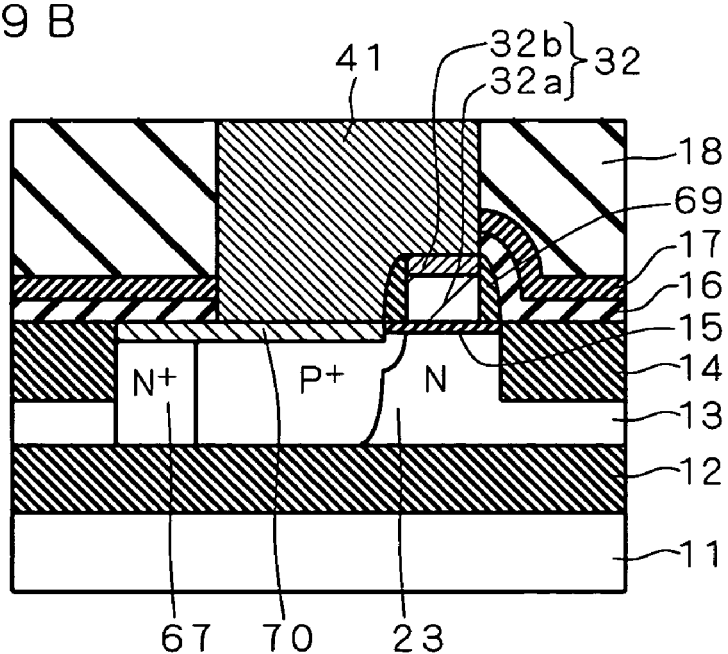

FIGS. 29A and 29B are sectional views of a second load transistor Q4 in the SRAM cell 1 taken along the lines E-E and F-F in FIG. 28 respectively. A first load transistor Q3 is similar in structure to the second load transistor Q4, and hence redundant description is omitted.

As shown in FIG. 29A, the seventh active region 67 is electrically connected to an N-type region located under a second gate electrode 32 of the third active region 23 (the second gate electrode 32 has a two-layer structure of a polysilicon layer 32a and a silicide layer 32b). The bottom of an element isolation insulating film 14 does not reach a BOX layer 12. Therefore, N-type regions of the third and fourth active regions 23 and 24 located under the second gate electrode 32 are electrically connected with each other through the portion of the SOI layer 13 (N well region) located under the element isolation insulating film 14. The region of the fourth active region 24 located under the second gate electrode 32 is a body region of the second load transistor Q4. Therefore, the seventh active region 67 is electrically connected to the body region of the second load transistor Q4.

As shown in FIG. 29B, an integral silicide layer 70 is formed on the upper portions of the seventh active region 67 and a P-type region (drain region of the first load transistor Q3) of the third active region 23. A contact 41 is formed to extend over a second gate electrode 32 and side walls 69 (silicon oxide films), to be connected to the second gate electrode 32 as well as to the silicide layer 70. The silicide layer 70 is formed in linkage with the seventh active region 67 and the drain region of the first load transistor Q3, whereby it follows that the second gate electrode 32 is electrically connected to both of the seventh active region 67 and the drain region of the first load transistor Q3.

Figure 57:
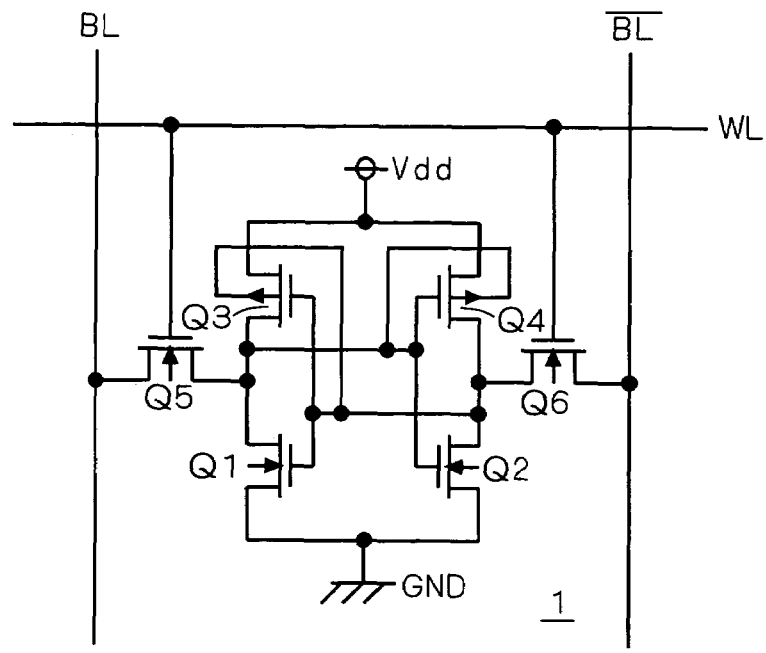
FIG. 57 illustrates an equivalent circuit of the SRAM cell according to the third preferred embodiment.

According to the aforementioned structure, it follows that the second gate electrode 32 is electrically connected to the body region of the second load transistor Q4 through the contact 41, the silicide layer 70, the N-type seventh active region 67 and the N-type region in the SOI layer 13. In other words, the second load transistor Q4 is in the so-called DTMOS structure having a gate electrode and a body region electrically connected with each other. The first load transistor Q3 also has a similar DTMOS structure (not shown). FIG. 57 shows an equivalent circuit of the SRAM cell 1 according to the third preferred embodiment. Consequently, the load transistors Q3 and Q4 is so improved in current driving capability as to attain an effect of improving a static noise margin of an SRAM.

As compared with the conventional SRAM cell, no specific contact may be separately formed for electrically connecting the gate electrodes and the body regions of the load transistors Q3 and Q4. Thus, the DTMOS structure can be applied to the load transistors Q3 and Q4 while suppressing increase of a forming area.

Further, the seventh active region 67 is an N$^+$ region having a higher impurity concentration than the remaining portions of the remaining N well regions, whereby a voltage drop is suppressed in the seventh active region 67. Therefore, the effect of improving current driving capability in the first and second load transistors Q3 and Q4 is efficiently attained.

Fourth Preferred Embodiment

In order to reduce power consumption and improve operational reliability of a semiconductor memory device, it is important to suppress a leakage current generated in each transistor constituting each memory cell. When the DTMOS structure is applied to the driver transistors Q1 and Q2 and the access transistors Q5 to Q6 as in each of the first and second preferred embodiments, for example, the potentials of the first and second P well regions formed with these transistors Q1, Q2, Q5 and Q6 tend to increase beyond the potential of the N well region formed with the load transistors Q3 and Q4. In this case, P-N junction isolation between the first and second P well regions and the N well region is forward biased to generate a leakage current while isolation between the driver transistors Q1 and Q2 and the access transistors Q5 and Q6 and the load transistors Q3 and Q4 cannot be achieved.

In general, an SRAM has a plurality of SRAM cells, connected to the same bit lines, which are arranged along the extensional direction of the bit lines. In this case, a leakage current is readily generated through P well regions between driver transistors Q1 and Q2 and access transistors Q5 and Q6 of a certain cell and those of another cell adjacent thereto along the extensional direction (vertical direction in FIG. 30) of the bit lines. A technique for suppressing these problems is proposed in a fourth preferred embodiment of the present invention.

Figure 31A:
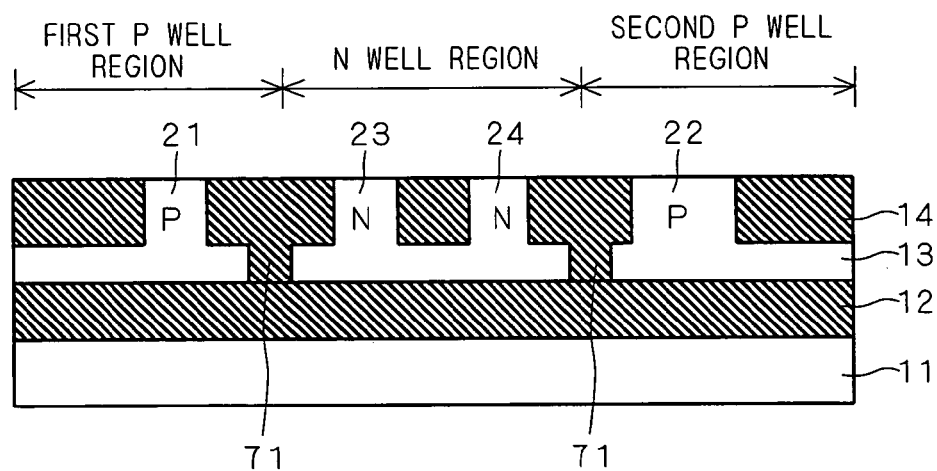
Figure 31B:
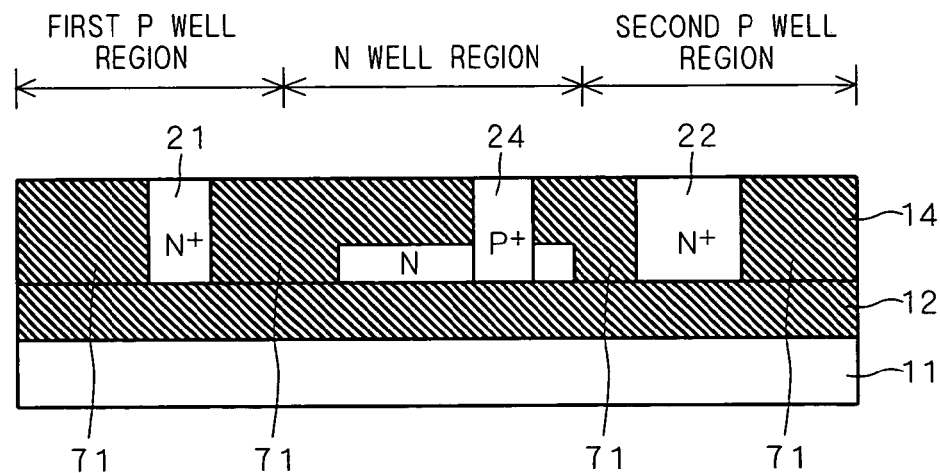

FIGS. 30, 31A and 31B illustrate the structure of an SRAM cell 1 according to the fourth preferred embodiment. FIGS. 31A and 31B are sectional views taken along the lines G-G and H-H in FIG. 30 respectively. Also referring to FIGS. 30, 31A and 31B, elements having functions similar to those of the elements shown in FIGS. 2 and 3 are denoted by the same reference numerals. For the purpose of simplification, FIGS. 31A and 31B omit illustration of gate electrodes 21 to 24 and contacts 35 to 46. The bottom of an element isolation insulating film 14 reaches a BOX layer 12 in regions 71 shown by slant lines in FIG. 30, and an SOI layer 13 is completely isolated in the regions 71. In other words, the regions 71 are the so-called complete isolation regions.

The complete isolation regions 71 are arranged between a first driver transistor Q1 and a first access transistor Q5 and load transistors Q3 and Q4 and between a second driver transistor Q2 and a second access transistor Q6 and the load transistors Q3 and Q4. Thus, P well regions formed with the driver transistors Q1 and Q2 and the access transistors Q5 and Q6 and an N well region formed with the load transistors Q3 and Q4 are isolated from each other. As shown in FIGS. 31A and 31B, the complete isolation regions 71 completely isolate the first and third active regions 21 and 23 and the second and fourth active regions 22 and 24 from each other.

The complete isolation regions 71 are also arranged in the vicinity of the boundary between the driver transistors Q1 and Q2 and the access transistors Q5 and Q6 and those of a cell adjacent in the vertical direction of FIG. 30 (the extensional direction of bit lines). As shown in FIG. 31B, no P-type regions (P well regions) are present in the sections of first and second well regions taken along the line H-H. In other words, the complete isolation regions 71 completely isolate the P well regions formed with the driver transistors Q1 and Q2 and the access transistors Q5 and Q6 from those of the cell adjacent in the extensional direction of the bit lines.

According to the aforementioned structure, generation of a leakage current is so suppressed between the first and second P well regions and the N well region that highly reliable isolation can be achieved therebetween. Further, a leakage current between the driver transistors Q1 and Q2 and the access transistors Q5 and Q6 and those of the cell adjacent in the extensional direction of the bit lines is also suppressed.

Fifth Preferred Embodiment

When the DTMOS structure is applied to the load transistors Q3 and Q4 as in the third preferred embodiment, a leakage current is readily generated therebetween through the N well region. When SRAM cells connected to the same bit lines are arranged along the extensional direction of the bit lines, a leakage current is readily generated through N well regions between load transistors of a certain cell and those of another cell adjacent thereto in the extensional direction of the bit lines. A technique for solving these problems is proposed in a fifth preferred embodiment of the present invention.

Figure 32:
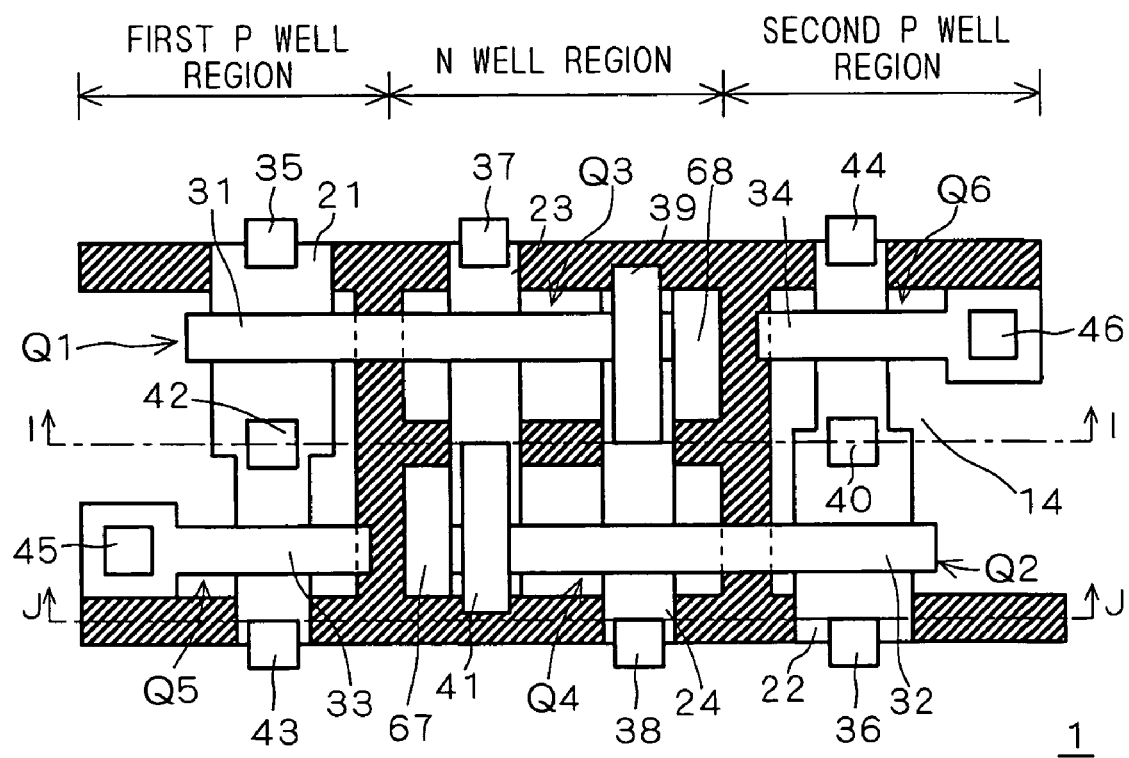
FIGS. 32, 33A and 33B illustrate the structure of an SRAM cell according to a fifth preferred embodiment of the present invention.
Figure 33A:
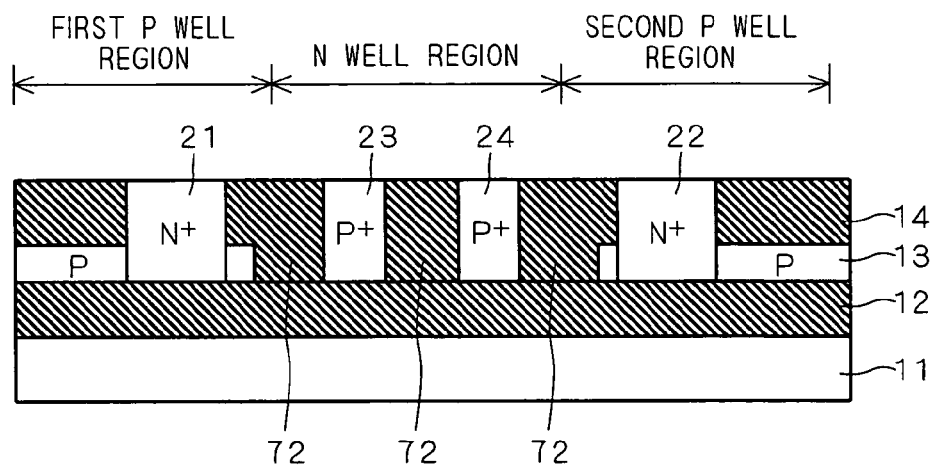
Figure 33B:
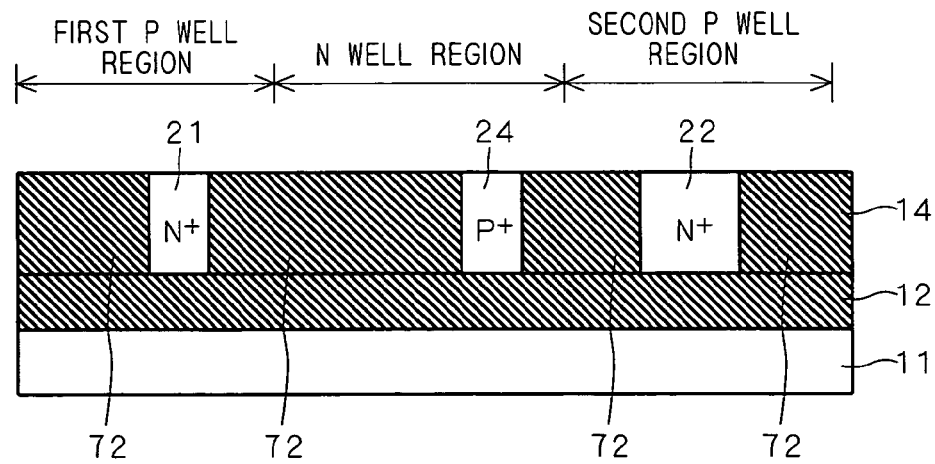

FIGS. 32, 33A and 33B illustrate the structure of an SRAM cell 1 according to the fifth preferred embodiment. FIGS. 33A and 33B are sectional views taken along the lines I-I and J-J in FIG. 32 respectively. Also referring to FIGS. 32, 33A and 33B, elements having functions similar to those of the elements shown in FIGS. 28, 29A and 29B are denoted by the same reference numerals. For the purpose of simplification, FIGS. 33A and 33B omit illustration of gate electrodes 21 to 24 and contacts 35 to 46.

According to the fifth preferred embodiment, complete isolation regions 72 are arranged also between first and second load transistors Q3 and Q4 and between these load transistors Q3 and Q4 and those of other SRAM cells adjacent in the extensional direction of bit lines (the upper side of the first load transistor Q3 and the lower side of the second load transistor Q4 in FIG. 32) in addition to those corresponding to the regions formed with the complete isolation regions 71 in the fourth preferred embodiment. As shown in FIGS. 33A and 33B, no N-type region (N well region) is present on sections of an N well region taken along the lines I-I and J-J. In other words, the complete isolation regions 72 completely isolate portions of the N well region formed with the first and second load transistors Q3 and Q4 respectively from each other and the load transistors Q3 and Q4 of the SRAM cell 1 and those of the cells adjacent thereto from each other.

According to the aforementioned structure, generation of leakage currents is suppressed between the first and second load transistors Q3 and Q4 and between load transistors of a certain cell and those of cells adjacent thereto. The complete isolation regions 72 are also formed on the regions corresponding to those formed with the complete isolation regions 71 in the fourth preferred embodiment, whereby effects similar to those described with reference to the fourth preferred embodiment are attained also according to the fifth preferred embodiment, as a matter of course.

Sixth Preferred Embodiment

Figure 34:
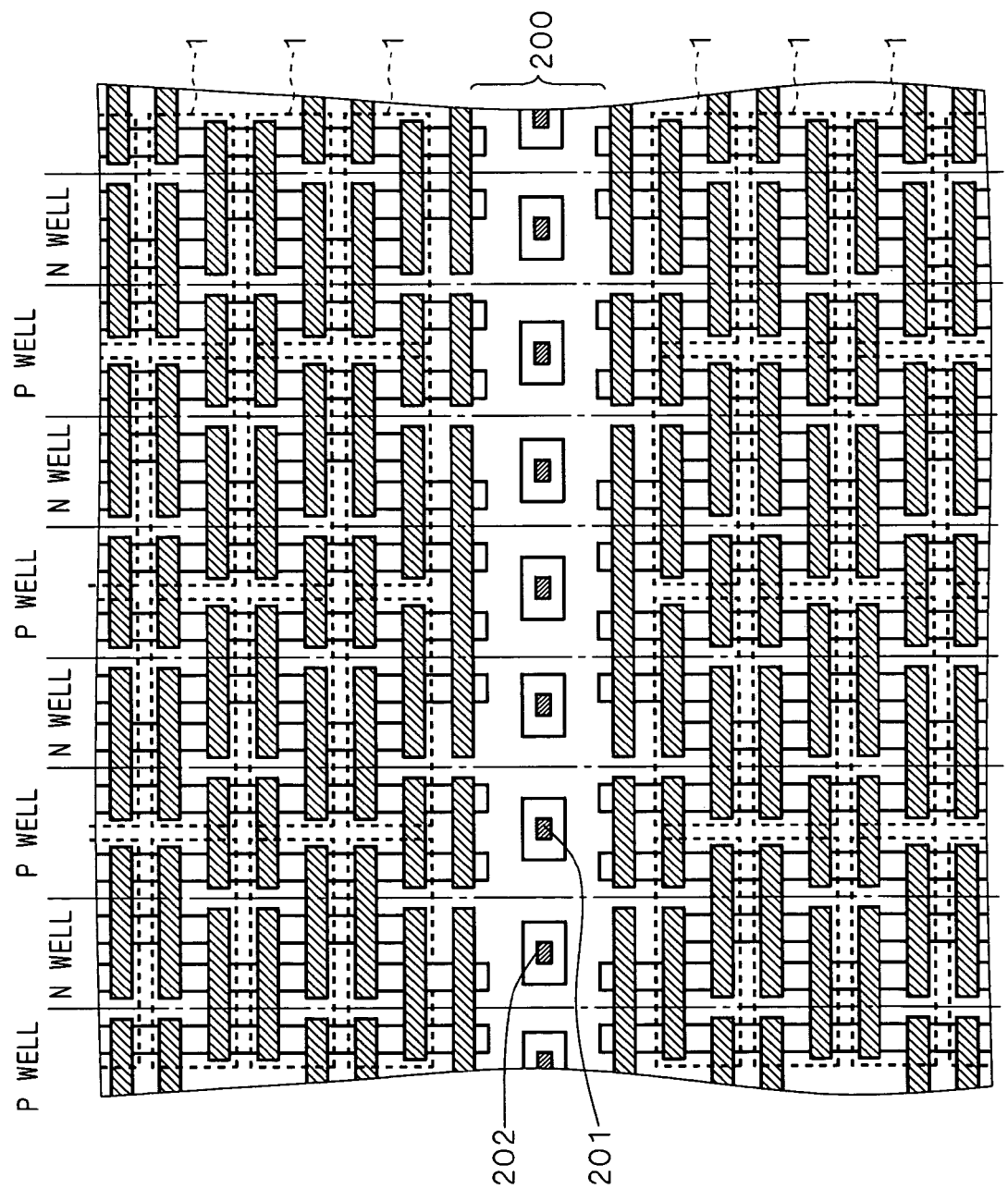
FIG. 34 illustrates the layout of an SRAM forming the background of the present invention.

FIG. 34 is a top plan view showing the layout of an SRAM forming the background of the present invention. Each of square regions shown by dotted lines in FIG. 34 corresponds to each SRAM cell 1. While a general SRAM has a large number of such SRAM cells 1, well potential fixing cells 200 for stabilizing potentials of P and N well regions are provided every several (e.g., 10) SRAM cells 1 in general, as shown in FIG. 34. The well potential fixing cells 200 are provided with ground contacts 201 and power supply contacts 202 with respect to the P and N well regions respectively. When the P and N well regions are fixed to a ground potential and a power supply potential respectively, body potentials of NMOS transistors (driver transistors Q1 and Q2 and access transistors Q5 and Q6) are fixed to the ground potential and those of PMOS transistors (load transistors Q3 and Q4) are fixed to the power supply potential in the SRAM cells 1, whereby operations of the transistors Q1 to Q6 are stabilized to improve reliability of the SRAM cells 1. In particular, the driver transistors Q1 and Q2 and the access transistors Q5 and Q6 are remarkably influenced by a body floating effect, and hence the ground contacts 201 of the well potential fixing cells 200 are essential. When the well potential fixing cells 200 are provided, however, an area for forming the SRAM is increased to hinder miniaturization and high integration of the SRAM.

Figure 35:
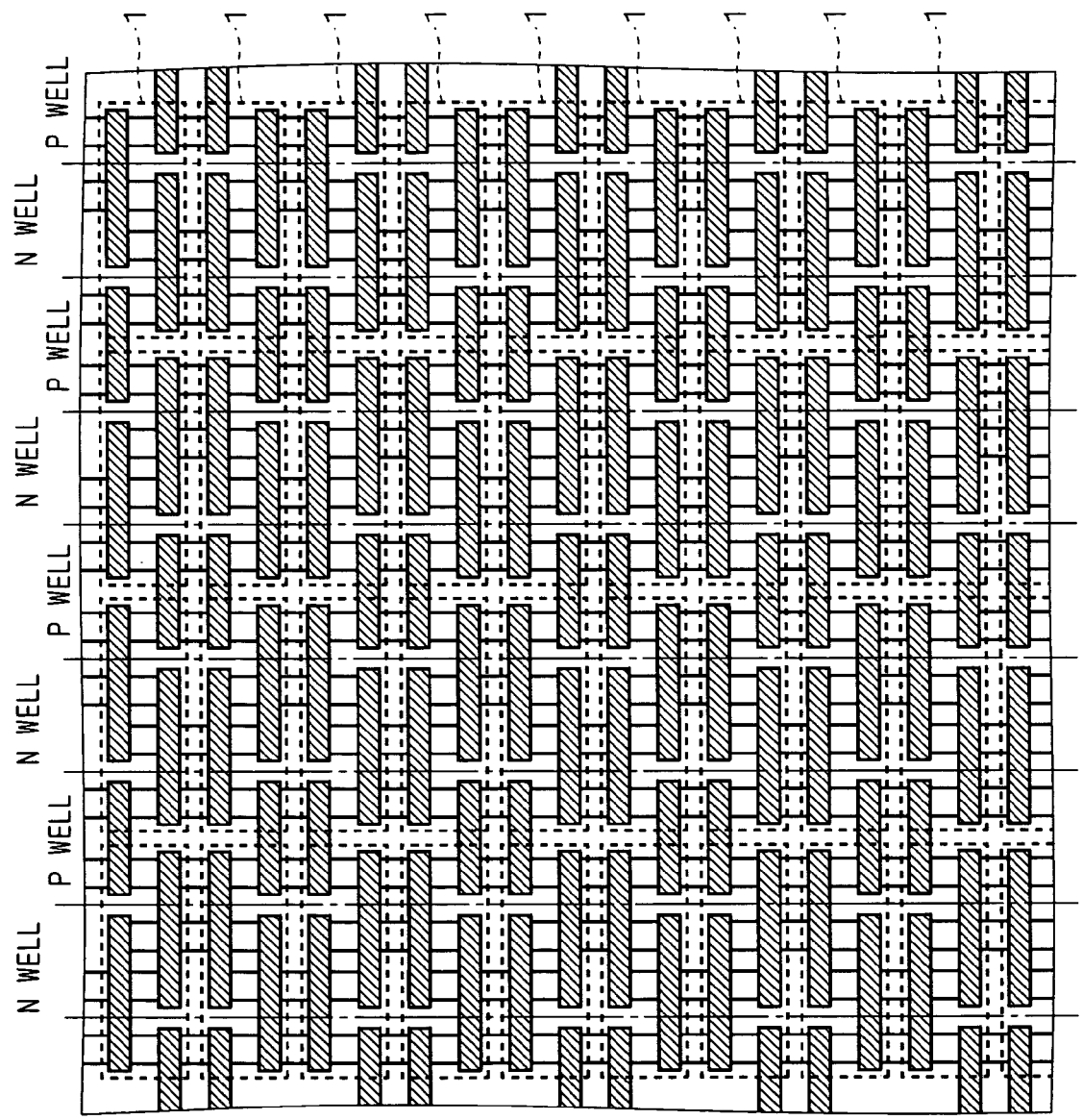
FIG. 35 illustrates the layout of SRAM cells according to a sixth preferred embodiment of the present invention.

FIG. 35 is a top plan view showing the layout of an SRAM according to a sixth preferred embodiment of the present invention. Referring to FIG. 35, each of square regions shown by dotted lines is an SRAM cell 1 similar to that according to the first or second preferred embodiment. As shown in FIG. 35, this SRAM is provided with no well potential fixing cells 200. In other words, FIG. 55 also shows an equivalent circuit of an SRAM cell 1 according to the sixth preferred embodiment.

As hereinabove described, the body regions of the driver transistors Q1 and Q2 and the access transistors Q5 and Q6 are electrically connected to the word line through the contact 45 in the SRAM cell 1 according to each of the first and second preferred embodiments. In other words, it follows that the potentials of the body regions, which have been fixed to a ground potential in general, fluctuate with the potential of the word line in each of the first and second preferred embodiments. According to this structure, the operating threshold voltages of the driver transistors Q1 and Q2 and the access transistors Q5 and Q6 can be reduced for improving the static noise margin only when the transistors Q2, Q2, Q5 and Q6 are in ON state. Therefore, operations of the driver transistors Q1 and Q2 are stabilized also when no well potential fixing cells 200 are provided as shown in FIG. 35.

According to the present invention, the static noise margin of each SRAM cell 1 is improved without providing the well potential fixing cells 200, whereby reliability of the SRAM can be improved to be miniaturized and highly integrated.

While body potentials of SRAM cells 1 arranged on positions separate from the well potential fixing cells 200 are readily unstabilized in the conventional structure shown in FIG. 34, each SRAM cell 1 according to each of the first and second preferred embodiments has the contacts (body contacts) connected to the body regions, whereby operations of all SRAM cells 1 can be stabilized. Also when the complete isolation regions 71 are formed between the SRAM cells 1 in order to suppress generation of leakage currents, the body potentials of the SRAM cells 1 are prevented from unstabilization.

Load transistors Q3 and Q4 are relatively less influenced by the body floating effect and hence no problem generally arises also when the body potentials thereof are not fixed. When the third preferred embodiment is applied to the load transistors Q3 and Q4, however, current driving capability of the load transistors Q3 and Q4 is improved to further improve the static noise margin of the SRAM.

Seventh Preferred Embodiment

The structure of an SRAM cell 1 capable of further reducing an area for forming an SRAM according to the present invention is described with reference to a seventh preferred embodiment of the present invention. FIG. 36 illustrates the structure of the SRAM cell 1 according to the seventh preferred embodiment. Also referring to FIG. 36, elements having functions similar to those of the elements shown in FIG. 2 are denoted by the same reference numerals, and hence redundant description is omitted.

As shown in FIG. 36, drain regions of a first driver transistor Q1 and a first load transistor Q3 are liked with each other through an SOI layer (in a portion denoted by reference numeral 75), and a silicide layer (not shown) is integrally formed on the upper portion thereof. Thus, the drain regions of the first driver transistor Q1 and the first load transistor Q3 are electrically connected with each other through the silicide layer provided on the upper portion of the SOI layer. In other words, the silicide layer provided on the upper portion of the SOI layer functions as a wire 75 connecting the drain regions of the first driver transistor Q1 and the first load transistor Q3 with each other.

As hereinabove described, it is necessary to connect the contacts 42 and 41 provided on the drain regions of the first driver transistor Q1 and the first load transistor Q3 with each other through the upper wire (not shown) in the first preferred embodiment (FIG. 2), for example. According to the seventh preferred embodiment, on the other hand, the drain regions of the first driver transistor Q1 and the first load transistor Q3 are connected with each other through the wire 75 of the silicide layer provided on the upper portion of the SOI layer, whereby no contact 42 may be formed and an alignment margin for such a contact 42 can be omitted so that the area for forming the SRAM cell 1 can be reduced.

In particular, the interval between the first driver transistor Q1 and a first access transistor Q5 can be so narrowed that a contact 45 serving as a body contact and the first driver transistor Q1 can be approached to each other. Thus, operations of the first driver transistor Q1 are further stabilized.

A contact 41 for connecting the drain region of the first load transistor Q3 and a second gate electrode 32 cannot be omitted in this example. However, the contact 41 requires no precise alignment as compared with the contact 42 requiring isolation from gate electrodes 31 and 33, and hence a margin thereof may be reduced to hardly hinder reduction of the area for forming the SRAM cell 1.

Drain regions of a second driver transistor Q2 and a second load transistor Q4 are also joined with each other through an SOI layer (in a portion denoted by reference numeral 76) and a silicide layer functioning as a wire is integrally formed thereon. Thus, no contact 40 corresponding to that shown in FIG. 2 may be formed but the area for forming the SRAM cell 1 can be reduced.

According to the seventh preferred embodiment, as hereinabove described, the wires 75 and 76 of the silicide layers on the upper portions of the SOI layers are so provided that no contacts (corresponding to the contacts 40 and 42 shown in FIG. 2) may be formed on the drain regions of the driver transistors Q1 and Q2 and the area for forming the SRAM according to the present invention can be further reduced.

Eighth Preferred Embodiment

As hereinabove described, the load transistors Q3 and Q4 are relatively less influenced by the body floating effect and hence no problem generally arises also when the body potentials thereof are not fixed, while operations are further stabilized when the same are fixed to a power supply potential. According to an eighth preferred embodiment of the present invention, each SRAM cell 1 is provided with body contacts for fixing body potentials of load transistors Q3 and Q4 to a power supply potential.

Figure 37:
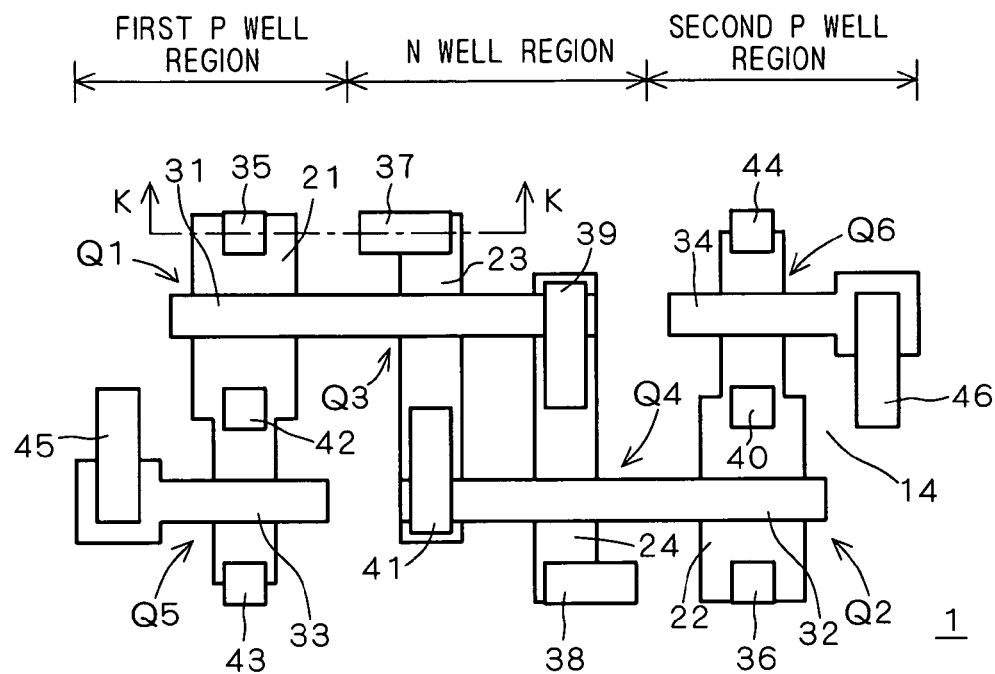
FIGS. 37 and 38 illustrate the structure of an SRAM cell according to an eighth preferred embodiment of the present invention.
Figure 38:
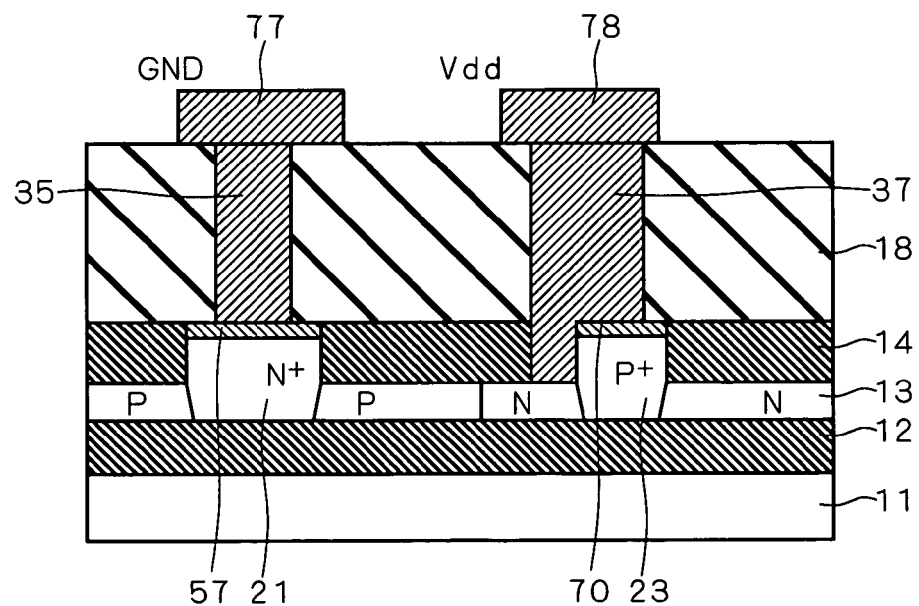

FIGS. 37 and 38 illustrate the structure of the SRAM cell 1 according to the eighth preferred embodiment. FIG. 38 is a sectional view taken along the line K-K in FIG. 37. Also referring to FIGS. 37 and 38, elements having functions similar to those of the elements shown in FIGS. 2 and 3 are denoted by the same reference numerals, and hence redundant description is omitted.

As described with reference to the first preferred embodiment, the contacts 35 and 36 provided on the source regions of the driver transistors Q1 and Q2 are connected to the ground wire respectively while the contacts 37 and 38 provided on the source regions of the load transistors Q3 and Q4 are connected to the power supply wire respectively. The eighth preferred embodiment is so constituted that contacts 37 and 38 are also electrically connected to body regions of load transistors Q3 and Q4.

Figure 58:
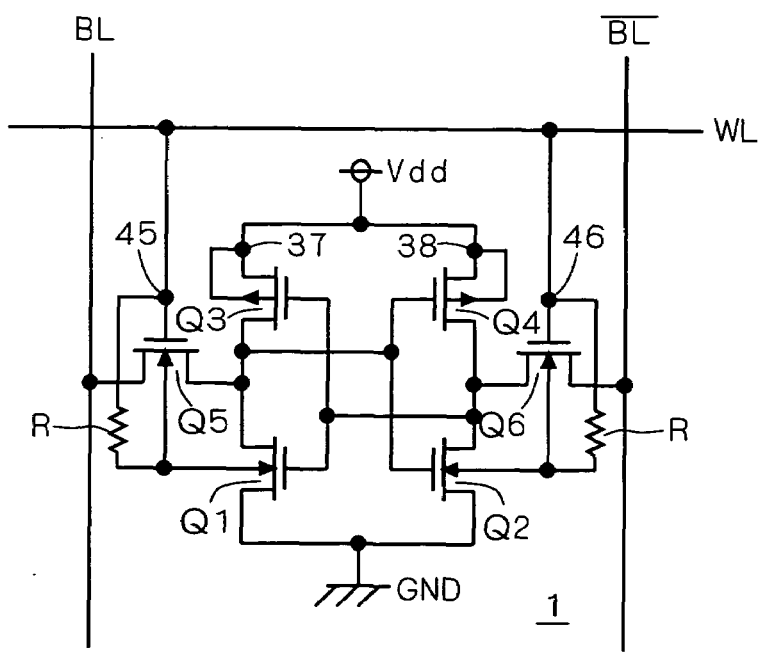
FIG. 58 illustrates an equivalent circuit of the SRAM cell according to the eighth preferred embodiment.

As shown in FIG. 38, a silicide layer 57 is formed on the upper surface of an N-type region of a first active region 21 forming a source region of a first driver transistor Q1, and a contact 35 connected to a ground wire 77 is formed thereon. Another silicide layer 70 is formed on the upper surface of a P-type region of a third active region 23 forming a source region of a first load transistor Q3, and the contact 37 connected to a power supply wire 78 is formed thereon. According to the eighth preferred embodiment, the contact 37 passes through an element isolation insulating film 14 to reach an SOI layer 13 (N well region) provided under the same. The N well region provided under the element isolation insulating film 14 is joined to body regions under gate electrodes 31 and 32 of the load transistors Q3 and Q4 (see FIG. 29A, for example), whereby it follows that the contact 37 is electrically connected to the body regions of the load transistors Q3 and Q4. The contact 38 also reaches the SOI layer 13 (N well region) provided under the element isolation insulating film 14 although this is not illustrated, to be electrically connected to the body regions of the load transistors Q3 and A4. FIG. 58 shows an equivalent circuit of the SRAM cell 1 according to the eighth preferred embodiment.

According to the eighth preferred embodiment, body potentials of the load transistors Q3 and Q4 are fixed to the power supply potential, thereby improving stability of operations of the SRAM cell 1. Further, the contacts 37 and 38 functioning as the body contacts for the load transistors Q3 and Q4 are provided on each SRAM cell 1 as shown in the equivalent circuit of FIG. 58, whereby no power supply contacts 202 of the well potential fixing cells 200 described with reference to FIG. 34 are necessary but the area for forming an SRAM can be reduced.

Figure 39:
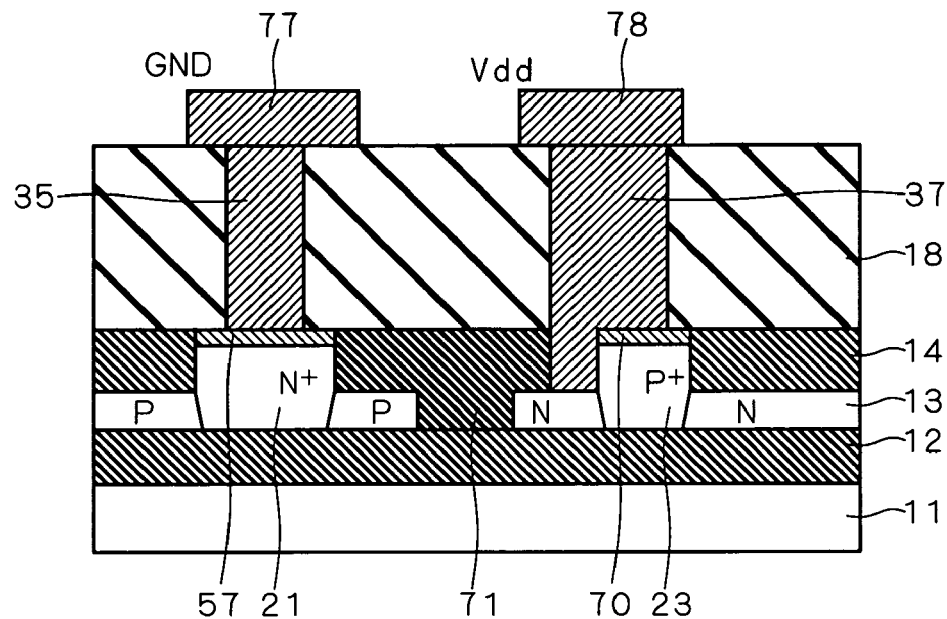
FIGS. 39 and 40 respectively illustrate modifications of the SRAM cell according to the eighth preferred embodiment.

While the element isolation insulating film 14 between first and second P well regions and an N well region of the SRAM cell 1 is formed only on the upper surface of an SOI layer 13 (the so-called "partial isolation") in FIG. 38, the fourth preferred embodiment may alternatively be applied for providing complete isolation regions 71 as shown in FIG. 39, for example. In this case, the distances between first to third active regions 21 to 23 and between second to fourth active regions 22 to 24 can be reduced while suppressing generation of leakage currents between the P well regions and the N well region, for further reducing the area for forming the SRAM.

Figure 40:
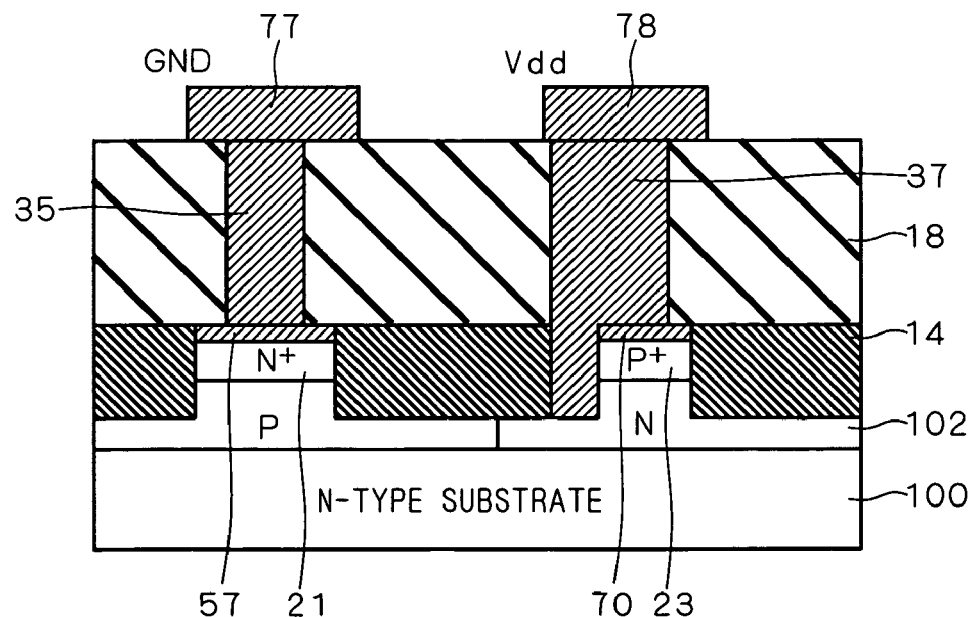

While the above description has been made with reference to an SRAM having an SOI structure, the eighth preferred embodiment is also applicable to an SRAM formed on a general bulk silicon substrate. In this case, it follows that a P well region 101 formed with a first active region 21 and an N well region 102 formed with a third active region 23 are formed on an N-type substrate 100, as shown in FIG. 40. Also in this case, effects similar to the above can be attained.

When the eighth preferred embodiment is applied to a bulk device, the depths of source/drain regions of MOS transistors (an N-type region in the first active region 21 and a P-type region in the third active region 23 in FIG. 40) are smaller than the depth of an element isolation insulating film 14 and hence the bottom surface of a contact 37 may not necessarily reach the N well region 102 provided under the element isolation insulating film 14 but may reach at least a position deeper than the P-type region in the third active region 23. If the P-type region in the third active region 23 is 0.1 μm in depth and the element isolation insulating film 14 is 0.3 μm in depth in FIG. 40, for example, the depth of the contact 37 may be about 0.15 μm, and the bottom surface of the contact 37 does not reach the N well region 102 in this case but it follows that side surfaces come into contact with the same, thereby ensuring electrical connection between the contact 37 and the N well region 102.

Ninth Preferred Embodiment

A technique different from that in the eighth preferred embodiment is proposed in a ninth preferred embodiment of the present invention as a technique of providing body contacts for fixing body potentials of load transistors Q3 and Q4 to a power supply potential on each SRAM cell 1.

Figure 41:
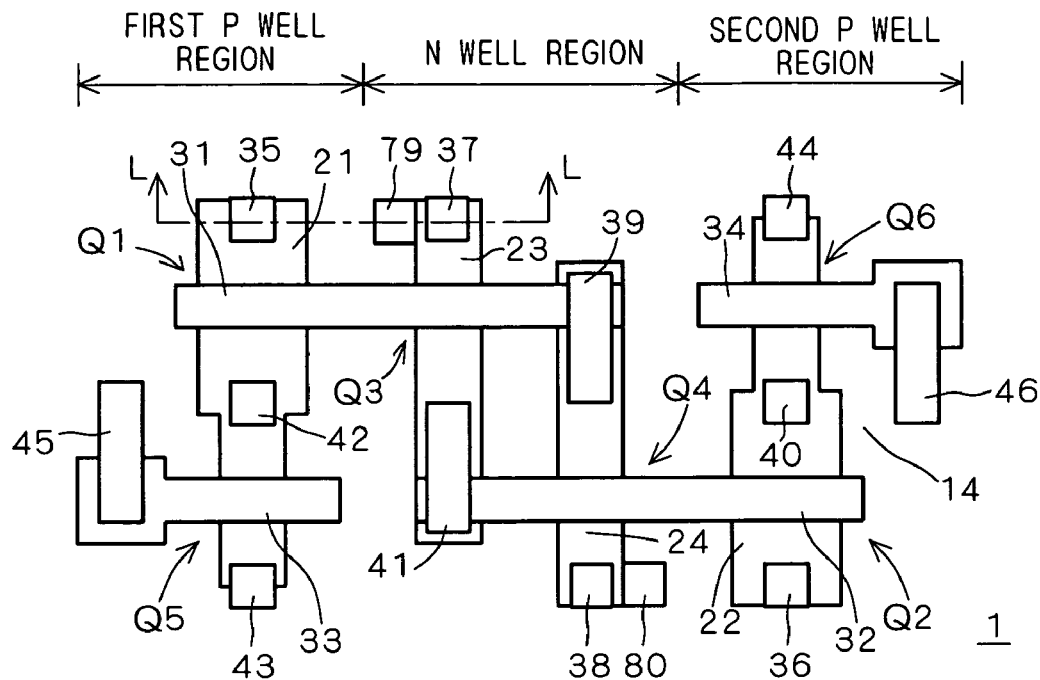
FIGS. 41 and 42 illustrate the structure of an SRAM cell according to a ninth preferred embodiment of the present invention.
Figure 42:
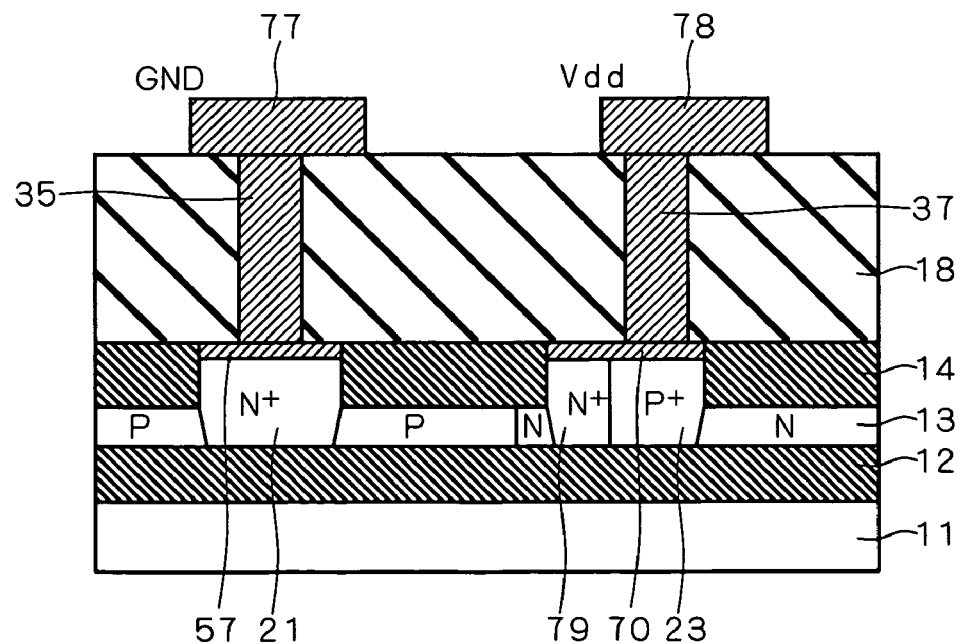

FIGS. 41 and 42 illustrate the structure of the SRAM cell 1 according to the ninth preferred embodiment. FIG. 42 is a sectional view taken along the line L-L in FIG. 41. Also referring to FIGS. 41 and 42, elements having functions similar to those of the elements shown in FIGS. 37 and 38 are denoted by the same reference numerals, and hence redundant description is omitted.

As shown in FIG. 41, the SRAM cell 1 according to the ninth preferred embodiment further has N-type ninth and tenth active regions 79 and 80 defined by an element isolation insulating film 14 in an N well region. The ninth and tenth active regions 79 and 80 are adjacent to source regions of first and second driver transistors Q1 and Q2 respectively.

As shown in FIG. 42, the N-type ninth active region 79 is joined to an N well SOI layer 13) provided under the element isolation insulating film 14. The SOI layer 13 provided under the element isolation insulating film 14 is joined to body regions of load transistors Q3 and Q4 located under gate electrodes 31 and 32, whereby the ninth active region 79 is electrically connected to the body regions of the load transistors Q3 and Q4. Further, the ninth active region 79 and a source region (P-type region in a third active region 23) of the first load transistor Q3 are joined with each other, and a silicide layer 70 of about 10 nm in thickness is integrally formed thereon (in order to integrally form the silicide layer 70 on the ninth active region 79 and the source region of the first load transistor Q3, at least upper portions of the two regions must be joined with each other). A contact 37 connected to a power supply wire 78 is formed on the silicide layer 70. As understood from FIG. 42, the contact 37 is electrically connected not only to the third active region 23 but also to the ninth active region 79 through the silicide layer 70. In other words, the contact 37 is electrically connected to the body regions of the load transistors Q3 and Q4 through the silicide layer 70, the ninth active region 79 and the SOI layer 13 (N well region).

The tenth active region 80 is also joined to the SOI layer 13 (N well region) provided under the element isolation insulating film 14 while a silicide layer is integrally formed on the tenth active region 80 and a fourth active region 24, although illustration is omitted. In other words, the contact 38 is also electrically connected to the body regions of the load transistors Q3 and Q4.

According to the ninth preferred embodiment, body potentials of the load transistors Q3 and Q4 are fixed to a power supply potential similarly to the eighth preferred embodiment, thereby stabilizing operations of the SRAM cell 1. Further, the ninth and tenth active regions 79 and 80 functioning as the body contacts for the load transistors Q3 and Q4 are provided on each SRAM cell 1, whereby no power supply contacts 202 of the well potential fixing cells 200 described with reference to FIG. 34 are necessary but an area for forming an SRAM can be reduced.

When the source regions of the load transistors Q3 and Q4 are 0.2 μm in width, for example, the ninth and tenth active regions 79 and 80 may be about 0.05 μm in width. When the impurity concentrations of the ninth and tenth active regions 79 and 80 are rendered higher than that of the element isolation insulating film 14, further, connection resistance with the contacts 37 and 38 can be reduced. If the impurity concentrations are at least $10^{18}/cm^3$, for example, ohmic contact with a metal is enabled.

Figure 43:
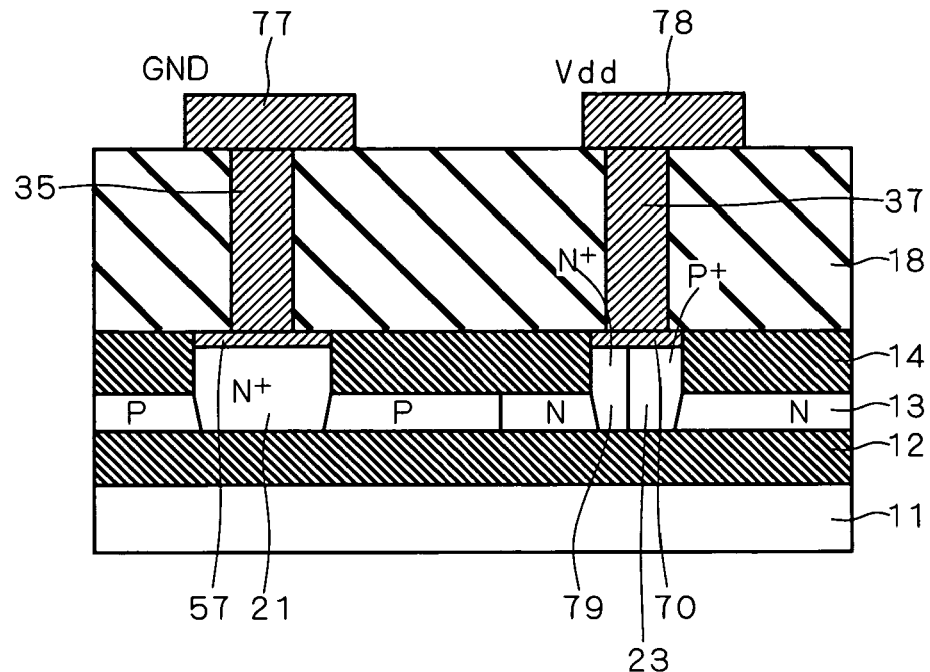
FIGS. 43 through 45 respectively illustrate modifications of the SRAM cell according to the ninth preferred embodiment.

The ninth active region 79, formed outside the third active region 23 in FIGS. 41 and 42, may alternatively be formed inside the third active region 23 as shown in FIG. 43, for example, for further reducing the area for forming the SRAM cell 1.

Figure 44:
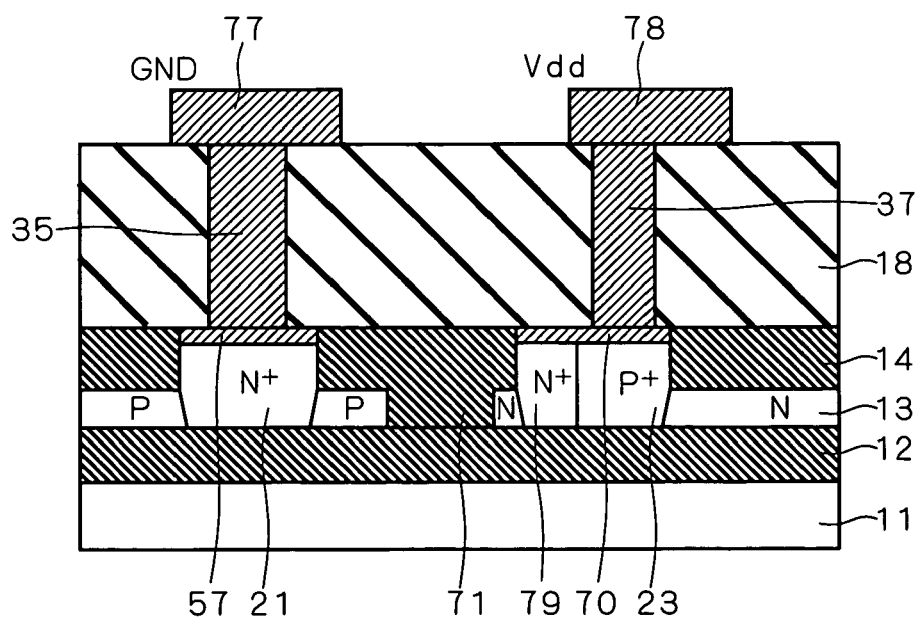

When the fourth preferred embodiment, for example, is applied also in the ninth preferred embodiment for providing a complete isolation region 71 as shown in FIG. 44, the distances between first to third active regions 21 to 23 and between second to fourth active regions 22 to 24 can be reduced while suppressing generation of leakage currents, for further reducing the area for forming the SRAM.

Figure 45:
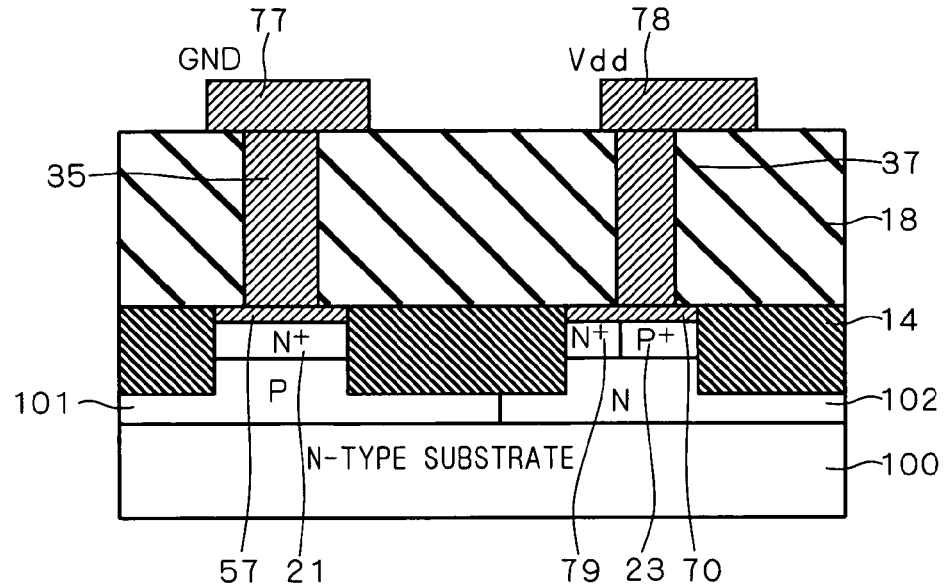

The ninth preferred embodiment is not restricted to an SRAM having an SOI structure either but is also applicable to an SRAM formed on a general bulk silicon substrate as shown in FIG. 45, for attaining effects similar to the above (elements similar to those in FIG. 40 are denoted by the same reference numerals in FIG. 45, and hence redundant description is omitted.

Tenth Preferred Embodiment

The body potentials of the driver transistors Q1 and Q2 and the access transistors Q5 and Q6 are set to the potential of the word line for stabilizing operations of the transistors Q1, Q2, Q5 and Q6 in each of the aforementioned preferred embodiments. According to a tenth preferred embodiment of the present invention, body potentials of driver transistors Q1 and Q2 and access transistors Q5 and Q6 are fixed to a ground potential for stabilizing operations. Further, body contacts therefor are provided on each SRAM cell 1.

Figure 46:
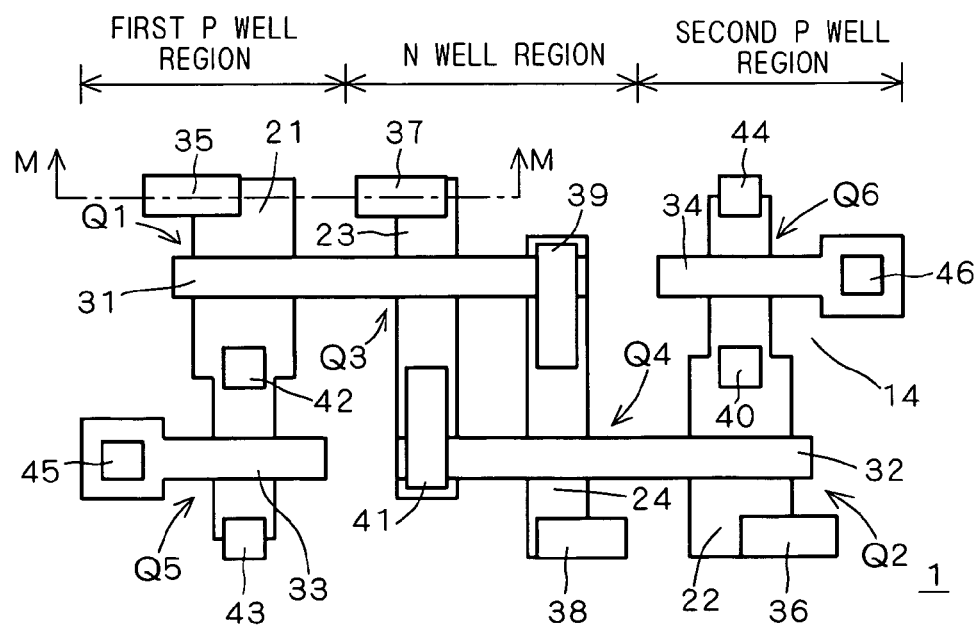
FIGS. 46 and 47 illustrate the structure of an SRAM cell according to a tenth preferred embodiment of the present invention.
Figure 47:
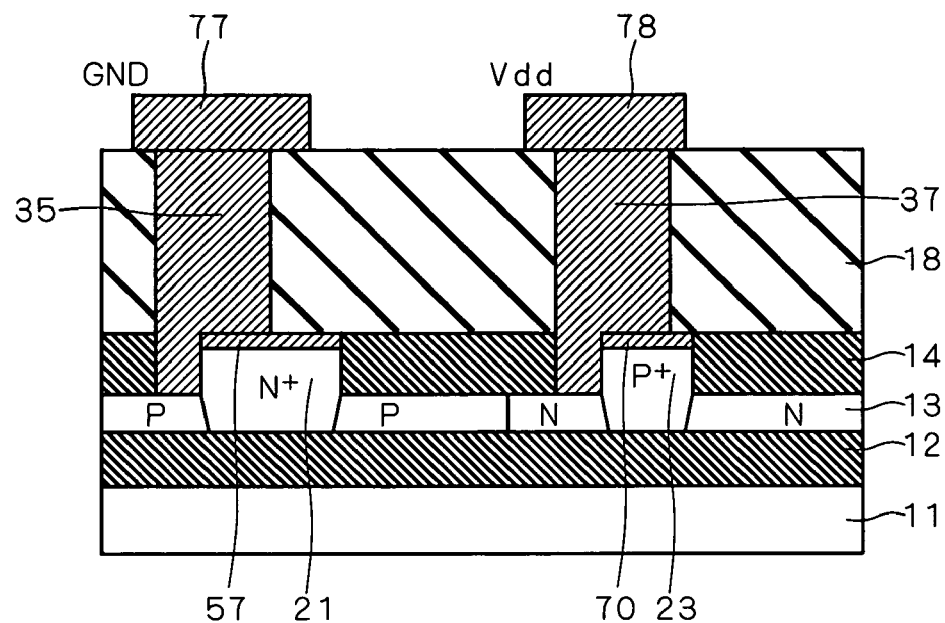

FIGS. 46 and 47 illustrate the structure of the SRAM cell 1 according to the tenth preferred embodiment. FIG. 47 is a sectional view taken along the line M-M in FIG. 46. Also referring to FIGS. 46 and 47, elements having functions similar to those of the elements shown in FIGS. 37 and 38 are denoted by the same reference numerals, and hence redundant description is omitted.

Figure 59:
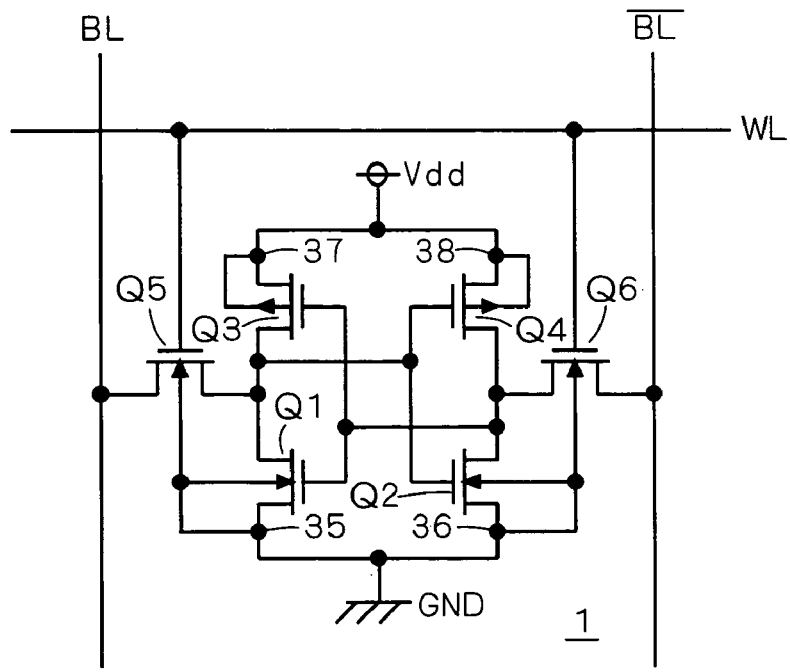
FIG. 59 illustrates an equivalent circuit of the SRAM cell according to the tenth preferred embodiment.

As shown in FIG. 47, a silicide layer 57 is formed on the upper surface of an N-type region of a first active region 21 which is a source region of the first driver transistor Q1, and a contact 35 connected to a ground wire 77 is formed thereon. According to the tenth preferred embodiment, this contact 35 passes through an element isolation insulating film 14 and reaches the SOI layer 13 (P well region) provided under the same. The P well region provided under the element isolation insulating film 14 is joined to body regions of the first driver transistor Q1 and the first access transistor Q5 under gate electrodes 31 and 33 (see FIG. 3A, for example), whereby it follows that the contact 35 is electrically connected to body regions of the first driver transistor Q1 and the first access transistor Q5. Another contact 36 connected to a ground wire also reaches the SOI layer 13 provided under the element isolation insulating film 14, and is electrically connected to body regions of the second driver transistor Q2 and the second access transistor Q6, although illustration is omitted. FIG. 59 shows an equivalent circuit of the SRAM cell 1 according to the tenth preferred embodiment.

According to the tenth preferred embodiment, body potentials of the driver transistors Q1 and Q2 and the access transistors Q5 and Q6 are fixed to the ground potential, thereby improving stability of operations of the SRAM cell 1. Further, the contacts 35 and 36 functioning as body contacts for the driver transistors Q1 and Q2 and the access transistors Q5 and Q6 are provided on each SRAM cell 1 as shown in the equivalent circuit of FIG. 59, whereby no ground contacts 201 of the well potential fixing cells 200 described with reference to FIG. 34 are necessary but an area for forming an SRAM can be reduced.

Figure 48:
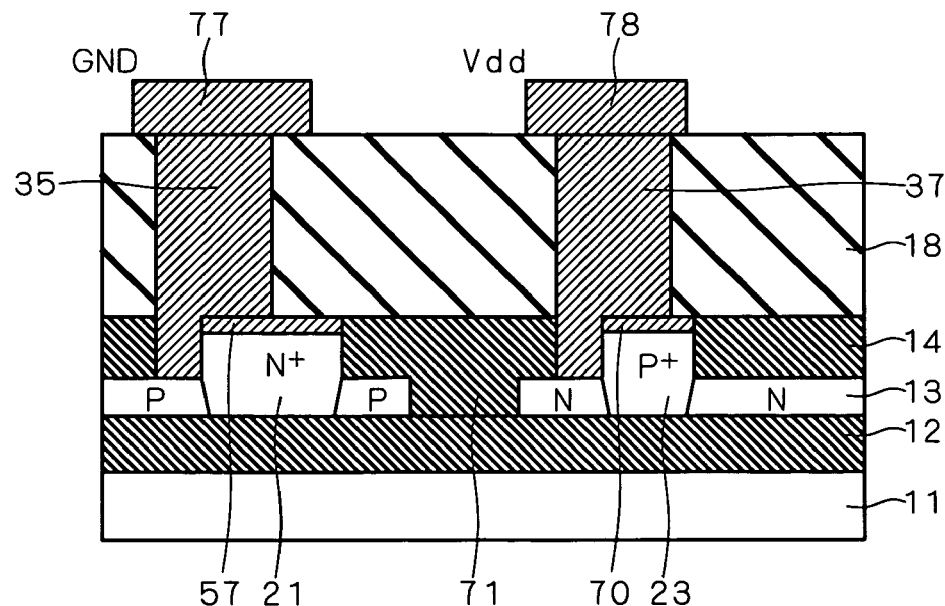
FIGS. 48 and 49 respectively illustrate modifications of the SRAM cell according to the tenth preferred embodiment.

When the fourth preferred embodiment, for example, is applied also in the tenth preferred embodiment for providing a complete isolation region 71 between P and N well regions as shown in FIG. 48, the distances between first to third active regions 21 to 23 and between second to fourth active regions 22 to 24 can be reduced while suppressing generation of leakage currents, for further reducing the area for forming the SRAM.

Figure 49:
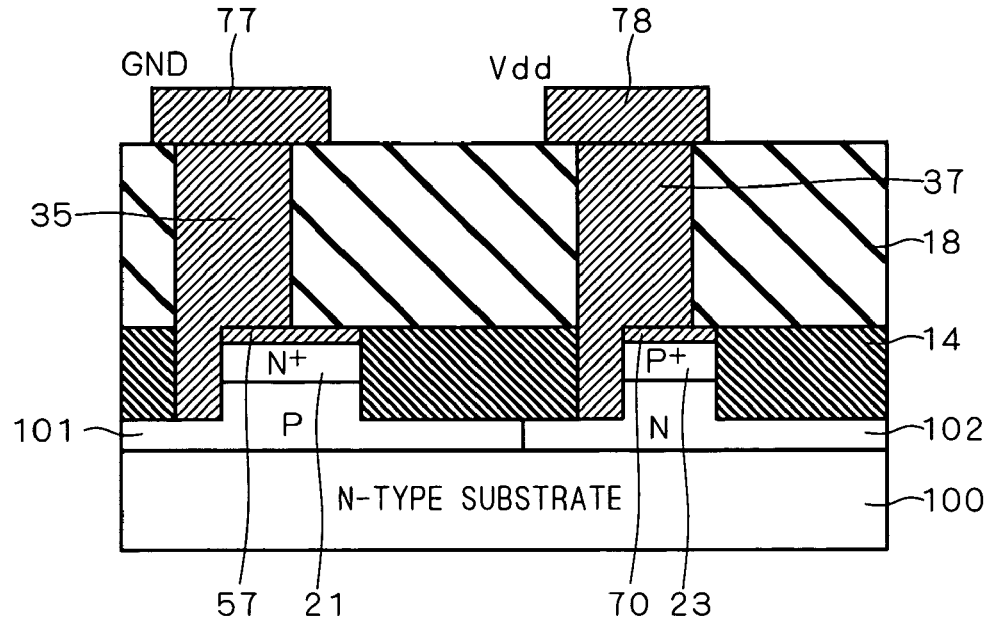

The tenth preferred embodiment is not restricted to an SRAM having an SOI structure either but is also applicable to an SRAM formed on a general bulk silicon substrate as shown in FIG. 49, for attaining effects similar to the above (elements similar to those in FIG. 40 are denoted by the same reference numerals in FIG. 49, and hence redundant description is omitted).

When the tenth preferred embodiment is applied to a bulk device, the depths of source/drain regions of MOS transistors (an N-type region in the first active region 21 and a P-type region in the third active region 23 in FIG. 49) are smaller than the depth of the element isolation insulating film 14 and hence the bottom surface of the contact 35 may not necessarily reach the P well region 101 provided under the element isolation insulating film 14 but may reach at least a position deeper than the N-type region in the first active region 21. If the N-type region in the first active region 21 is 0.1 μm in depth and the element isolation insulating film 14 is 0.3 μm in depth in FIG. 49, for example, the depth of the contact 35 may be about 0.15 μm so that the bottom surface of the contact 35 does not reach the P well region 101 but it follows that side surfaces come into contact with the same, thereby ensuring electrical connection between the contact 35 and the P well region 101.

Eleventh Preferred Embodiment

According to an eleventh preferred embodiment of the present invention, a technique different from that in the tenth preferred embodiment is proposed as a technique for providing body contacts for fixing body potentials of driver transistors Q1 and Q2 and access transistors Q5 and Q6 to a ground potential.

Figure 50:
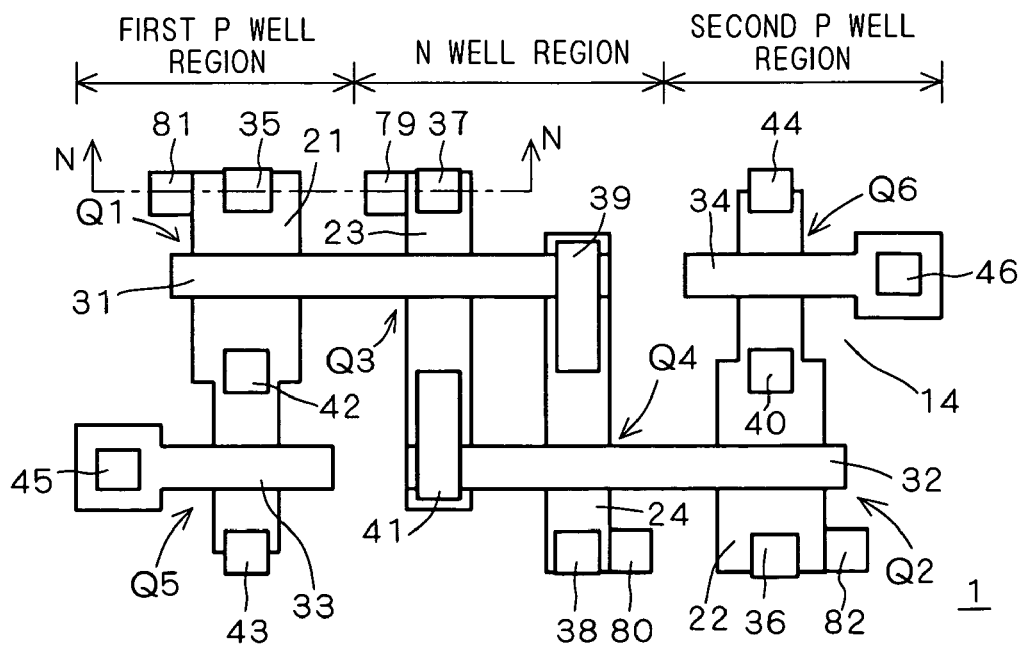
FIGS. 50 and 51 illustrate the structure of an SRAM cell according to an eleventh preferred embodiment of the present invention.
Figure 51:
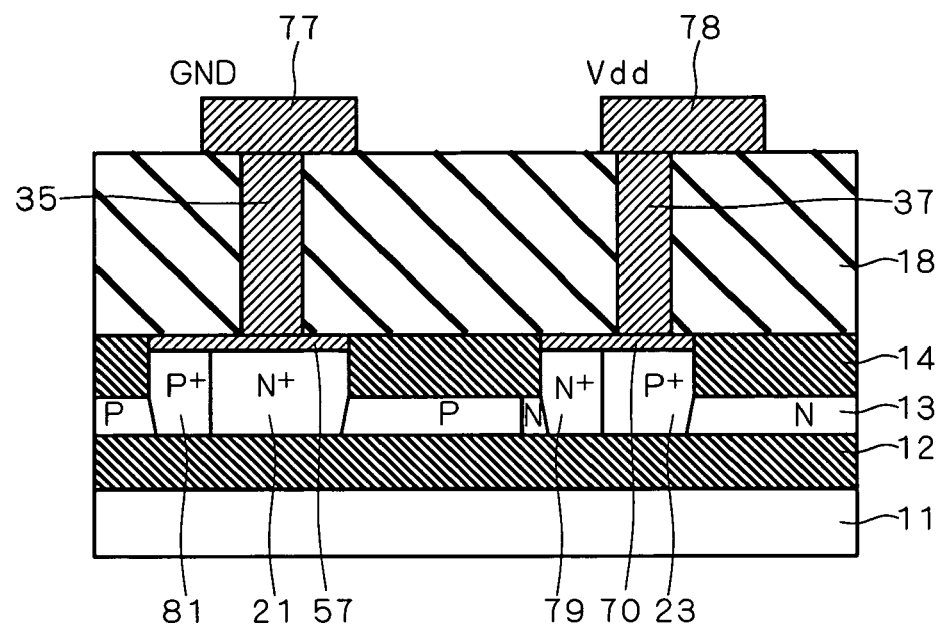

FIGS. 50 and 51 illustrate the structure of an SRAM cell 1 according to the eleventh preferred embodiment. FIG. 51 is a sectional view taken along the line N-N in FIG. 50. Referring to FIGS. 50 and 51, elements having functions similar to those of the elements shown in FIGS. 41 and 42 are denoted by the same reference numerals, and hence redundant description is omitted.

As shown in FIG. 50, the SRAM cell 1 according to the eleventh preferred embodiment further has P-type eleventh and twelfth active regions 81 and 82 defined by an element isolation insulating film 14 in an N well region. As shown in FIG. 51, the P-type eleventh active region 81 is joined to a P well region (SOI layer 13) provided under the element isolation insulating film 14. The P well region provided under the element isolation insulating film 14 is joined to body regions of the first driver transistor Q1 and the first access transistor Q5 provided under gate electrodes 31 and 32, whereby the eleventh active region 81 is electrically connected to the body regions of the first driver transistor Q1 and the first access transistor Q5. Further, the eleventh active region 81 and a source region (N-type region in a first active region 21) of the first driver transistor Q1 are in contact with each other, and a silicide layer 57 is integrally formed thereon (in order to integrally form the silicide layer 57 on the eleventh active region 81 and the source region of the first driver transistor Q1, at least upper portions of these two regions must be joined with each other). A contact 35 connected to a ground wire 77 is formed on the silicide layer 57. As understood from 51, the contact 35 is electrically connected not only to the first active region 21 but also to the eleventh active region 81 through the silicide layer 57. In other words, the contact 35 is electrically connected to the body regions of the load transistors Q3 and Q4 through the silicide layer 57, the eleventh active region 81 and the SOI layer 13 (P well region).

The twelfth active region 82 is also joined to the SOI layer 13 (P well region) provided under the element isolation insulating film 14 and a silicide layer is integrally formed on the twelfth active region 82 and a second active region 22, although illustration is omitted. In other words, another contact 36 connected to a ground wire is also electrically connected to the body regions of the second driver transistor Q2 and the second access transistor Q6.

According to the eleventh preferred embodiment, the body potentials of the driver transistors Q1 and Q2 and the access transistors Q5 and Q6 are fixed to the ground potential similarly to the tenth preferred embodiment, thereby stabilizing stability of operations of the SRAM cell 1. Further, the eleventh and twelfth active regions 81 and 82 functioning as the body contacts for the driver transistors Q1 and Q2 and the access transistors Q5 and Q6 are provided on each SRAM cell 1, whereby no ground contacts 201 of the well potential fixing cells 200 described with reference to FIG. 34 are necessary but an area for forming an SRAM can be reduced.

When the source regions of the driver transistors Q1 and Q2 are 0.2 μm in width respectively and the intervals between the source regions of the first driver transistor Q1 and the first load transistor Q3 and between the second driver transistor Q2 and the second access transistor Q6 are 0.2 μm respectively, for example, the eleventh and twelfth active regions 81 and 82 may be about 0.05 μm in width. While the widths of the portions of the element isolation insulating film 14 provided with the eleventh and twelfth active regions 81 and 82 are smaller than those in the remaining preferred embodiments in the example shown in FIGS. 50 and 51, the potentials of the eleventh and twelfth active regions 81 and 82 are equal to that of the P well region provided under the element isolation insulating film 14 and hence no isolation withstand voltage is deteriorated in these portions.

When the impurity concentrations of the eleventh and twelfth active regions 81 and 82 are rendered higher than that of the element isolation insulating film 14, further, connection resistance with contacts 37 and 38 can be reduced. If the impurity concentrations are at least $10^{18}/cm^3$, for example, ohmic contact with a metal is enabled.

Figure 52:
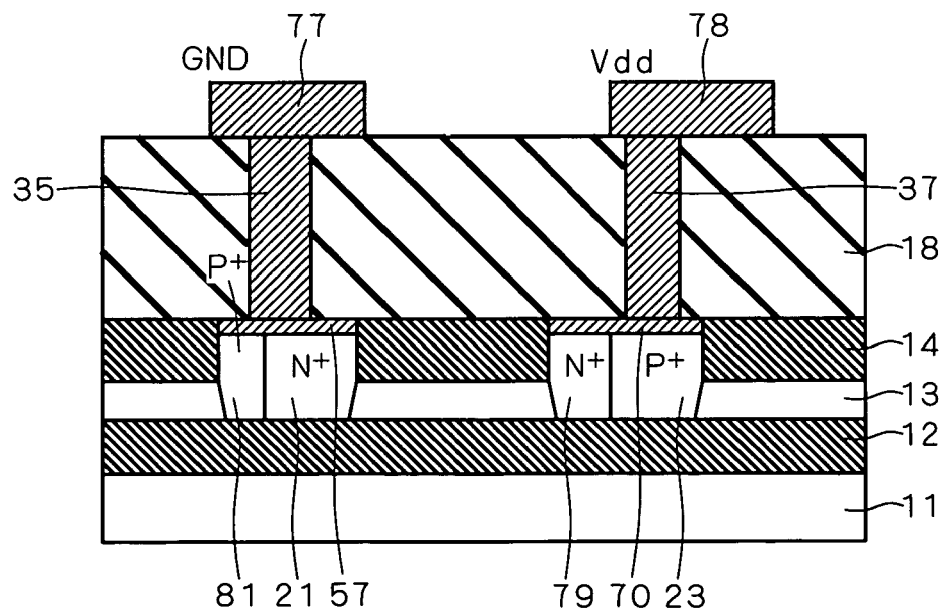
FIGS. 52 through 54 respectively illustrate modifications of the SRAM cell according to the eleventh preferred embodiment.

The eleventh active region 81, formed outside the first active region 21 in FIGS. 50 and 51, may alternatively be formed inside the first active region 21 as shown in FIG. 52, for example, for further reducing the area for forming the SRAM cell 1.

Figure 53:
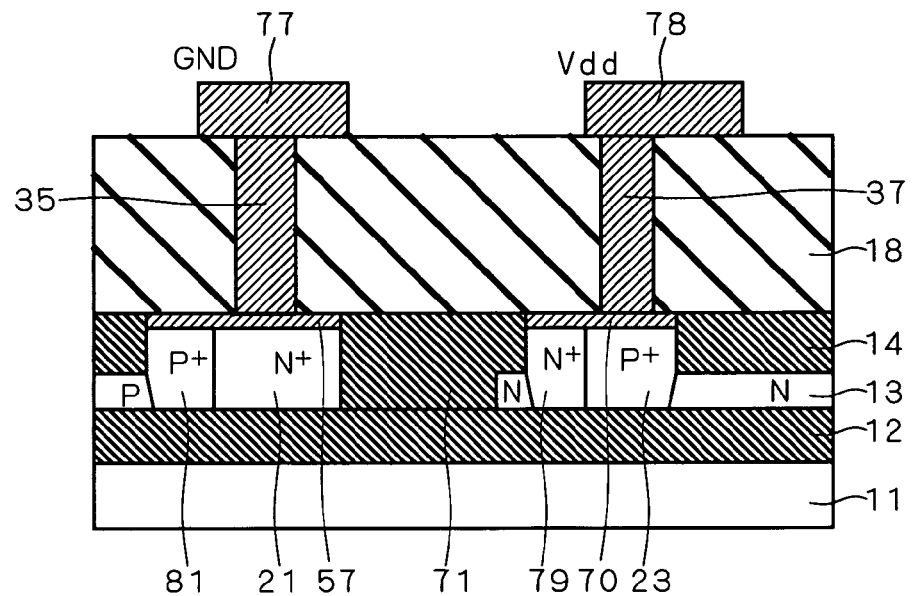

When the fourth preferred embodiment, for example, is applied also in the eleventh preferred embodiment for providing a complete isolation region 71 between the P and N well regions as shown in FIG. 53, the distances between first to third active regions 21 to 23 and between second to fourth active regions 22 to 24 can be reduced while suppressing generation of leakage currents, for further reducing the area for forming the SRAM.

Figure 54:
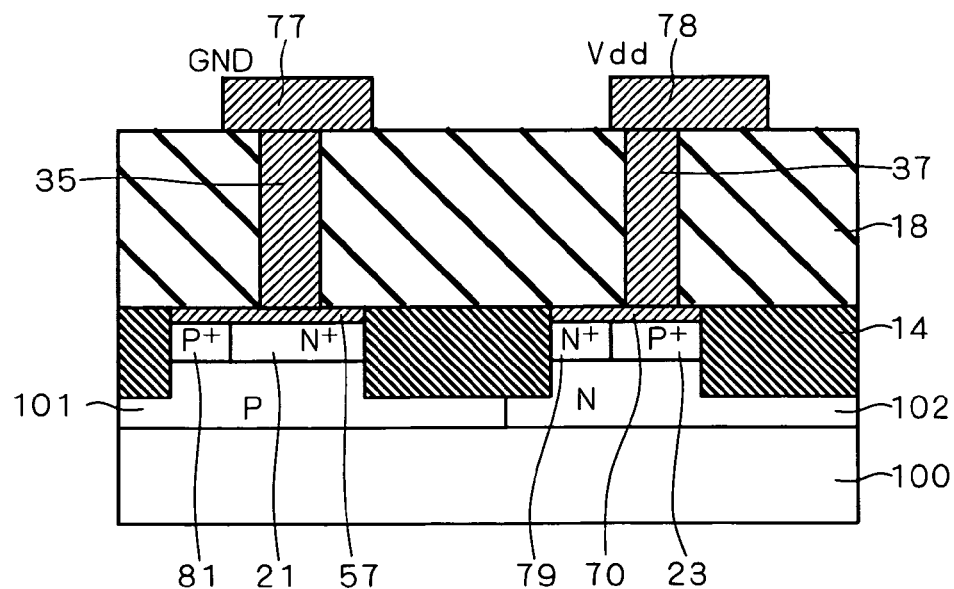

The eleventh preferred embodiment is not restricted to an SRAM having an SOI structure either but is also applicable to an SRAM formed on a general bulk silicon substrate as shown in FIG. 54, for attaining effects similar to the above (elements similar to those in FIG. 40 are denoted by the same reference numerals in FIG. 54, and hence redundant description is omitted).

Twelfth Preferred Embodiment

As discussed in the first preferred embodiment, when the DTMOS is applied as the driver transistors Q1, Q2 and as the access transistors Q5, Q6 that form an SRAM cell, connection between the word line and the body regions causes the P-N junction between the body region and the source and drain of each one of the transistors Q1, Q2, Q5 and Q6 to be forward biased during increase of the potential of the word line. This may cause flow of a current therethrough to increase power consumption. A resistance of a certain value developed in the SOI layer 13 under the element isolation insulating film 14 as a path of this leakage current (the resistor R shown in the equivalent circuit of FIG. 56) serves to suppress the leakage current, thereby reducing increase of power consumption. On the other hand, the leakage current serves to increase ON current and improve operating speed in the DTMOS and thus, it is not desirable to completely interrupt the leakage current. The DTMOS in which the leakage current is completely interrupted is operative in the same manner as a usual MOS transistor. In response, in a twelfth preferred embodiment of the present invention, the resistance in the leakage current path is intentionally increased to keep the leakage current at a properly reduced level.

Figure 60:
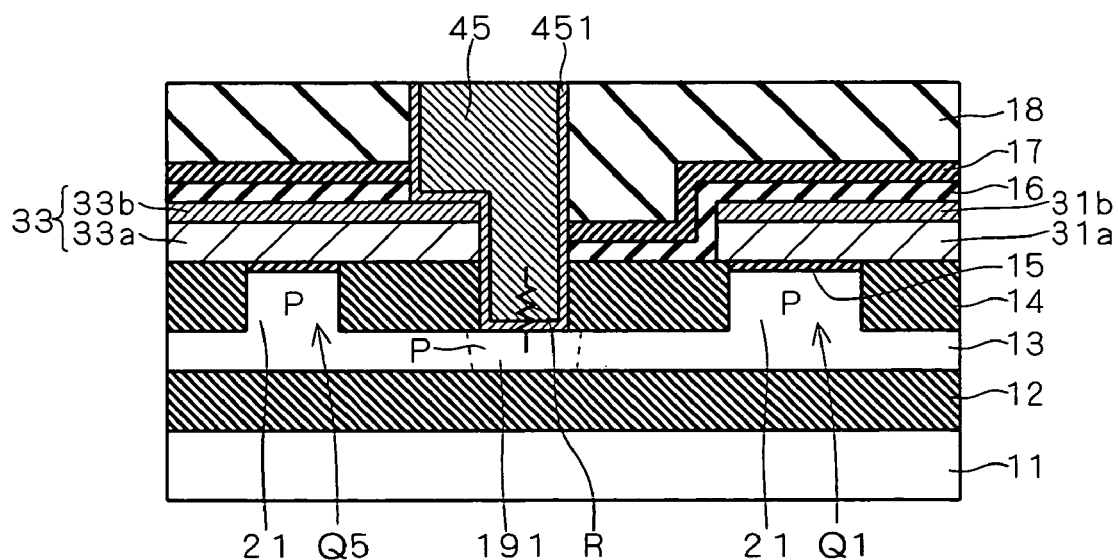
FIG. 60 illustrates the structure of an SRAM cell according to a twelfth preferred embodiment of the present invention.

FIG. 60 illustrates the structure of an SRAM cell according to the twelfth preferred embodiment. The SRAM of the twelfth preferred embodiment has the same top view as that of FIG. 2 discussed in the first preferred embodiment. FIG. 60 is a sectional view taken along the line A-A of FIG. 2. In FIG. 60, the same constituent elements as those shown in FIGS. 2 and 3 are denoted by the same reference numerals.

In the twelfth preferred embodiment, the group of the first driver transistor Q1, the first load transistor Q3 and the first access transistor Q5, and the group of the second driver transistor Q2, the second load transistor Q4 and the second access transistor Q6 also have the same structure. For simplification of the description, only the structures of the first driver transistor Q1 and the first access transistor Q5 will be described. The description of the second driver transistor Q2 and the second access transistor Q6 will be omitted, which is true in the preferred embodiments to be discussed later.

Although not shown in each of the foregoing preferred embodiments, barrier metal 451 is usually provided on the surface of the contact 45. The P-type region designated by reference numeral 191 is the region having connection with the contact 45 in the SOI layer 13, namely, the region in which the P⁺ region 19 is formed in the first preferred embodiment (see FIG. 3).

In the twelfth preferred embodiment, the material of the barrier metal 451 is properly selected and the impurity concentration in the P-type region 191 is suitably controlled to form the resistor R having a desirable resistance in the connection region between the contact 45 and the SOI layer 13 as shown in FIG. 60. Actually, the SOI layer 13 under the element isolation insulating film 14 and the contact 45 may have slight parasitic resistances. However, these parasitic resistances are lower than the resistance of the resistor R formed in the twelfth preferred embodiment and hence, they will be disregarded.

The foregoing leakage current starts from the word line to reach the contact 45, thereafter passing through the SOI layer 13 under the element isolation insulating film 14 to flow into the body regions of the first driver transistor Q1 and the first access transistor Q5. Hence, the resistor R formed in the connection region between the contact 45 and the SOI layer 13 is inserted in the leakage current path. The resistor R is interposed between the body regions of the first driver transistor Q1 and the first access transistor Q5 and the word line. Thus, the SRAM of the twelfth preferred embodiment has the same equivalent circuit as that of FIG. 56. In the twelfth preferred embodiment, the resistor R is controlled to have a suitable resistance.

As a specific example, in the step of forming the contact 45 (FIGS. 16A ad 16B) as one of the manufacturing process steps of the SRAM in the first preferred embodiment, the material of the barrier metal 451 is selected from Ti, TiN, Ta, TaN, W, WN, Mo, MoN, Hf, HfN, Al, Pt and Au, and from compounds thereof providing a desirable resistance. The barrier metal 451 may have a two-layered structure such as Ti/TiN.

In order to obtain a desirable resistance in the P-type region 191, the impurity concentration therein may be controlled to fall within a range between $10^{16}$ and $10^{22}/cm^3$, for example. This control is realized by changing the dose of ions to be implanted in the step of forming the P+ region 19 (FIGS. 15A and 15B) as one of the manufacturing process steps of the SRAM in the first preferred embodiment. When the impurity concentration in the P-type region 191 is required to be approximately the same as that in the SOI layer 13 under the element isolation insulating film 14, the ion implantation shown in FIGS. 15A and 15B are not required. When the impurity concentration of the P-type region 191 should be lower than that of the SOI layer 13 under the element isolation insulating film 14, implantation of N-type dopants (which is so-called counterdoping) may be performed in the ion implantation of FIGS. 15A and 15B.

As discussed, in the twelfth preferred embodiment, the resistor R is allowed to have a suitable resistance, thereby allowing the resistance between the body regions of the first driver transistor Q1 and the first access transistor Q5 and the word line to be controlled at a suitable level. Next, "the suitable resistance" will be discussed.

For data reading from the SRAM, a certain period of time (access time) is generally required to begin data reading as a result of time lag between increase of the potential of the word line and output of the potential corresponding to the data to the bit line, for example. The present invention uses the DTMOS as the driver transistors Q1, Q2 and as the access transistors Q5, Q6 which form the SRAM, and hence, the body potential should be sufficiently increased to a level close to the word potential during data reading to speed up the reading. Namely, the body potential should be increased to a sufficiently high level before elapse of the access time.

In the SRAM of the twelfth preferred embodiment, the time constant of the rising edge of the body potential is obtained by the product of the capacitance between the word line and the body region (body capacitance) and a resistance. As an example, with a body capacitance of 1 fF, a time constant of 10 ns is obtained when R1 as the resistance of the resistor R is set to 10 MΩ. That is, in the SRAM having an access time of 10 ns, the resistance R1 should be not more than 10 MΩ.

A time constant becomes shorter with reduction of the resistance R1 to allow speedup of the increase of the body potential, which in turn causes increase of the leakage current as discussed. Thus, the resistance R1 should be at least around 1 kΩ.

The usual SRAM currently used has an access time ranging between several nanoseconds and 100 ns. The resistance R1 ranging between 1 kΩ and 100 MΩ is responsive to such an access time. More preferably, allowing for a margin of variations in operating characteristic of the SRAM cell, a time constant may be set to about one-fifth of an access time. As an example, in the SRAM having an access time of 10 ns, the resistance R1 is effectively around 2 MΩ. That is, the resistance R1 desirably ranges between 1 kΩ and 20 MΩ to respond to the usual SRAM having an access time ranging between several nanoseconds and 100 ns.

In the twelfth preferred embodiment, a resistor having a desirable resistance is provided between the word line and the body regions of the driver transistors Q1, Q2 and the access transistors Q5, Q6. Thus, the twelfth preferred embodiment realizes reduction of the leakage current in addition to the effects discussed in the first preferred embodiment, to thereby reduce the power consumption of the SRAM of the present invention. More specifically, with the word line potential of 0.8 V and with the first access transistor Q5 in ON state, the leakage current starting from the word line, thereafter passing through the body regions of the first driver transistor Q1 and the first access transistor Q5 to flow into the ground terminal (GND) is reduced to fall within a range of about $10^{-9}$ to $10^{-5}$ A.

Figure 61:
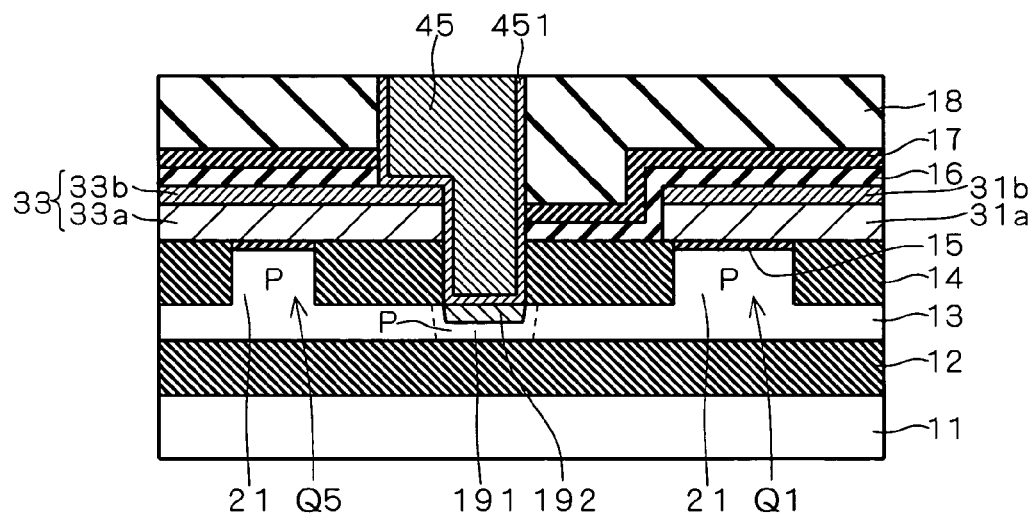
FIGS. 61 through 63 respectively illustrate modifications of the SRAM cell according to the twelfth preferred embodiment.
Figure 62:
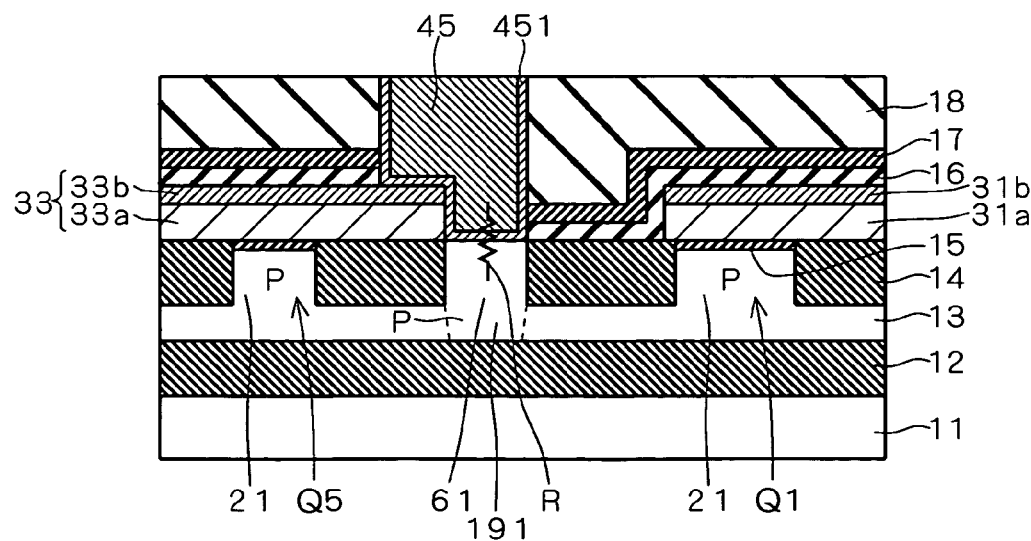

FIG. 61 illustrates a modification of the twelfth preferred embodiment. With reference to FIG. 61, the P-type region 191 and the barrier metal 451 are reacted to form a silicide layer 192 on the P-type region 191. The silicide layer 192 may include TiSi, TiSi$_2$, MoSi, MoSi$_2$, TaSi, Tasi$_2$, WSi, or WSi$_2$, for example, According to the structure described above, in the SRAM cell of the first preferred embodiment, the resistor R is formed between the word line and the body regions of the driver transistors Q1, Q2 and the access transistors Q5, Q6. However, the applicability of the twelfth preferred embodiment is not limited to this structure. By way of example, the twelfth preferred embodiment may be applied to the SRAM cell of the second preferred embodiment, as shown in FIG. 62. The SRAM of FIG. 62 has the same top view as that of FIG. 17 discussed in the second preferred embodiment. FIG. 62 is a sectional view taken along the line C-C of FIG. 17. In FIG. 62, the same constituent elements as those shown in FIGS. 17, 18 and 60 are denoted by the same reference numerals. The contact 45 formed with the barrier metal 451 is connected to the fifth active region 61, and the resistor R is formed in the connection region between the contact 45 and the fifth active region 61. The structure of FIG. 62 produces the same effects as discussed.

Unlike the structure of the second preferred embodiment shown in FIG. 18, the structure of FIG. 62 has no cobalt silicide layer 57 on the upper surface of the fifth active region 61. This is because the same resistor R as formed in the SRAM cell of FIG. 60 should be obtained. As long as the resistance R1 of the resistor R is desirably controlled, however, the cobalt silicide layer 57 may be naturally formed on the upper surface of the fifth active region 61 as in FIG. 18. In order to avoid formation of the cobalt silicide layer 57 on the upper surface of the fifth active region 61 as shown in FIG. 62, in the step of forming the silicide layers 57 and 31b (FIGS. 23A and 23B) as one of the manufacturing process steps of the SRAM in the second preferred embodiment, the upper surface of the fifth active region 61 may be covered with a certain insulating film (which is so called a "silicide protection film") to avoid deposition of cobalt on the upper surface of the fifth active region 61.

In the structure of FIG. 62, the resistance R1 can be desirably controlled by properly selecting the material of the barrier metal 451 in the formation of the contact 45 and controlling the impurity concentration in the P-type region 191. For control of the impurity concentration in the P-type region 191, the dose of ions to be implanted may be changed or counterdoping may be performed in the step of forming the P+ region 19 (FIGS. 26A and 26B) as one of the manufacturing process steps of the SRAM in the second preferred embodiment.

Like the structure of FIG. 61, the structure of FIG. 62 may also be provided with the silicide layer 192 on the P-type region 191 as a result of reaction between the P-type region 191 and the barrier metal 451. The resultant structure is as given in FIG. 63.

Thirteenth Preferred Embodiment

As discussed above, in the SRAM cell of the present invention, increase of the resistance between the word line and the body regions of the driver transistors Q1, Q2 and the access transistors Q5, Q6 results in reduction of the leakage current flowing from the word line when the driver transistors Q1 and Q2 and the access transistors Q5 and Q6 are in ON state. However, reduction of the leakage current in turn causes difficulty in moving holes accumulated in these body regions to the word line when the driver transistors Q1 and Q2 and the access transistors Q5 and Q6 are turned off. This causes difficulty in fixing the body potential when the SRAM cell is in a standby state to increase the leakage current in a standby or cause operation instability to degrade soft error tolerance.

Figure 64:
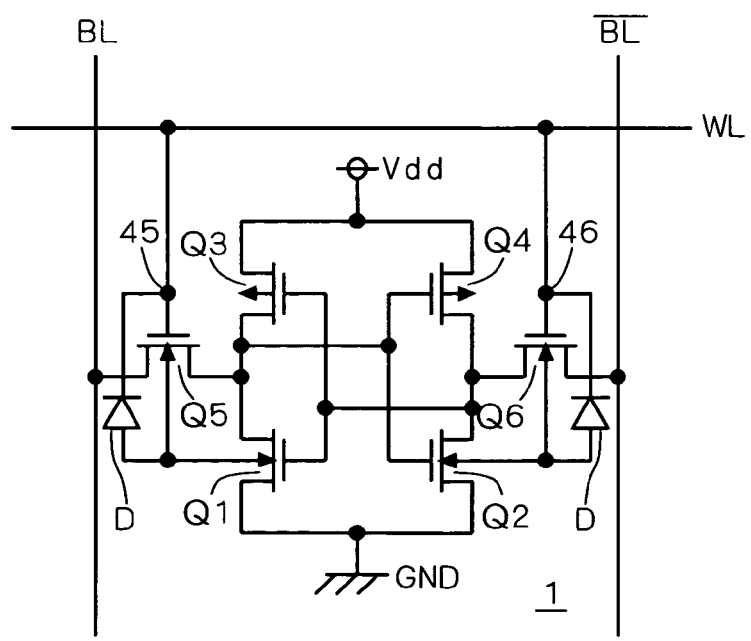
FIG. 64 illustrates an equivalent circuit of an SRAM cell according to a thirteenth preferred embodiment of the present invention.

When both the reduction of the leakage current and improvement in soft error tolerance are to be realized in the SRAM cell of the present invention, a current flowing in a direction from the word line toward the body regions of the driver transistors Q1, Q2 and the access transistors Q5, Q6 (leakage current) should be reduced while increasing a current flowing in an opposite direction from these body regions toward the word line (current resulting from removal of holes from the body regions). In a thirteenth preferred embodiment of the present invention, a diode is interposed between the word line and the body regions. This diode has a cathode connected to the side of the word line and an anode connected to the side of the body regions. Thus, the SRAM cell of the thirteenth preferred embodiment has an equivalent circuit shown in FIG. 64.

Figure 65:
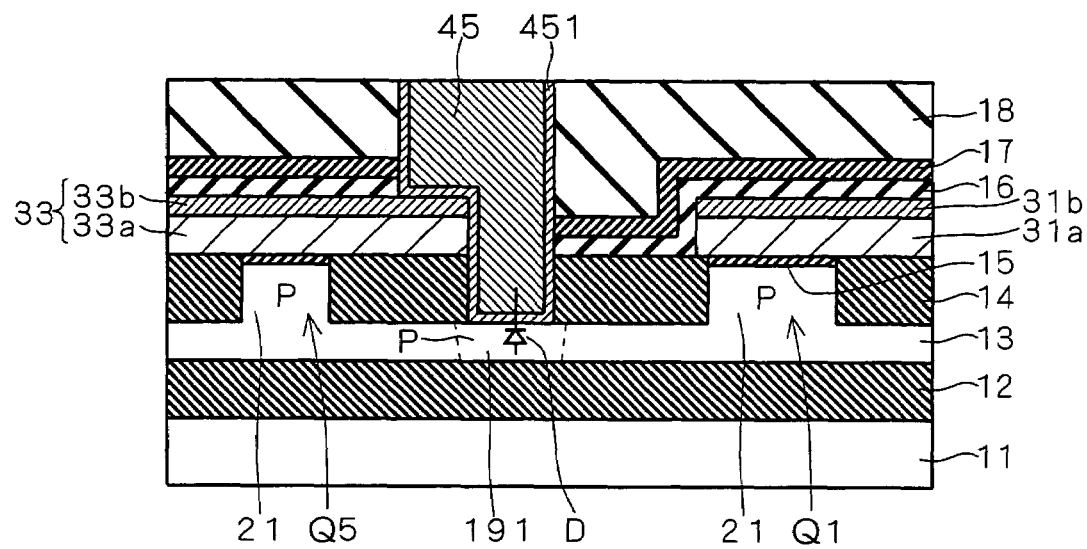
FIG. 65 illustrates the structure of the SRAM cell according to the thirteenth preferred embodiment.

FIG. 65 illustrates the structure of the SRAM cell according to the thirteenth preferred embodiment. In FIG. 65, the same constituent elements as those shown in FIG. 60 are denoted by the same reference numerals. As shown in FIG. 65, the structure of the thirteenth preferred embodiment is provided with a diode D in place of the resistor R of FIG. 60. The diode D is a so-called Schottky diode formed by the Schottky junction between the barrier metal 451 and the P-type region 191.

To form a Schottky junction between the barrier metal 451 and the P-type region 191, the impurity concentration of the P-type region 191 may be set to about $10^{16}$ to $10^{20}$/cm$^3$. In order to control the impurity concentration of the P-type region 191, the dose of ions to be implanted may be changed or counterdoping may be performed in the step of forming the P+ region 19 (FIGS. 15A and 15B) as one of the manufacturing process steps of the SRAM in the first preferred embodiment.

As discussed, in the thirteenth preferred embodiment, the diode D having a cathode connected to the side of the word line is provided between the body regions of the first driver transistor Q1 and the first access transistor Q5, and the contact 45. Thus, a current flowing in a direction from the word line toward the body regions of the driver transistors Q1, Q2 and the access transistors Q5, Q6 (leakage current) is reduced, whereas a current flowing in a direction from these body regions toward the word line (current resulting from removal of holes from the body regions) is kept at a high level. As a result, the SRAM cell of the present invention is allowed to effectively realize both the reduction of the leakage current and improvement in soft error tolerance.

Figure 66:
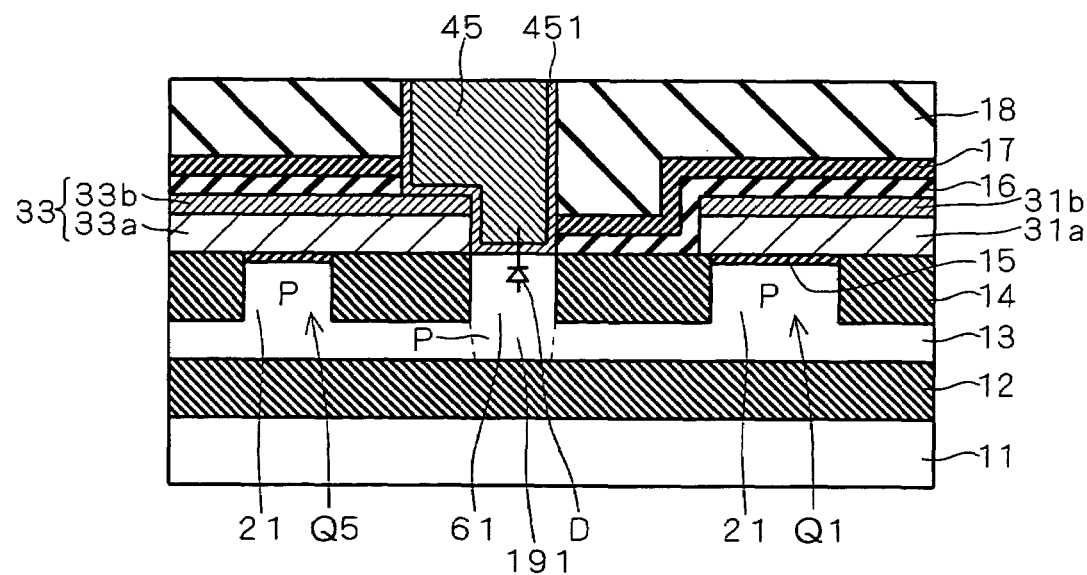
FIG. 66 illustrates a modification of the SRAM cell according to the thirteenth preferred embodiment.

According to the structure of FIG. 65, in the SRAM cell with the same structure as that of the first preferred embodiment, the diode D is interposed between the word line and the body regions. However, the applicability of the thirteenth preferred embodiment is not limited to the structure of FIG. 65. By way of example, the thirteenth preferred embodiment may be applied to the SRAM cell of the second preferred embodiment. In this case, in the structure of FIG. 62 discussed in the twelfth preferred embodiment, the diode D is provided from the Schottky junction between the P-type region 191 and the barrier metal 451 by controlling the impurity concentration of the P-type region 191 (FIG. 66).

Figure 63:
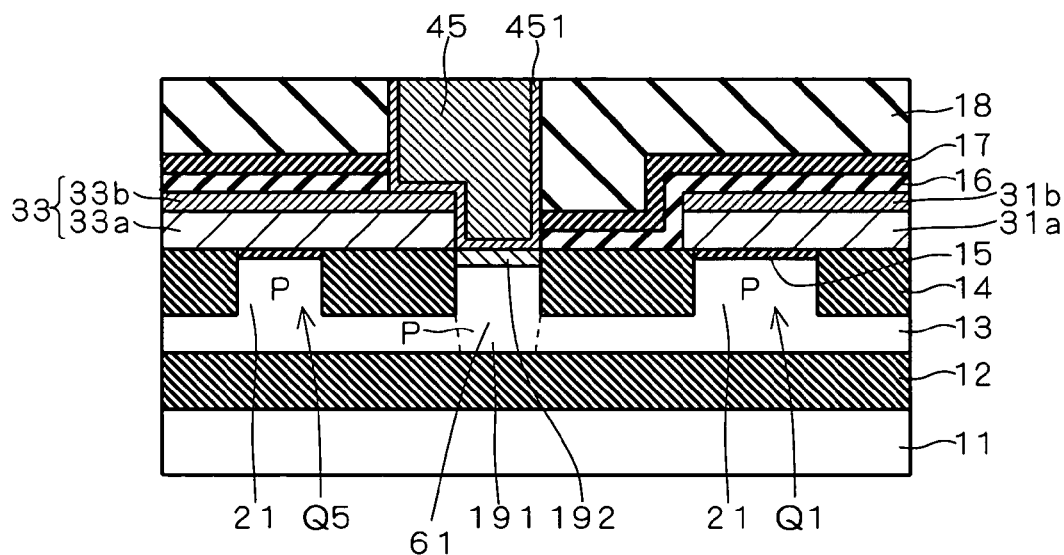

In the thirteenth preferred embodiment, like the structures of FIGS. 61 and 63 discussed above, the P-type region 191 and the barrier metal 451 may also be reacted to form the silicide layer 192 on the P-type region 191. In this case, the impurity concentration of the P-type region 191 is so controlled that a Schottky junction is provided between the silicide layer 192 and the P-type region 191. That is, the diode D is formed by the silicide layer 192 and the P-type region 191.

Fourteenth Preferred Embodiment

Figure 67:
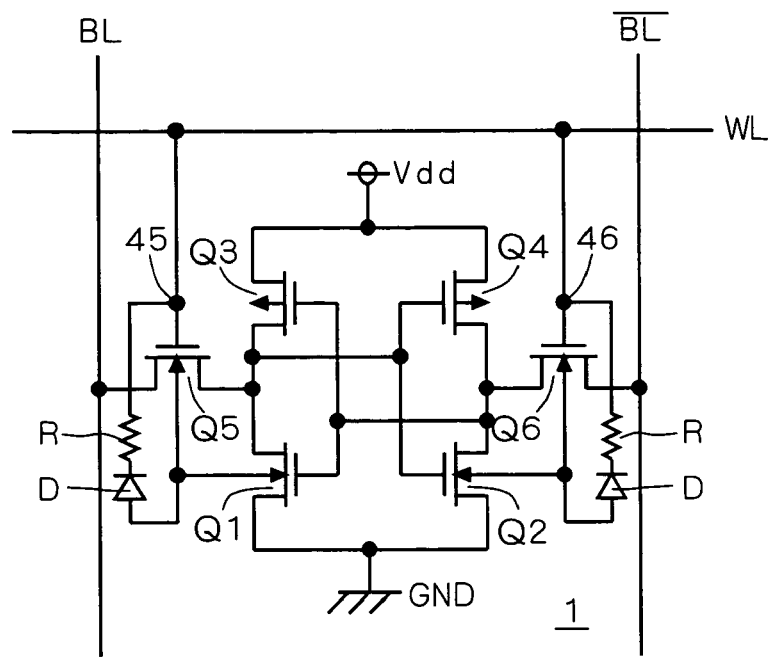
FIG. 67 illustrates an equivalent circuit of an SRAM cell according to a fourteenth preferred embodiment of the present invention.

A fourteenth preferred embodiment of the present invention is a combination of the twelfth and thirteenth preferred embodiments. That is, the resistor R and the diode D are interposed between the word line and the body regions of the driver transistors Q1, Q2 and the access transistors Q5, Q6. The resistor R and the diode D are connected in series. Thus, the SRAM of the fourteenth preferred embodiment has an equivalent circuit shown in FIG. 67.

Figure 68:
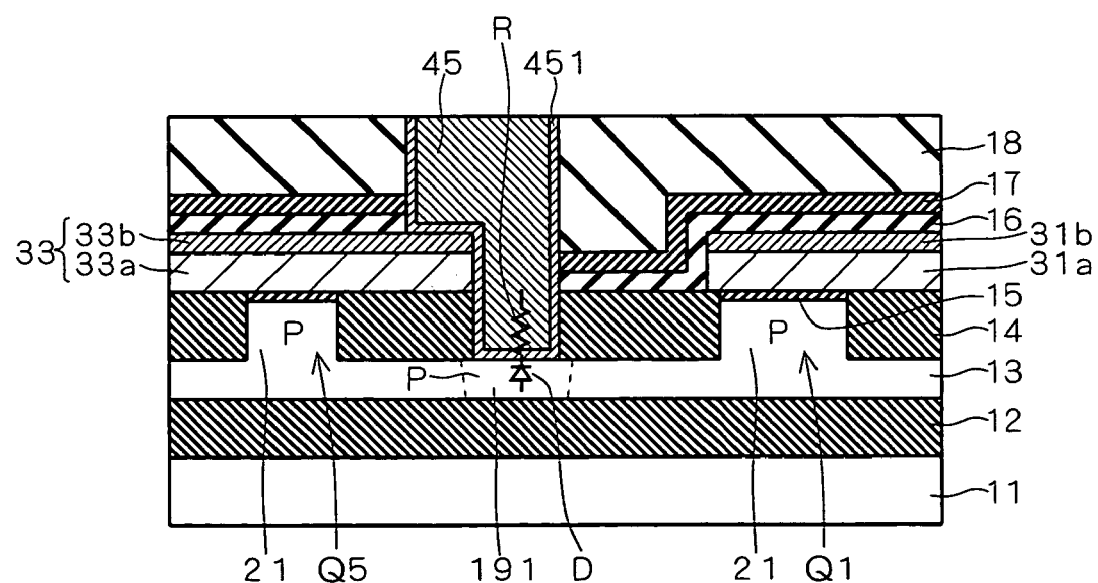
FIG. 68 illustrates the structure of the SRAM cell according to the fourteenth preferred embodiment.

FIG. 68 illustrates the structure of the SRAM cell according to the fourteenth preferred embodiment. In FIG. 68, the same constituent elements as those shown in FIGS. 60 and 65 are denoted by the same reference numerals. The material of the barrier metal 451 is properly selected and the impurity concentration of the P-type region 191 is suitably controlled to form the resistor R having a desirable resistance in the connection region between the contact 45 and the SOI layer 13. The control of the impurity concentration of the P-type region 191 is also intended to form a Schottky junction between the barrier metal 451 and the P-type region 191. The Schottky diode D is formed by the barrier metal 451 and the P-type region 191.

The diode D is interposed between the word line and the body regions of the driver transistors Q1, Q2 and the access transistors Q5, Q6. Thus, the resistance between the word line and the body regions differs between application of a forward voltage to the diode D (when the diode D is forward biased) and application of a reverse voltage to the diode D (when the diode D is reverse biased). As an example, when the word line potential is increased to turn on the access transistors Q5 and Q6, the diode D is reverse biased to raise the resistance. Conversely, when the word line potential is decreased to turn off the access transistors Q5 and Q6, the diode D is forward biased to lower the resistance. Like in the thirteenth preferred embodiment, a current flowing in a direction from the word line toward the body regions of the driver transistors Q1, Q2 and the access transistors Q5, Q6 (leakage current) is reduced accordingly, whereas a current flowing in a direction from these body regions toward the word line (current resulting from removal of holes form the body regions) is kept at a high level. In the SRAM cell of the present invention, it is thus allowed to effectively realize both the reduction of the leakage current and improvement in soft error tolerance.

Like in the twelfth preferred embodiment, the material of the barrier metal 451 is suitably selected and the impurity concentration of the P-type region 191 is adjusted to control the resistance between the word line and the body regions of the first driver transistors Q1 and the first access transistor Q5, whereby the time constant of the rising edge of the body potential is properly controlled. The material of the barrier metal 451 is selected from Ti, TiN, Ta, TaN, W, WN, Mo, MoN, Hf, HfN, Al, Pt and Au, and from compounds thereof providing a desirable resistance. The barrier metal 451 may have a two-layered structure such as Ti/TiN.

The diode D is reverse biased at the rising edge of the body potential, namely, at the rising edge of the word line potential. Thus, the time constant of the rising edge of the word line is given by:

$$C1 \times (R1+R2)$$

where C1 is a body capacitance, R1 is the resistance of the resistor R, and R2 is the resistance of the reverse-biased diode D. As an example, with a body capacitance of 1 fF, a time constant of 10 ns is obtained when the sum of the resistance R1 of the resistor R and the resistance R2 of the reverse-biased diode D (R1+R2) is set to 10 MΩ.

The usual SRAM currently used has an access time ranging between several nanoseconds and 100 ns. Thus, the sum of the resistance R1 of the resistor R and the resistance R2 of the reverse-biased diode D may be controlled at a level not more than 100 MΩ. The time constant becomes shorter with reduction of the sum of the resistances R1 and R2 to allow speedup of the increase of the body potential, which in turn causes increase of the leakage current as discussed. Thus, the sum of the resistances R1 and R2 should be at least around 1 kΩ.

More preferably, allowing for a margin of variations in operating characteristic of the SRAM cell, a time constant may be set to about one-fifth of an access time. As an example, in the SRAM having an access time of 10 ns, the sum of the resistances R1 and R2 is preferably about 2 MΩ.

Like in the thirteenth preferred embodiment, it is also allowed in the fourteenth preferred embodiment to reduce a current flowing in a direction from the word line toward the body regions of the driver transistors Q1, Q2 and the access transistors Q5, Q6 (leakage current) while keeping a current flowing in a direction from these body regions toward the word line (current resulting from removal of holes from the body regions) at a high level. Like in the twelfth preferred embodiment, the rise time of the body potential is controlled to effectively reduce the leakage current. As a result, the SRAM cell of the present invention is allowed to more effectively realize both the reduction of the leakage current and improvement in soft error tolerance.

More specifically, with the word line potential of 0.8V and with the first access transistor Q5 in ON state, the leakage current starting from the word line, thereafter passing through the body regions of the first driver transistor Q1 and the first access transistor Q5 to flow into the ground terminal (GND) is reduced to fall within a range of about $10^{-9}$ to $10^{-5}$ A. When the word line potential starts to drop from 0.8 V to 0 V to switch the first access transistor Q5 off, a current flowing from the body regions of the first driver transistor Q1 and the first access transistor Q5 toward the word line (current resulting from removal of holes from the body regions) is kept at a level of $10^{-5}$ A or more.

According to the structure of FIG. 68, in the SRAM cell with the same structure as that of the first preferred embodiment, the resistor R and the diode D are interposed between the word line and the body regions. However, the applicability of the fourteenth preferred embodiment is not limited to the structure of FIG. 68. By way of example, the fourteenth preferred embodiment may be applied to the SRAM cell of the second preferred embodiment. In this case, in the structure of FIG. 62 discussed in the twelfth preferred embodiment, the material of the barrier metal 451 is selected and the impurity concentration in the P-type region 191 is adjusted to desirably control the resistances thereof. The impurity concentration in the P-type region 191 is also controlled to form a Schottky junction between the P-type region 191 and the barrier metal 451 (FIG. 69).

Figure 69:
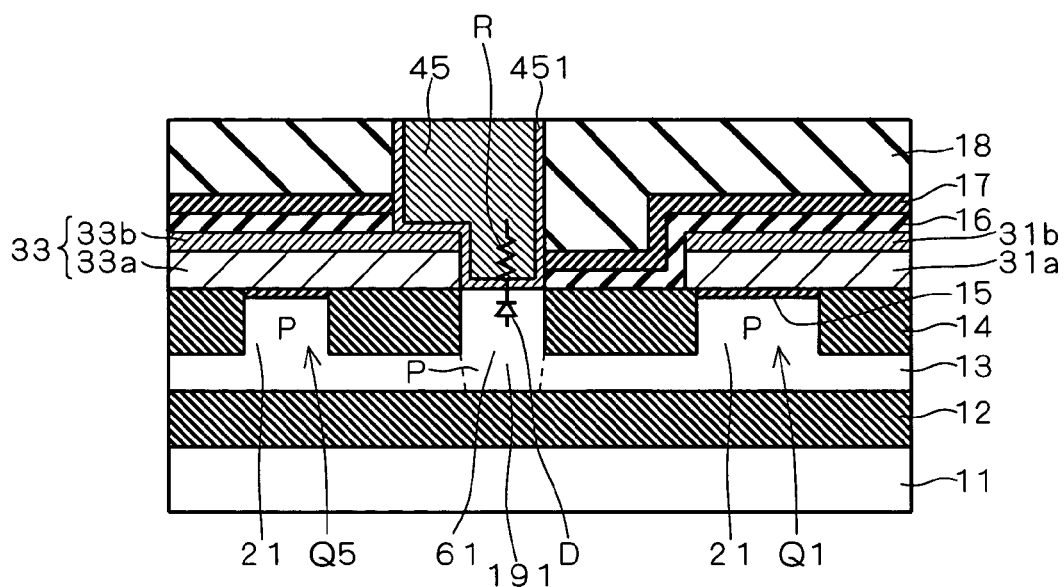
FIG. 69 illustrates a modification of the SRAM cell according to the fourteenth preferred embodiment.

Unlike the structure of the second preferred embodiment shown in FIG. 18, the structure of FIG. 69 has no cobalt silicide layer 57 on the upper surface of the fifth active region 61. This is because the same resistor R and the same diode D as formed in the SRAM cell of FIG. 68 should be obtained. As long as the resistance R1 of the resistor R and the resistance R2 of the reverse-biased diode D are desirably controlled, however, the cobalt silicide layer 57 may be naturally formed on the upper surface of the fifth active region 61 in FIG. 18. In order to avoid formation of the cobalt silicide layer 57 on the upper surface of the fifth active region 61 as shown in FIG. 69, in the step of forming the silicide layers 57 and 31*b* (FIGS. 23A and 23B) as one of the manufacturing process steps of the SRAM in the second preferred embodiment, the upper surface of the fifth active region 61 may be covered with a certain insulating film (which is so called a "silicide protection film") to avoid deposition of cobalt on the upper surface of the fifth active region 61.

In the fourteenth preferred embodiment, like the structures of FIGS. 61 and 63 discussed above, the P-type region 191 and the barrier metal 451 may also be reacted to form the silicide layer 192 on the P-type region 191. In this case, the impurity concentration of the P-type region 191 is so controlled that a Schottky junction is provided between the silicide layer 192 and the P-type region 191. That is, the diode D is formed by the silicide layer 192 and the P-type region 191.

Fifteenth Preferred Embodiment

Figure 70:
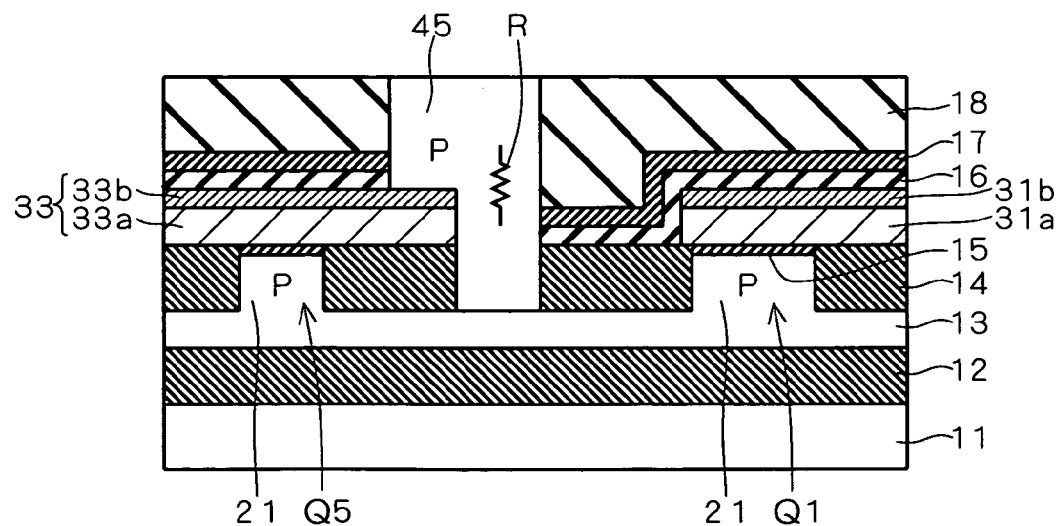
FIG. 70 illustrates the structure of an SRAM cell according to a fifteenth preferred embodiment of the present invention.

FIG. 70 shows the structure of an SRAM cell according to a fifteenth preferred embodiment of the present invention. The SRAM of the fifteenth preferred embodiment has the same top view as that of FIG. 2 discussed in the first preferred embodiment. FIG. 70 is a sectional view taken along the line A-A of FIG. 2. In FIG. 70, the same constituent elements as those shown in FIGS. 2 and 3 are denoted by the same reference numerals.

In the first through fourteenth preferred embodiments discussed above, the contact 45 connected to the word line and the other contacts are all formed by metal such as tungsten. In the fifteenth preferred embodiment, P-type polysilicon is used to form the contact 45.

The polysilicon contact 45 has a higher resistance than the contact formed by metal such as tungsten and hence, the polysilicon contact 45 also serves to function as the resistor R as shown in FIG. 70. That is, the resistor R is interposed between the word line and the body regions of the first and second driver transistor Q1 and Q2. Thus, like the SRAM of the twelfth preferred embodiment, the SRAM of the fifteenth preferred embodiment has the same equivalent circuit as that of FIG. 56.

The polysilicon forming the contact 45 is subjected to implantation of ions such as boron with a dose of about $10^{16}$ to $10_{22}/cm^3$. The dose of ions to be implanted is controlled such that the contact 45, namely the resistor R, is allowed to have a suitable resistance. According to the same theory as applied to the twelfth preferred embodiment, the rise time of the body potential is speeded up to allow reduction in leakage current.

According to the structure of FIG. 70, the contact 45 formed by P-type polysilicon is provided in the SRAM cell with the same structure as that of the first preferred embodiment. However, the applicability of the fifteenth preferred embodiment is not limited to the structure of FIG. 70. By way of example, the fifteenth preferred embodiment may be applied to the second preferred embodiment. That is, the SRAM cell shown in FIG. 18 may be provided with the P-type polysilicon contact 45 connected to the word line, in which case the same effects are produced.

Sixteenth Preferred Embodiment

Figure 71:
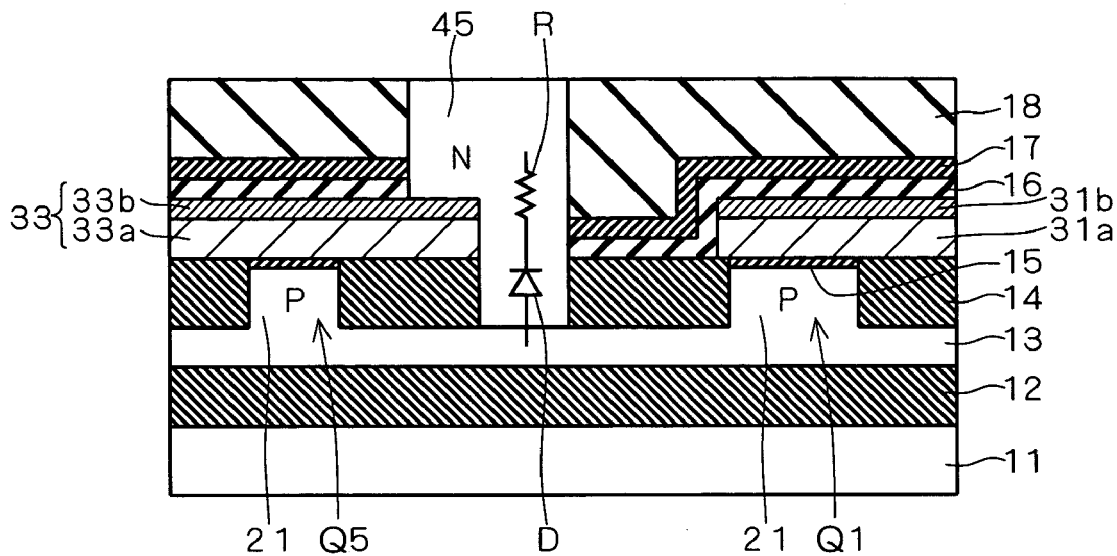
FIG. 71 illustrates the structure of an SRAM cell according to a sixteenth preferred embodiment of the present invention.

FIG. 71 illustrates the structure of an SRAM cell according to a sixteenth preferred embodiment of the present invention. Contrary to the SRAM cell of the fifteenth preferred embodiment in which the contact 45 is formed by P-type polysilicon, the SRAM cell of the sixteenth preferred embodiment is provided with the contact 45 formed by N-type polysilicon.

The polysilicon contact 45 has a higher resistance than the contact formed by metal such as tungsten and hence, like in the fifteenth preferred embodiment, the polysilicon contact 45 also serves to function as the resistor R. In the sixteenth preferred embodiment, the connection between the N-type polysilicon contact 45 and the P-type SOI layer 13 forms a P-N junction therebetween to form a P-N junction diode D. That is, the resistor R and the diode D are interposed between the word line and the body regions of the first and second driver transistors Q1 and Q2. The diode D has a cathode connected to the side of the word line, and an anode connected to the side of the body regions. Thus, like the SRAM of the fourteenth preferred embodiment, the SRAM of the fifteenth preferred embodiment has the same equivalent circuit as that of FIG. 67.

The polysilicon forming the contact 45 is subjected to implantation of ions such as phosphorous with a dose of about $10^{16}$ to $10^{22}/cm^3$. The dose of implantation is controlled such that the contact 45, namely the resistor R, is allowed to have a suitable resistance. The diode D having a cathode connected to the side of the word line is provided between the word line and the body regions of the driver transistors Q1, Q2 and the access transistors Q5, Q6, whereby according to the same theory as applied to the fourteenth preferred embodiment, both the reduction of the leakage current and improvement in soft error tolerance are effectively realized.

According to the structure of FIG. 71, the contact 45 formed by N-type polysilicon is provided in the SRAM cell with the same structure as that of the first preferred embodiment. However, the applicability of the sixteenth preferred embodiment is not limited to the structure of FIG. 71. By way of example, the sixteenth preferred embodiment may be applied to the second preferred embodiment. That is, the SRAM cell shown in FIG. 18 may be provided with the N-type polysilicon contact 45 connected to the word line, in which case the same effects are produced.

Seventeenth Preferred Embodiment

In the foregoing preferred embodiments discussed above (except the tenth and eleventh preferred embodiments), the word line is connected both to the body regions of the driver transistors and to the body regions of the access transistors of the SRAM. Alternatively, the word line may be connected either to the body regions of the driver transistors or to the body regions of the access transistors, in which case the operation stability and operating speed improvement of the SRAM cell are also realized.

FIGS. 72 through 75 illustrate the structure of an SRAM cell according to a seventeenth preferred embodiment of the present invention. In FIGS. 72 through 75, the same constituent elements as those shown in FIGS. 2 and 3 are denoted by the same reference numerals.

Figure 72:
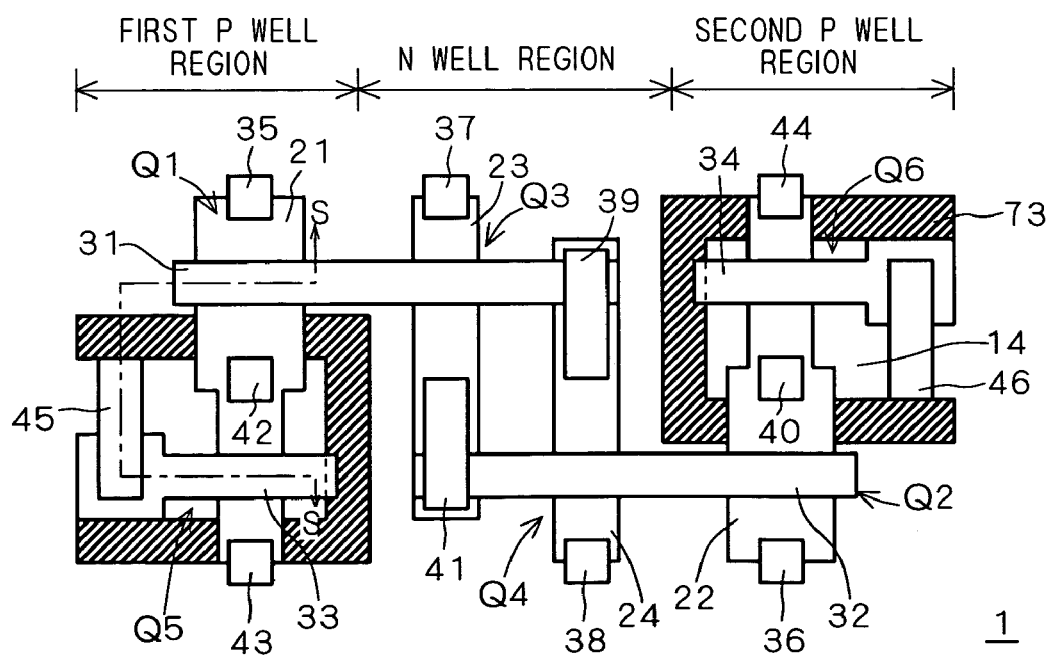
Figure 73:
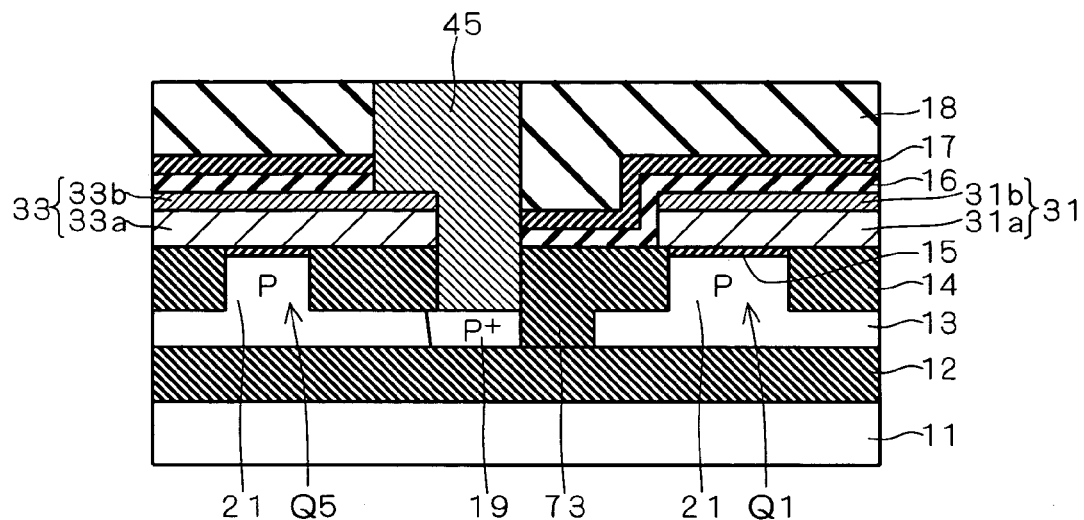

FIG. 73 is a sectional view taken along the line S-S in FIG. 72. As seen from FIGS. 72 and 73, complete isolation regions 73 are arranged between the first driver transistor Q1 and the first access transistor Q5, and between the second driver transistor Q2 and the second access transistor Q6. Of the first driver transistor Q1 and the first access transistor Q5, the contact 45 is connected only to the body region of the first access transistor Q5. Although not shown, of the second driver transistor Q2 and the second access transistor Q6, the contact 46 is connected only to the body region of the second access transistor Q6. This structure also allows improvement in current driving capability of the access transistors Q5 and Q6, thereby realizing the improved operation stability and improved operating speed relative to the conventional SRAM.

Figure 74:
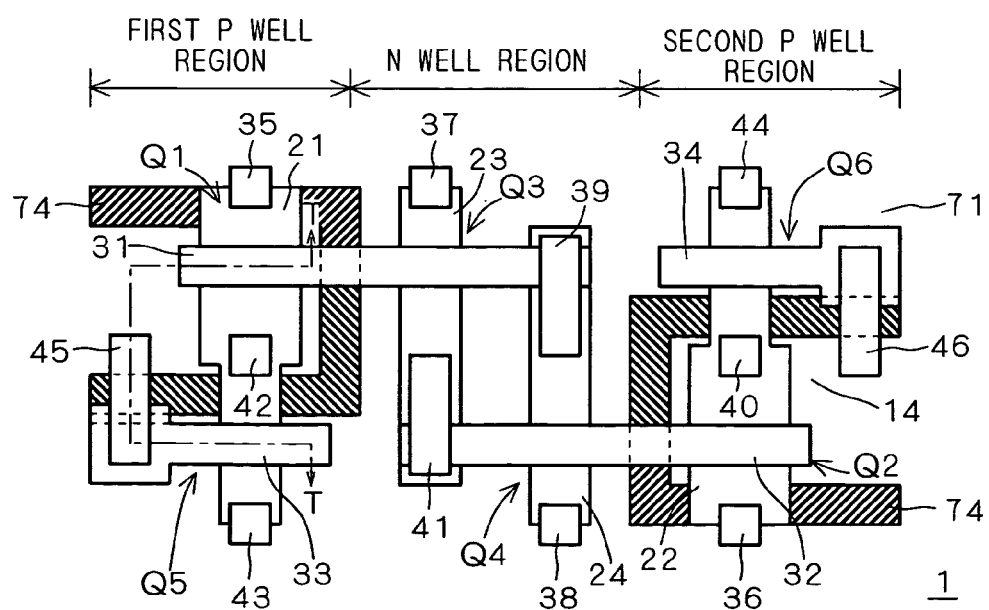

FIG. 75 is a sectional view taken along the line T-T in FIG. 74. As seen from FIGS. 74 and 75, complete isolation regions 74 are arranged between the first driver transistor Q1 and the first access transistor Q5, and between the second driver transistor Q2 and the second access transistor Q6. Of the first driver transistor Q1 and the first access transistor Q5, the contact 45 is connected only to the body region of the first driver transistor Q1. Although not shown, of the second driver transistor Q2 and the second access transistor Q6, the contact 46 is connected only to the body region of the second access transistor Q6. This structure also allows improvement in current driving capability of the driver transistors Q1 and Q2, thereby realizing the improved operation stability and improved operating speed relative to the conventional SRAM.

In the present invention, even when the word line is connected either to the body regions of the driver transistors or to the body regions of the access transistors of the SRAM, the operation stability and operating speed improvement of the SRAM cell are realized. On the other hand, the effects of the present invention are more effectively produced with the structure in which the word line is connected both to the body regions of the driver transistors and to the body regions of the access transistors of the SRAM.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device comprising an SRAM (static random access memory) cell, said SRAM cell including:

an access MOS (metal oxide semiconductor) transistor;
a driver MOS transistor; and
a contact connecting a word line and a gate electrode of said access MOS transistor with each other, wherein
said contact is connected both to a body region of said access MOS transistor and to a body region of said driver MOS transistor.

2. The semiconductor memory device according to claim 1 further comprising a resistor, wherein
said resistor is interposed between the body region connected to said word line through said contact and said word line, the body region being at least either of said access MOS transistor or of said driver MOS transistor.

3. The semiconductor memory device according to claim 1,
wherein said contact has a surface provided with barrier metal.

4. The semiconductor memory device according to claim 1, wherein said contact includes polysilicon.

5. The semiconductor memory device according to claim 1, wherein
a resistance between the body region connected to said word line through said contact and said word line ranges between 1 kΩ and 100 MΩ, the body region being at least either of said access MOS transistor or of said driver MOS transistor.

6. The semiconductor memory device according to claim 1 comprising a diode having a cathode connected to the side of said word line, wherein
said diode is interposed between the body region connected to said word line through said contact and said word line, the body region being at least either of said access MOS transistor or of said driver MOS transistor.

7. The semiconductor memory device according to claim 6, wherein
said contact has a surface provided with barrier metal.

8. The semiconductor memory device according to claim 6, wherein
said contact includes polysilicon.

9. The semiconductor memory device according to claim 6, wherein
when said diode is reverse biased, a resistance between the body region connected to said word line through said contact and said word line ranges between 1 kΩ and 100 MΩ, the body region being at least either of said access MOS transistor or of said driver MOS transistor.

10. The semiconductor memory device according to claim 1, wherein
said access MOS transistor and said driver MOS transistor are formed in a first active region defined in a first well region of a first conductivity type formed in a semiconductor layer, said access MOS transistor and said driver MOS transistor each including said body region of said first conductivity type and source/drain regions of a second conductivity type,
said first active region is defined by an element isolation insulating film selectively formed in the upper surface part of said first well region, and
the body region is joined to said first well region under said element isolation insulating film to be connected to said contact, the body region being at least either of said access MOS transistor or of said driver MOS transistor.

11. The semiconductor memory device according to claim 10, wherein
said contact passes through said element isolation insulating film to be connected to said first well region located under said element isolation insulating film.

12. The semiconductor memory device according to claim 11, wherein
a portion of said first well region connected to said contact is formed with a region having an impurity concentration different from that of the remaining portion of said first well region.

13. The semiconductor memory device according to claim 11, wherein
said first well region and said contact forms a Schottky junction.

14. The semiconductor memory device according to claim 11, wherein
said contact has a surface provided with barrier metal, and
a portion of said first well region connected to said contact and said barrier metal are reacted to form a silicide layer.

15. The semiconductor memory device according to claim 11, wherein
said first well region under said element isolation insulating film is of P-type, and
said contact includes N-type polysilicon.

16. The semiconductor memory device according to claim 10, wherein.
said SRAM cell further includes a second active region of said first conductivity type defined by said element isolation insulating film in said first well region,
said second active region is joined to said first well region located under said element isolation insulating film, and
said contact is connected to said second active region.

17. The semiconductor memory device according to claim 16, wherein
said second active region has an impurity concentration different from that of said first well region.

18. The semiconductor memory device according to claim 16, wherein
said second active region and said contact forms a Schottky junction.

19. The semiconductor memory device according to claim 16, wherein
said contact has a surface provided with barrier metal, and
a portion of said second active region connected to said contact and said barrier metal are reacted to form a silicide layer.

20. The semiconductor memory device according to claim 16, wherein
said second well region is of P-type, and
said contact includes N-type polysilicon.

21. The semiconductor memory device according to claim 10, wherein
said semiconductor layer is formed on an insulating layer,
said SRAM cell further includes a load MOS transistor formed in a second well region of said second conductivity type formed in said semiconductor layer, and
said element isolation insulating film between said access MOS transistor and said driver MOS transistor and said load MOS transistor reaches said insulating layer.

22. The semiconductor memory device according to claim 10, comprising a plurality of said SRAM cells connected to the same bit line and arranged along the extensional direction of said bit line, wherein
said semiconductor layer is formed on an insulating layer, and said element isolation insulating film located between said plurality of SRAM cells reaches said insulating layer in said first well region.

23. The semiconductor memory device according to claim 10, having no well potential fixing cell independent of said SRAM cell for fixing said first well region of said SRAM cell to a prescribed potential.

24. The semiconductor memory device according to claim 1, wherein said SRAM cell further includes a load MOS transistor, at least upper surface parts of a drain region of said driver MOS transistor and a drain region of said load MOS transistor are connected with each other and an integral silicide layer is formed on said upper surface parts of said drain region of said driver MOS transistor and said drain region of said load MOS transistor.

* * * * *